United States Patent [19]

Uda et al.

[11] Patent Number: 5,360,988
[45] Date of Patent: Nov. 1, 1994

[54] SEMICONDUCTOR INTEGRATED CIRCUIT DEVICE AND METHODS FOR PRODUCTION THEREOF

[75] Inventors: Takayuki Uda; Toshiro Hiramoto; Nobuo Tamba, all of Ohme; Hisashi Ishida, Higashiyamato; Kazuhiro Akimoto, Akishima; Masanori Odaka, Kodaira; Tasuku Tanaka, Hamura; Jun Hirokawa, Ohme; Masayuki Ohayashi, Hamura, all of Japan

[73] Assignee: Hitachi, Ltd., Tokyo, Japan

[21] Appl. No.: 903,202

[22] Filed: Jun. 23, 1992

[30] Foreign Application Priority Data

Jun. 27, 1991 [JP] Japan .................. 3-157019
Apr. 21, 1992 [JP] Japan .................. 4-100809
May 1, 1992 [JP] Japan .................. 4-139821

[51] Int. Cl.⁵ .............. H01L 23/48; H01L 21/285; F42C 19/12; G06F 15/60
[52] U.S. Cl. ................... 257/529; 257/664; 257/665; 257/666
[58] Field of Search ............ 257/664, 665, 666, 529, 257/530, 537

[56] References Cited

U.S. PATENT DOCUMENTS

| | | | |
|---|---|---|---|
| 4,346,459 | 8/1982 | Sud et al. | 257/737 |
| 4,703,436 | 10/1987 | Varshney | 257/665 |
| 4,869,170 | 9/1989 | Dahmberg et al. | 257/737 |
| 5,017,510 | 5/1991 | Welch et al. | 437/192 |
| 5,026,664 | 6/1991 | Hongo et al. | 437/189 |
| 5,027,188 | 6/1991 | Owada et al. | 257/737 |
| 5,143,865 | 9/1992 | Hideshima et al. | 437/183 |

FOREIGN PATENT DOCUMENTS 62-119938  6/1987  Japan .................. 257/737

OTHER PUBLICATIONS

*1989 IEEE*, International Solid-State Circuits Conference, *ISSCC* Digest of Technical papers (1989; pp. 34-35, 248).

Primary Examiner—William L. Sikes
Assistant Examiner—Fetsum Abraham
Attorney, Agent, or Firm—Pennie & Edmonds

[57] ABSTRACT

Disclosed are a semiconductor integrated circuit device and methods for production thereof. An embodiment of the invention is a semiconductor chip that comprises fuses constituting part of redundancy circuits formed therein, the fuses being made of the same ingredients as those of a CCB bump substrate metal. The fuses are patterned simultaneously during the patterning of the CCB bump substrate metal. This involves forming the fuses using at least part of the ingredients of an electrode conductor pattern in the chip. The cutting regions of the fuses are made of only one of the metal layers constituting the substrate. The principal plane of the semiconductor chip has a fuse protective film formed over at least the cutting regions of the fuses for protection of the latter. In operation, a switch MOSFET under switching control of a redundancy signal is used to select one of two transmission paths, one carrying an address signal or a decode signal, the other carrying a reference voltage. This allows a faulty circuit to be replaced with the corresponding redundancy circuit.

14 Claims, 41 Drawing Sheets

STATE OF FUSE
CONNECTING: YES
CUTTING: NO

STATE OF FUSE
CONNECTING: YES
CUTTING: NO

STATE OF FUSE
CONNECTING: NO
CUTTING: YES

STATE OF FUSE
CONNECTING: NO
CUTTING: YES

X-REDUNDANCY CIRCUIT

SEMICONDUCTOR INTEGRATED CIRCUIT DEVICE AND METHODS FOR PRODUCTION THEREOF

BACKGROUND OF THE INVENTION

The present invention relates to a semiconductor integrated circuit device and methods for production thereof. More particularly, the invention relates to a semiconductor integrated circuit device having a redundancy circuit arrangement such as a static RAM (random access memory) incorporating redundancy technology, the RAM combining a bipolar transistor with a CMIS (complementary metal-insulator-semiconductor) circuit arrangement.

Recent years have seen significant improvements in the circuit performance and storage capacity of semiconductor circuit devices. These improvements, however, are accompanied by growing difficulties in keeping the yield of semiconductor chips higher than feasible levels. The increases in circuit performance and storage capacity necessitate making semiconductor circuit elements and wires smaller than ever before, whereas the semiconductor chips continue to grow in size. Such developments have resulted in unacceptably high rates of defect incidence in the semiconductor chips through their exposure to intruding impurities.

Redundancy technology (fault remedy technology) constitutes a means for minimizing the defect-induced drop in the yield of semiconductor chips. Implementing the redundancy technology in the semiconductor chip entails incorporating redundant backup elements therein. If the semiconductor chip develops a faulty part, the backup element corresponding to that part takes over, thereby keeping the integrity of the chip intact.

The switching between faulty parts and their backup elements in the semiconductor chip is accomplished by the melting of fuses constituting part of the redundancy circuit therein. The fuses are melted, illustratively, by use of laser means or electrical means.

The fuses are illustratively made of polysilicon. For the ease of production, these fuses are patterned in, for example, a MOSFET (metal-oxide-semiconductor field-effect transistor) at the same time as the gate electrodes thereof are formed into a pattern. In such cases, the fuses are formed in the lowest of the layers making up the semiconductor chip.

A fuse is melted by laser means illustratively as follows: The upper insulation film, a predetermined wiring region or other suitable portion of the target fuse is first removed therefrom for partial exposure. Then a laser beam is irradiated at the exposed area of the fuse for melting.

SUMMARY OF THE INVENTION

The fuse arrangement constituting part of the redundancy circuit is disclosed illustratively in Japanese Patent Laid-Open No. 62-119938. In this case, the fuses are composed of a high melting-point metal such as molybdenum (Mo), tungsten (W) or chromium (Cr).

In melting the fuse, the above-disclosed technology involves first making an opening to the upper insulation film covering the fuse for partial exposure thereof. Then with the atmosphere around the fuse oxidized, a laser beam is irradiated at the fuse where it is exposed through the opening. The laser beam sublimates the fuse material, thus cutting the fuse.

Oxidizing the fuse before melting lowers its melting point. This allows the fuse to be melted at a relatively lower beam energy level. The reduced laser beam irradiation minimizes collateral damage to elements or wires around the target fuse.

Under the inventors' scrutiny, the above-described prior art redundancy technology has been found to have the following major disadvantages:

(1) The above mentioned technology requires partially removing the upper insulation film or other region of the fuse before melting. This adds to and complicates the fuse melting process.

Where the fuse arrangement is located in a relatively low layer of the semiconductor chip, this problem gets more complicated the larger the number of wiring layers incorporated. With the upper insulation film of the fuse getting thicker and with more wiring layers provided, it becomes increasingly difficult to cut through these layers to reach the fuse.

Because the above-mentioned technology involves making an opening to the film covering the fuse, impurities and ions tend to infiltrate through that opening into the semiconductor device. The intrusion can deteriorate the reliability of the device.

If the fuse arrangement is formed in the lowest layer of the semiconductor chip, no wiring can be provided immediately above the fuses. This is a significant constraint on the wiring layout.

(2) Another type of redunancy technology is disclosed illustrative in U.S. Pat. No. 4,346,459 and in the ISSCC Digest of Technical Papers (1989; pp. 34-35, 248). This second redundancy technology involves furnishing a semiconductor chip with a redundancy circuit that replaces faulty bits with redundant backup bits, whereby the yield of semiconductor integrated circuit devices such as large integration memory chips is enhanced.

The second technology proposes a first and a second redundancy circuit. The finest redundancy circuit works as follows: An address decode signal for selecting a particular bit in a memory cell array is compared with a redundancy signal. If the comparison shows the redundancy signal to be High, the address decode signal is forwarded to the next stage so that the memory cell connected thereto will be selected. If the redundancy signal turns out to be Low, the corresponding memory cell is not selected so that another bit will be selected. The second redundancy circuit involves selecting one of the sense amplifiers connected to the data lines of the memory cell array, the selected sense amplifier amplifying the signal of the corresponding data line for output to the outside. For example, when the redundancy signal is brought High, the output of a given sense amplifier is connected to the outside; when the redundancy signal is brought Low, the sense amplifier output is disconnected from the outside. The connecting/disconnecting actions on the sense amplifiers remedy faulty bits.

With the first redundancy circuit, a faulty bit is replaced with a redundancy bit when the corresponding signal lines for both X and Y selection are compared with the redundancy signal. One disadvantage of this circuit is that because of the need to insert a comparator in one of the stages making up the decoder circuit incorporated, the decoder delay time is prolonged. The prolonged decoder delay time means a longer address access time than is available without the use of a redundancy circuit. The second redundancy circuit, on the other hand, provides direct-current switchover to a redundancy bit, e.g., selecting the current source of a given sense amplifier by means of the redundancy signal. Although this setup eliminates delays in reading information from the memory cell array, a large number of output bits need to be addressed by numerous sense amplifiers. For example, a word bit construction off 1 kilowords × 32 bits requires 32 sense amplifiers. Each of these sense amplifiers must be selected as needed by a complicated redundancy logic circuit.

It is therefore an object of the present invention to overcome the above-described drawbacks and disadvantages and to provide a technology that facilitates the melting of fuses constituting part of a redundancy circuit arrangement in semiconductor integrated circuit devices.

It is another object of the invention to provide a technology that prevents any degradation in the reliability of semiconductor integrated circuit devices, the degradation being otherwise caused by the melting of fuses constituting part of a redundancy circuit arrangement in the devices.

It is a further object of the invention to provide a technology that eases the constraints on the wiring layout of semiconductor integrated circuit devices.

It is an even further object of the invention to provide a semiconductor memory device wherein a faulty part is remedied using a simple circuit arrangement while the high-speed performance of the device is maintained.

These and other objects, features and advantages of the invention will become more apparent upon a reading of the following description and appended drawings.

The major aspects of the invention disclosed herein are summarized below.

(a) According to one aspect of the invention, there is provided a semiconductor integrated circuit device structure wherein a transition metal is used to form a fuse arrangement that makes up part of the redundancy circuit incorporated in the semiconductor chip, the fuse arrangement being furnished on the surface protective film of the chip.

(b) According to another aspect of the invention, there is provided a semiconductor integrated circuit device structure wherein the principal plane of the semiconductor chip comprises a fuse protective film at least over a fuse cutting region of the fuse arrangement.

(c) According to a further aspect of the invention, there is provided a method for producing a semiconductor integrated circuit device having a redundancy circuit in the semiconductor chip, the method comprising the step of patterning the fuse arrangement constituting part of the redundancy circuit, the patterning step being carried out at the same time as an electrode conductor pattern is formed on the insulation film over the top layer of the semiconductor chip.

(d) According to an even further aspect of the invention, there is provided a method for producing a semiconductor integrated circuit device, the method comprising the step of irradiating an energy beam at least at a fuse cutting region in a predetermined reactive gas atmosphere for selective CVD (chemical vapor deposition), whereby a fuse protective film is formed over the fuse arrangement in the device.

(e) According to another aspect of the invention, there is provided a method for producing a semiconductor integrated circuit device wherein the principal plane of the semiconductor chip comprises a fuse protective film at least over a fuse cutting region, the method comprising the step of cutting a target fuse by use of a laser beam or a focused ion beam, the cutting of the fuse being followed by irradiation of an energy beam at an exposed region of the fuse for selective CVD, whereby a fuse protective film is formed over the fuse.

(f) According to a further aspect of the invention, there is provided a method for producing a semiconductor integrated circuit device wherein a CCB (controlled collapse bonding) or TAB (tape automated bonding) bump substrate metal is patterned on a surface protective film of a semiconductor substrate containing the semiconductor chip, the method comprising: the step of patterning on the surface protective film the fuse arrangement constituting part of the redundancy circuit of the semiconductor chip by use of part of the ingredients of the CCB or TAB bump substrate metal, the patterning of the fuse arrangement being performed at the same time as the patterning of the CCB or TAB bump substrate metal; the step of depositing a fuse protective film onto the semiconductor substrate containing the fuse arrangement; the step of forming on the fuse protective film a photo resist pattern designed to expose only the CCB or TAB bump substrate metal; the step of removing the fuse protective film only from the CCB or TAB bump substrate metal using the photo resist pattern as an etching mask; and the step of depositing a bump forming metal for forming a CCB or TAB bump over the semiconductor substrate using the photo resist pattern as a deposition mask.

(g) According to an even further aspect of the invention, there is provided a semiconductor integrated circuit structure wherein a switch MOSFET under control of a redundancy signal switches to the transmission path of address signals or the decoded signals thereof or to the transmission path of a reference voltage in such a manner that a faulty circuit will be replaced by the corresponding redundancy backup circuit.

The aspect (a) of the invention leaves the fuse arrangement of the semiconductor chip exposed from the beginning. This allows the target fuse to be cut without having to remove beforehand the insulation film or the wiring covering it. Because the cutting of fuses does not require making an opening to the insulation film covering the semiconductor chip, the conventionally experienced problem of impurity or ion infiltration through the opening is avoided. In addition, with the fuse arrangement furnished on the surface protective film, the wires in the wiring layers under the protective film are not as severely constrained as the prior art was in the design of a wiring layout.

The aspect (b) of the invention prevents corrosion, oxidation or peeling of the fuse arrangement traditionally caused by the presence of ions, moisture or other impurities. This minimizes the fluctuation of the fuse resistance values attributable to such irregularities. With the fuse resistance fluctuation thus inhibited, the malfunction of the redundancy circuit otherwise attributed thereto is effectively prevented.

The aspect (c) of the invention allows the fuse arrangement to be patterned at the same time as the electrode conductor pattern is formed. This eliminates the need for a new photo mask through which to pattern the fuse arrangement. No additional production stage is required for fuse formation. Therefore, this aspect of the invention furnishes the fuse arrangement without recourse to a new photo mask or to an additional production stage.

The aspect (d) of the invention permits formation of the fuse protective film without an additional photo mask or without any significant increase in the number of production steps.

The aspect (e) of the invention exposes a fuse portion by cutting, and then covers again the exposed fuse portion with the fuse protective film. This prevents the intrusion of ions, moisture or other impurities through the exposed fuse portion into the semiconductor chip.

The aspect (f) of the invention utilizes, as the deposition mask for bump formation, the photo resist pattern used as the etching mask through which the fuse protective portion is removed by etching off the substrate metal. This permits formation of the fuse protective film without an addition photo mask and without any significant increase in the number of production steps.

The aspect (g) of the invention keeps constant the number of logic steps constituting the signal transmission path regardless of defect remedying measures through redundancy. This ensures the maintenance of high-speed circuit performance by a simple circuit constitution.

BRIEF DESCRIPTION OF THE DRAWINGS

The preferred embodiments of the invention will be described hereunder in conjunction with a semiconductor integrated circuit device structure comprising a logic SRAM. In the figures, like reference characters designate like or corresponding parts, and any repetitive description thereof is omitted.

DETAILED DESCRIPTION OF THE PREFERRED EMBODIMENTS

First Embodiment

The first embodiment of the invention will be described primarily with reference to FIGS. 1 through 15.

Figure 1:
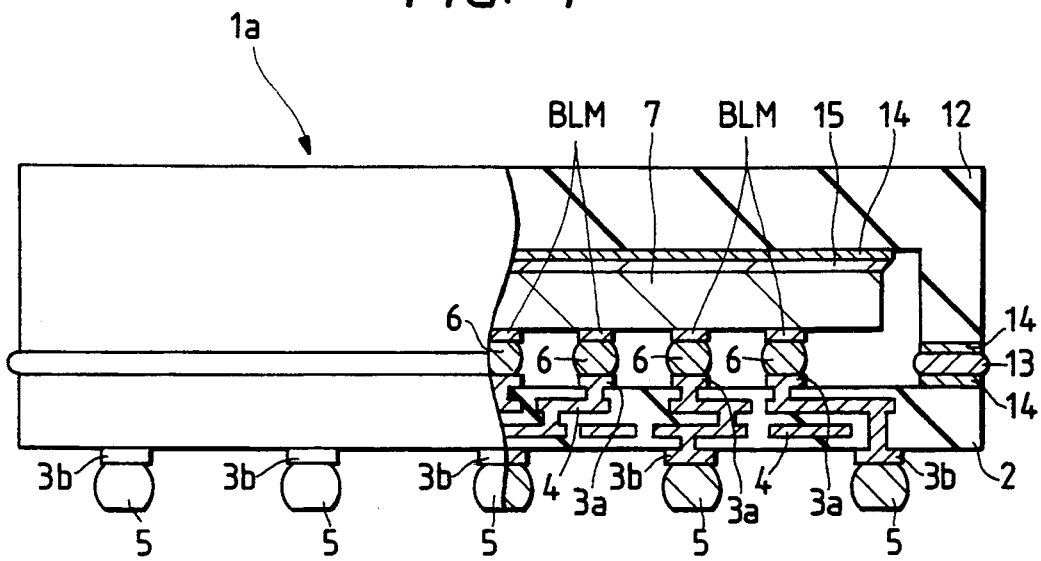
FIG. 1 is a partial sectional view of a semiconductor integrated circuit device having a fuse arrangement and practiced as a first embodiment of the invention.
Figure 2:
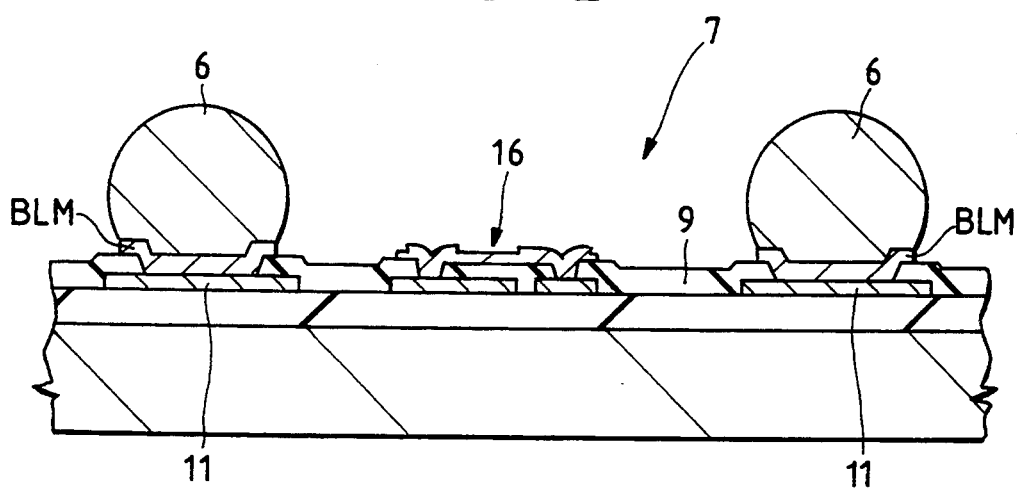
FIG. 2 is a sectional view of a fuse arrangement constituting part of a redundancy circuit in the first embodiment of FIG. 1.

The semiconductor integrated circuit device of FIG. 1 practiced as the first embodiment is illustratively a chip carrier 1a. A package substrate 2 composing part of the chip carrier 1a is made illustratively of a ceramic material such as mullite. At the top and the bottom of the package substrate 2 are electrodes 3a and 3b. The electrodes 3a and 3b are interconnected electrically through internal wiring 4 which is formed illustratively from tungsten within the package substrate 2.

The electrodes 3b at the bottom of the package substrate 2 are bonded to CCB (controlled collapse bonding) bumps 5. The CCB bumps 5 are made illustratively of an Sn/Ag alloy (melting point: 250°–260° C.) containing about 3.5 percent of silver (Ag) by weight.

At the top of the package substrate 2, the electrodes 3a are bonded to CCB bumps 6 that are smaller in size than the CCB bumps 5. The CCB bumps 6 are composed illustratively of a Pb/Sn alloy (melting point: 320°–330° C.) containing about 1 to 5 percent of tin (Sn) by weight.

The CCB bumps 6 are bonded to a substrate metal BLM (ball limiting metalization) formed on the principal plane side of a semiconductor chip 7. That is, the semiconductor chip 7 is mounted on the electrodes 3a of the package substrate 2 with the CCB bumps 6 inserted in between.

Figure 3:
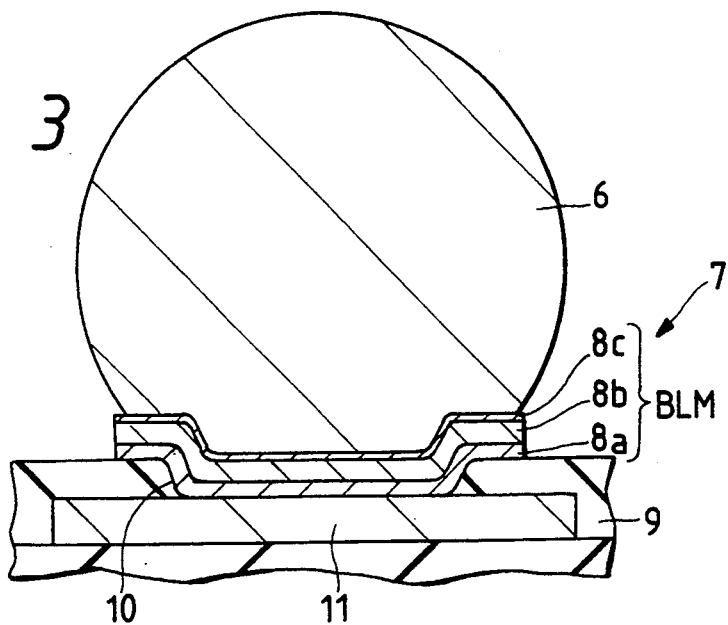
FIG. 3 is an enlarged sectional view of a CCB bump and a substrate metal in connection with the first embodiment.

The substrate metal BLM is formed illustratively from three metal layers 8a, 8b and 8c, deposited in that order from the bottom up, as shown in FIG. 3. Illustratively, the bottom metal layer 8a is made of chromium (Cr) and between 0.05 and 0.2 μm thick; the middle layer 8b, of copper (Cu) and between 0.5 and 2.0 μm thick; the top layer 8c, of gold (Au) and between 0.1 and 0.2 μm thick.

The substrate metal BLM thus constructed with the metal layers 8a through 8c is connected electrically to outgoing electrodes 11 via through holes 10 pierced in a surface protective film 9. The surface protective film 9 is the last of the insulation films formed on the semiconductor chip 7. The surface protective film 9 is illustratively a deposited film made of silicon dioxide (SiO$_2$) or of silicon nitride (Si$_3$N$_4$) and silicon dioxide (SiO$_2$). The outgoing electrodes 11 are typically made of aluminum (Al) or an aluminum alloy. The electrodes 11 are connected electrically to semiconductor integrated circuits which are formed on the principal plane of the semiconductor chip 7 (FIG. 1) and which will be described later.

The semiconductor chip 7 is covered in an airtight fashion with a cap 12. The cap 12 is made illustratively of aluminum nitride (AlN) and bonded to the top of the package substrate 2 by use of a sealing solder 13. The sealing solder 13 is typically a Pb/Sn alloy (melting point: 290° to 300° C.) containing about 10 percent of tin (Sn) by weight.

Where the cap 12 is bonded to the package substrate 2, the bonding surfaces of the substrate 2 and the cap 12 are covered with a bonding metal layer 14. The layer 14 is made illustratively of an Au/Ni/Ti alloy intended to enhance the wettability of the sealing solder 13.

The back of the semiconductor chip 7 is bonded to the bottom of the cap 12 by means of a heat conducting solder 15. The heat conducting solder 15 is illustratively composed of the same Pb/Sn alloy making up the sealing solder 13. The bonding metal layer 14 is also formed over the bottom of the cap 12 in order to improve the wettability of the heat conducting solder 15.

Figure 4:
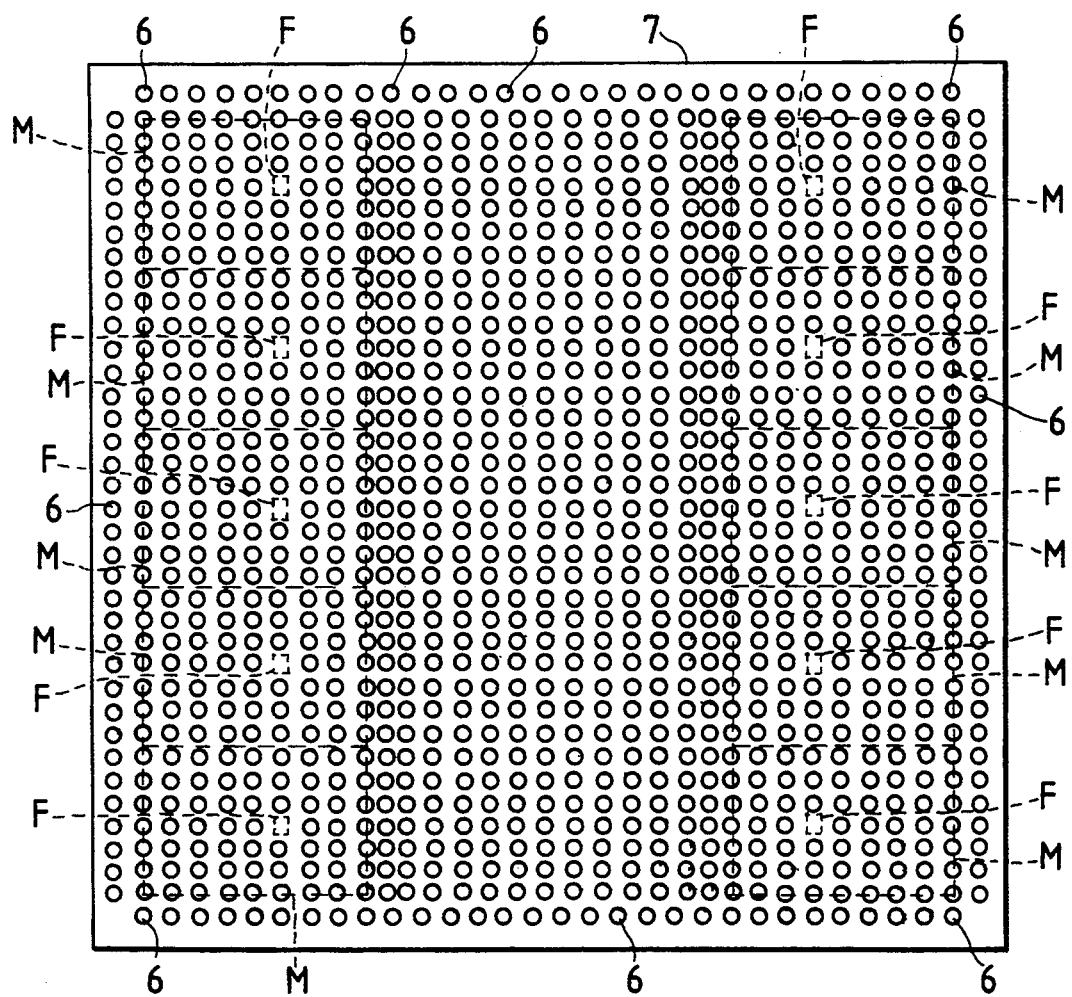
FIG. 4 is an overall enlarged plan view of a semiconductor chip having the fuse arrangement of FIG 2.

FIG. 4 is an overall plan view of the principal plane side of the semiconductor chip 7 in the first embodiment. Semiconductor integrated circuits such as logic SRAM (static random access memory) circuits are formed on the principal plane of the semiconductor chip 7. The semiconductor integrated circuits are illustratively made of BiCMOS's (bipolar-complementary metal oxide semiconductors).

At the center of the principal plane of the semiconductor chip 7 is a logic circuit block, not shown, which illustratively constitutes the logic SRAM. On both sides of the principal plane of the semiconductor chip 7 are illustratively a plurality of memory circuit blocks M of an identical one-bit construction. Each memory circuit block M comprises memory cells made of a predetermined number of MOSFET's as well as memory peripheral circuits.

Each memory circuit block M typically includes backup memory cells. The backup memory cells are redundant cells that are used to replace faulty cells, (not shown) if the latter should occur. Thus the semiconductor chip 7 of the first embodiment comprises redundancy circuits.

A fuse arrangement that acts to replace a defective cell with the corresponding backup cell is illustratively formed in a region F within each memory circuit block M. The fuse arrangement will be described later in detail. The regions F are located between CCB bumps 6 and in areas where memory peripheral circuits are provided. The CCB bumps 6 may or may not be formed inside the memory cell area.

Figure 5:
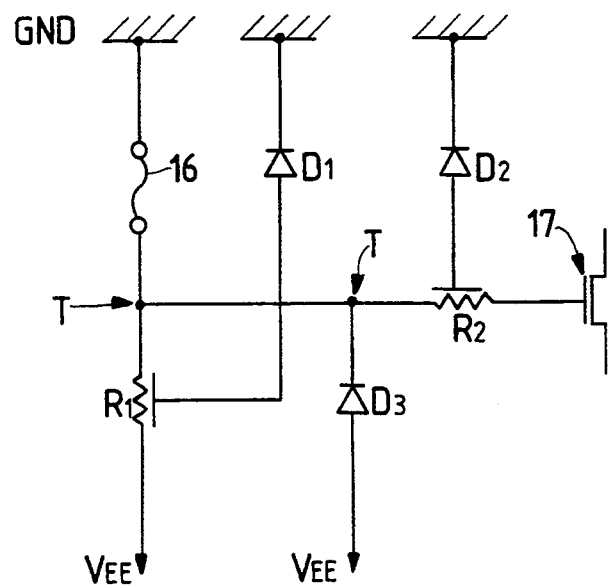
FIG. 5 is a circuit diagram showing how the fuse arrangement of FIG. 2 is connected.

FIG. 5 depicts how the fuse arrangement is connected in the first embodiment. A fuse 16 and a resistor $R_1$ are connected in series between a ground line GND and a power line $V_{EE}$. The ground line GND is supplied illustratively with a voltage of about 0 V ($V_{cc}$), and the power line $V_{EE}$ with a negative voltage of about $-4$ V. The resistor $R_1$ has a resistance value of about 200 KΩ. The resistance value of the fuse 16 is typically 10 Ω, variable depending on the fuse material.

Terminals T between the fuse 16 and the resistor $R_1$ are connected to a resistor $R_2$ and a diode $D_3$. In turn, the resistors $R_1$ and $R_2$ are connected to the ground line GND via diodes $D_1$ and $D_2$. The terminals T connected to the fuse 16 and resistor $R_1$ are further connected to the gate electrode of, for example, an n-channel MOSFET (called nMOS) 17 via the resistor $R_2$.

The purpose of furnishing the diodes $D_1$ through $D_3$ and the resistor $R_2$ is to prevent gate destruction that would otherwise occur if an excess charge stemming from laser cutting reaches the MOS gate. These components work as follows: If a positive charge develops, the charge is led to the ground line GND via the diodes $D_1$ and $D_2$; if a negative charge occurs, the charge is led to the power line $V_{EE}$ via the diode $D_3$. Any residual charge loses its energy when entering the resistor $R_2$, whereby the MOS gate is protected from destruction.

The nMOS 17 is connected to a switch circuit portion in a backup decoder circuit. The switch circuit portion acts to replace a faulty memory with its backup memory cell when the corresponding fuse 16 is cut.

In the first embodiment where the fuse 16 is connected as shown in FIG. 5, the resistor $R_1$ is sufficiently greater in resistance value than the fuse 16. The resistance differential allows the gate electrode of the nMOS 17 to be supplied with the voltage of the ground line GND (e.g., 0 V) through the fuse 16 and resistor $R_2$. This keeps the nMOS 17 active and deactivates the switch circuit portion.

If the fuse 16 is cut, though not shown in FIG. 5, the gate electrode of the nMOS 17 is supplied with the voltage of the negative power line $V_{EE}$ (e.g., $-4$ V) via the resistor $R_1$. This turns off the nMOS 17 and activates the switch circuit portion, whereby the faulty memory cell is replaced by the corresponding backup memory cell. The fuse connecting/cutting status, switch circuit operations and other activities associated with the fault remedying circuit construction will be described in more detail in connection with the other embodiments of the invention to be discussed later.

In the first embodiment, as will be described later, the fuse 16 is made of the ingredients of the substrate metal BLM. This means that the fuse 16 is resistant to corrosion. Taking advantage of this property, the fuse 16 of the first embodiment remains exposed at the top of the surface protective film 9. As a result of this, there is no need to make a hole illustratively to the surface protective film 9 upon cutting of the fuse 16 by laser or the like. With no hole making required, the fuse 16 is easier to cut as needed. Furthermore, the conventionally experienced intrusion of ions and other impurities through the hole is prevented.

Figure 6:
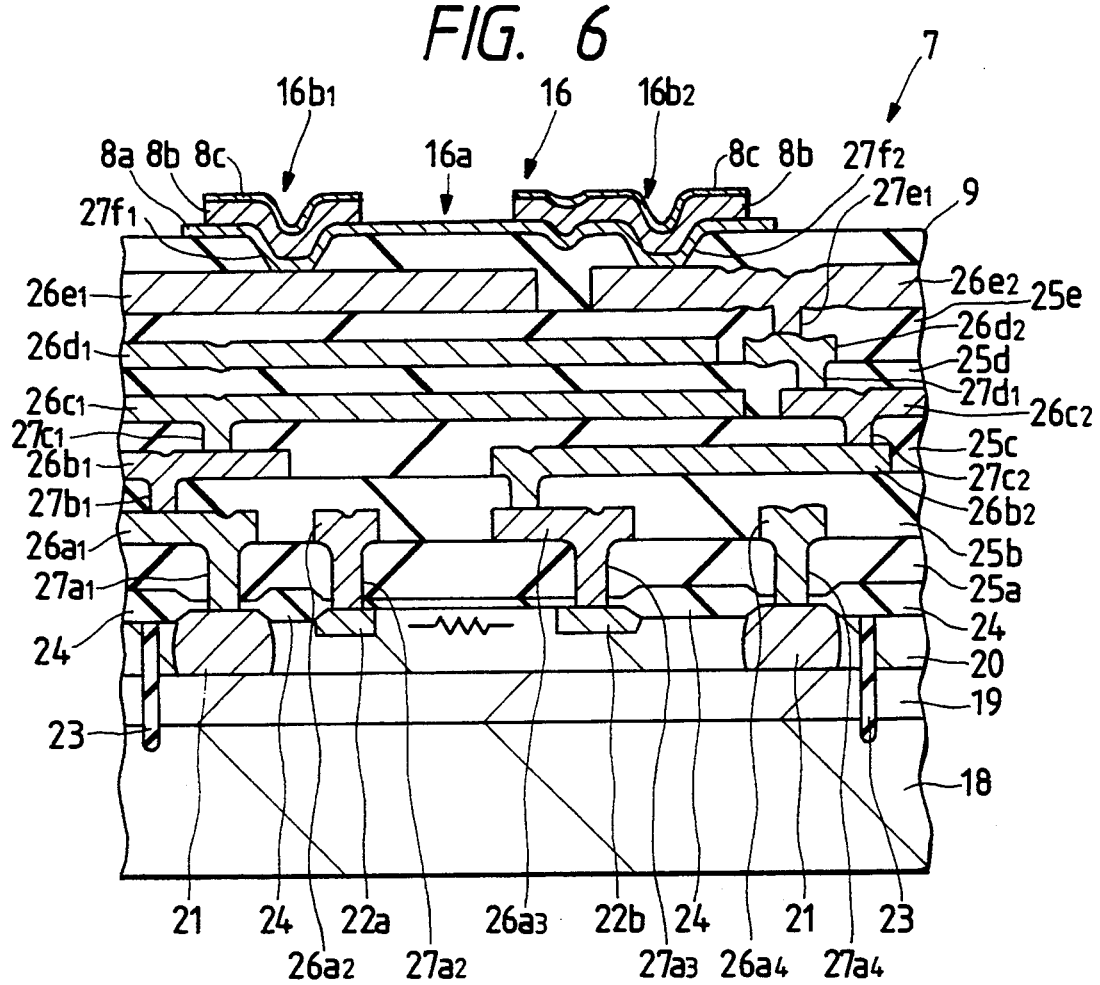
FIG. 6 is an enlarged sectional view of the fuse arrangement of FIG. 2 and a semiconductor substrate thereunder.

FIG. 6 is an enlarged sectional view of the fuse arrangement 16. A semiconductor substrate 18 in FIG. 6 is made illustratively of a p-type silicon (Si) single crystal. The semiconductor substrate 18 typically includes a buried layer 19. The buried layer 19 has illustratively n-type impurities such as antimony (Sb) or arsenic (As) implanted therein.

On top of the buried layer 19 is an epitaxial layer 20 illustratively made of p-type silicon single crystal. The epitaxial layer 20 comprises an outgoing diffusion layer 21 and resistance diffusion layers 22a and 22b. The outgoing diffusion layer 21 illustratively has n-type impurities such as phosphorus (P) or arsenic (As) implanted therein. In the resistance diffusion layers 22a and 22b, p-type impurities such as boron are implanted.

The resistance values of the resistors $R_1$ and $R_2$ in FIG. 5 are determined by the resistance value of the epitaxial layer 20 located between the resistance diffusion layers 22a and 22b. The diodes $D_1$ through $D_3$ in FIG. 5 are each made of the epitaxial layer 20 and the n-type buried layer 19. That is, the resistors and diodes are integrally furnished in this construction. The elements such as the resistors and diodes are isolated electrically from one another by isolation grooves 23 and by a field insulation film 24.

On the semiconductor substrate 18 are interlayer insulation films 25a through 25e (made of $SiO_2$) and the surface protective film 9, deposited in that order from the bottom up. Of these interlayer insulation films, the films 25a, 25b and 25c each have a flat top. Under the fuse 16, the top of the surface protective film 9 is also flattened. With physical staggers thus removed from its substrate, the fuse 19 is protected against the disconnection otherwise resulting therefrom and is afforded higher reliability.

Between the interlayer insulation films 25a and 25b exist first wiring layers 26a1 through 26a4 each illustratively made of aluminum (Al) or an aluminum alloy. The first wiring layers 26a1 and 26a4 are connected electrically to the outgoing diffusion layers 21 via through holes 27a1 and 27a4 in the interlayer insulation film 25a. Likewise, the layers 26a2 and 26a3 are connected electrically to the resistance diffusion layers 22a and 22b via through holes 27a2 and 27a3 in the interlayer insulation film 25a.

Between the interlayer insulation films 25b and 25c exist second wiring layers 26b1 and 26b2 each illustratively composed of aluminum or an aluminum alloy. The second wiring layer 26b1 is connected electrically to the first wiring layer 26a1 via a through hole 27b1 in the interlayer insulation film 25b. Likewise, the second wiring layer 26b2 is connected electrically to the first wiring layer 26a3 via a through hole 27b2 in the interlayer insulation film 25b.

Between the interlayer insulation films 25c and 25d exist third wiring layers 26c1 and 26c2 each illustratively made of aluminum or an aluminum alloy. The third wiring layer 26c1 is connected electrically to the second wiring layer 26b1 via a through hole 27c1 in the interlayer insulation film 25c. Furthermore, the third wiring layer 26c1 illustratively keeps electrical connection to the ground line GND shown in FIG. 5. The third wiring layer 26c2 is connected electrically to the second wiring layer 26b2 via a through hole 27c2 in the interlayer insulation film 25c.

Between the interlayer insulation films 25d and 25e exist fourth wiring layers 26d1 and 26d2 each illustratively composed of aluminum or an aluminum alloy. The fourth wiring layer 26d2 is connected electrically to the third wiring layer 26c2 via a through hole in the interlayer insulation film 25d. The fourth wiring layer 26d1 illustratively keeps electrical connection to the ground line GND shown in FIG. 5.

On top of the interlayer insulation film 25e are fifth wiring layers 26e1 and 26e2 each illustratively made of aluminum or an aluminum alloy. The fifth wiring layer 26e2 is connected electrically to the fourth wiring layer 26d2 via a through hole 27e1 in the interlayer insulation film 25e. The fifth wiring layer 26e1 illustratively keeps electrical connection to the ground line GND depicted in FIG. 5.

In the first embodiment, the third wiring layer 26c1, the fourth wiring layer 26d1 and part of the fifth wiring layer 26e1 extend under the fuse 16. This construction is devised typically for two reasons. The first reason is that making the top of the surface protective film 9 flat under the fuse 16 inhibits the fuse disconnection otherwise induced by substrate stagger and ensures the reliability of the fuse 16. The other reason is that the third wiring layer 26c1, the fourth wiring layer 26d1 and the fifth wiring layer 26e1 are made to act together as a laser shielding body (i.e., energy beam shielding body) when the fuse 16 is cut by a laser or the like. This structure suppresses collateral damage to the elements and wires under the fuse 16 during laser or energy beam irradiation. In other words, the third wiring layer 26c1, the fourth wiring layer 26d1 and the fifth wiring layer 26e1 act as damage prevention layers.

There is another benefit derived from making the third wiring layer 26c1, fourth wiring layer 26d1 and fifth wiring layer 26e1 double as the layer shielding body. Namely, if a separate laser shielding body is provided, carriers such as charges generated upon laser irradiation may be accumulated in that body. The laser shielding body may then discharge, causing damage elements or wires nearby. The integral laser shielding body construction of this embodiment eliminates the possibility of such an occurrence.

The fuse arrangement 16 is formed on the surface protective film 9. If the cutting portion 16a of the fuse 16 were composed of the three metal layers 8a, 8b and 8c constituting the substrate metal BLM, it would be difficult to cut that portion by a laser or the like. With the first embodiment, the cutting portion 16a is illustratively made of a chromium (Cr) layer alone.

Both sides of the metal layer 8a, i.e., both sides of the fuse arrangement 16, are connected electrically to the fifth wiring layers 26e1 and 26e2 via through holes 27f1 and 27f2 in the surface protective film 9. It should be noted that the noncutting portions 16b1 and 16b2 of the fuse arrangement 16 are each composed of the metal layers 8a, 8b and 8c, deposited in that order from the bottom up as shown in FIG. 6. In the first embodiment, the noncutting portion 16b2 overhangs the stagger formed on the top of the surface protective film 9 between the fifth wiring layers 26e1 and 26e2. Because the staggered portion in the substrate is covered with the noncutting portion 16b2 made of the three layers 8a through 8c, the inadvertent cutting of the fuse 16 which may otherwise be caused by the stagger is prevented, and the reliability of the fuse arrangement 16 is ensured.

Figure 7:
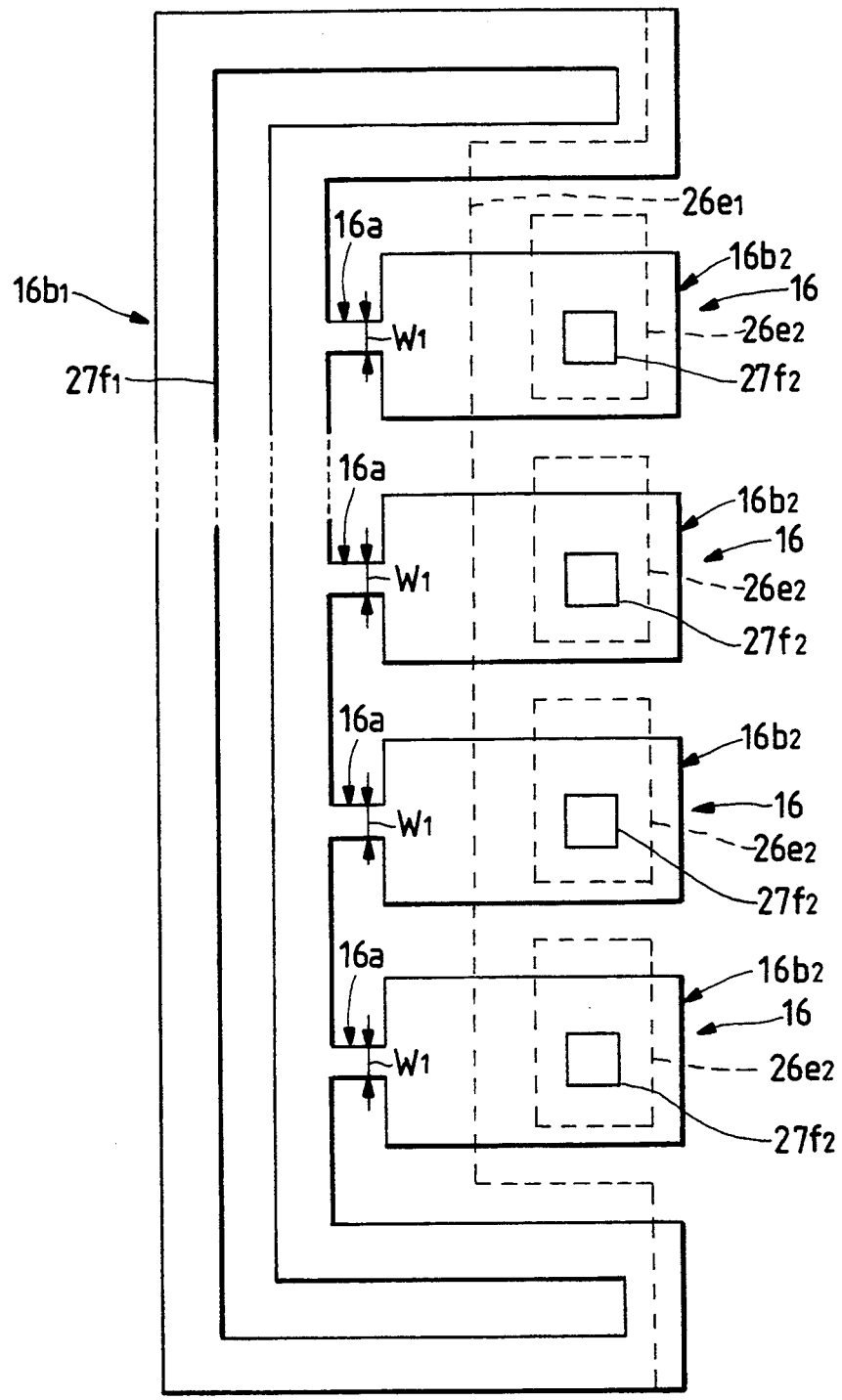
FIG. 7 is an overall enlarged plan view of the fuse arrangement of FIG. 2.

FIG. 7 is an overall enlarged plan view of the fuse arrangement 16. As illustrated, a plurality of fuses are provided where needed. The cutting portion 16a of each fuse 16 is made narrower than the other portions thereof for the ease of cutting on demand. For the first embodiment, the width W1 of the cutting portion 16a is illustratively 15 μm or less.

The noncutting portion 16b1 of the fuse arrangement 16 is connected to all cutting portions 16a thereof. Part of the noncutting portion 16b1 extends so as to surround the periphery of the fuse arrangement 16. Thus, the noncutting portion 16b1 functions as a guard ring.

The noncutting portion 16b1 is made to act as the guard ring illustratively for the following three reasons: First, the noncutting portion 16b1 protects the fuse arrangement 16 against high voltages stemming from static electricity or the like from the outside, whereby the inadvertent cutting of the fuses is suppressed. Second, the noncutting portion 16b1 acts as a conduit that dissipates carriers such as charges generated upon cutting of the fuse 16 by laser or the like. With the carriers safely bypassed in this manner, the other elements are protected from the adverse effects thereof. Third, the noncutting portion 16b1 inhibits the intrusion of ions and other impurities into the chip.

In the first embodiment, the through hole 27f1 connecting the noncutting portion 16b1 to the fifth wiring layer 26e1 extends along the portion 16b1. The through hole 27f1 is made to extend in this manner for the following reason: If cracks develop in the surface protective film 9, typically due to a difference in thermal expansion coefficient between the film 9 and the fuse arrangement 16, the through hole 27f1 is there to prevent the spreading of the cracks. There exist the other group of noncutting portions 16b2, which are separately furnished as shown.

The method by which the first embodiment is illustratively produced will now be described with reference to FIGS. 1 through 15. The method for forming the fuse arrangement 16 will be described first. The method to cut the fuse will then be discussed, followed by a description of the processes up to the packaging of the semiconductor chip 7. The processes between formation of the fuse arrangement 16 and cutting thereof are accomplished before the semiconductor chips 7 are separated from a semiconductor wafer.

Figure 8:
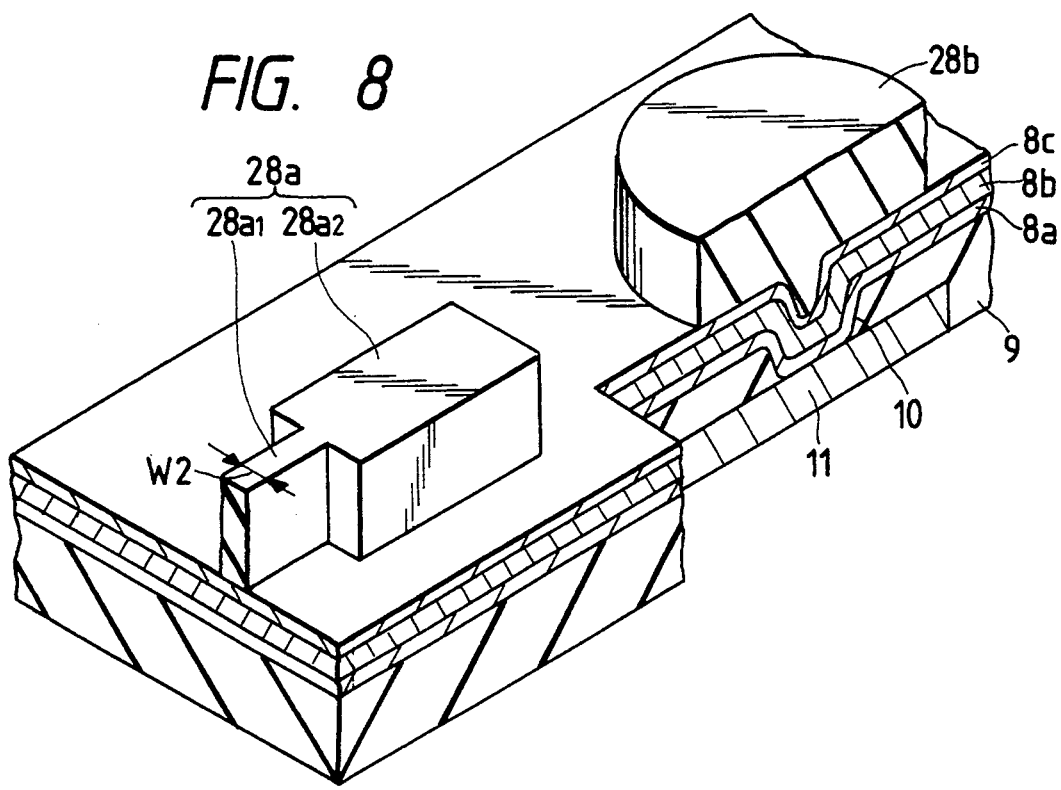
FIG. 8 is a partial perspective view depicting a method for forming the fuse arrangement of FIG. 2.
Figure 9:
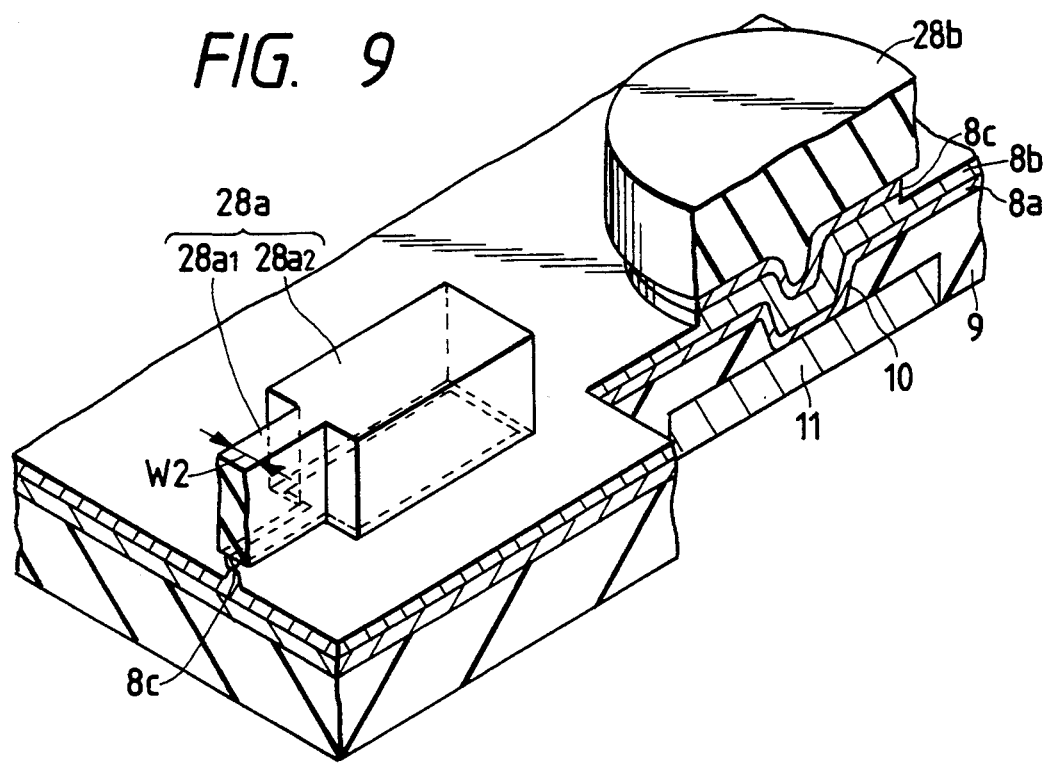
FIG. 9 is another partial perspective view describing the method for forming the fuse arrangement of FIG. 2.

As depicted in FIG. 8, the through holes 10, 27f1 and 27f2 (FIG. 6) are made simultaneously on the surface protective film 9 by photolithography. Thereafter, the metal layers 8a, 8b and 8c are deposited illustratively by sputtering, in that order from the bottom up, on the surface protective film 9.

On the metal layer 8c, a photo resist film (also called a resist film) is then deposited. This resist film is patterned by photolithography into resist patterns 28a and 28b. The resist pattern 28a is a pattern by which to pattern the fuse arrangement 16 (FIG. 7). The resist pattern 28a is made of pattern portions 28a1 and 28a2. The pattern portion 28a1 is used to form the cutting portion 16a of the fuse 16 (FIG. 7); the pattern portion 28a2 is used to form the noncutting portion 16b2 of the fuse arrangement 16.

When the resist pattern 28a is formed in the first embodiment, the width W2 of the pattern portion 28a1 is made illustratively smaller than the amount of side etching in the wet etching process for patterning the metal layers 8b and 8c. The resist pattern 28b is a pattern by which to pattern the substrate metal BLM (FIG. 3) for the CCB bumps 6. The metal layers 8b and 8c are patterned illustratively by wet etching. Because wet etching proceeds isotropically, part of the metal layers 8b and 8c under the periphery of the resist patterns 28a and 28b are also etched and removed.

Figure 10:
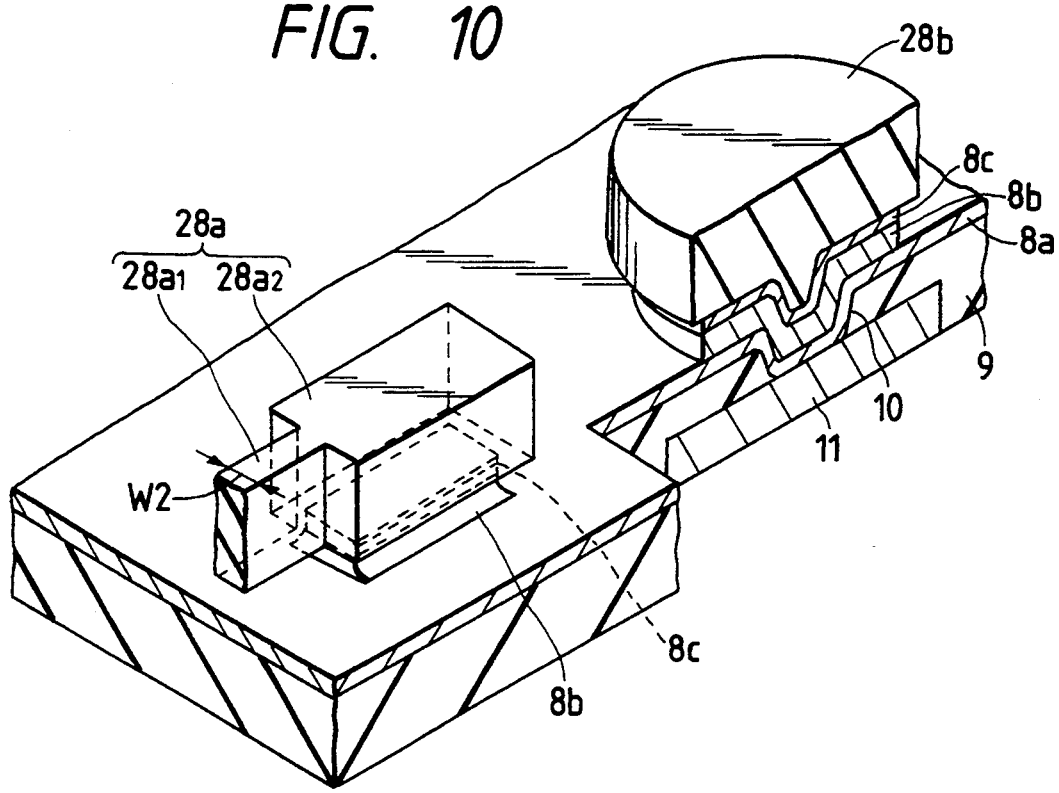
FIG. 10 is another partial perspective view showing the method for forming the fuse arrangement of FIG. 2.

As described, the width W2 of the pattern portion 28a1 is made smaller than the amount of side etching in the wet etching process. Thus with the patterning of the metal layers 8b and 8c completed, only the metal layer 8a remains under the pattern portion 28a1, as illustrated in FIG. 10. Under the pattern portion 28a2 remain the metal layers 8b and 8c, allowing the resist pattern 28a to stay intact. In other words, the pattern portion 28a1 remains supported by the pattern portion 28a2.

Figure 11:
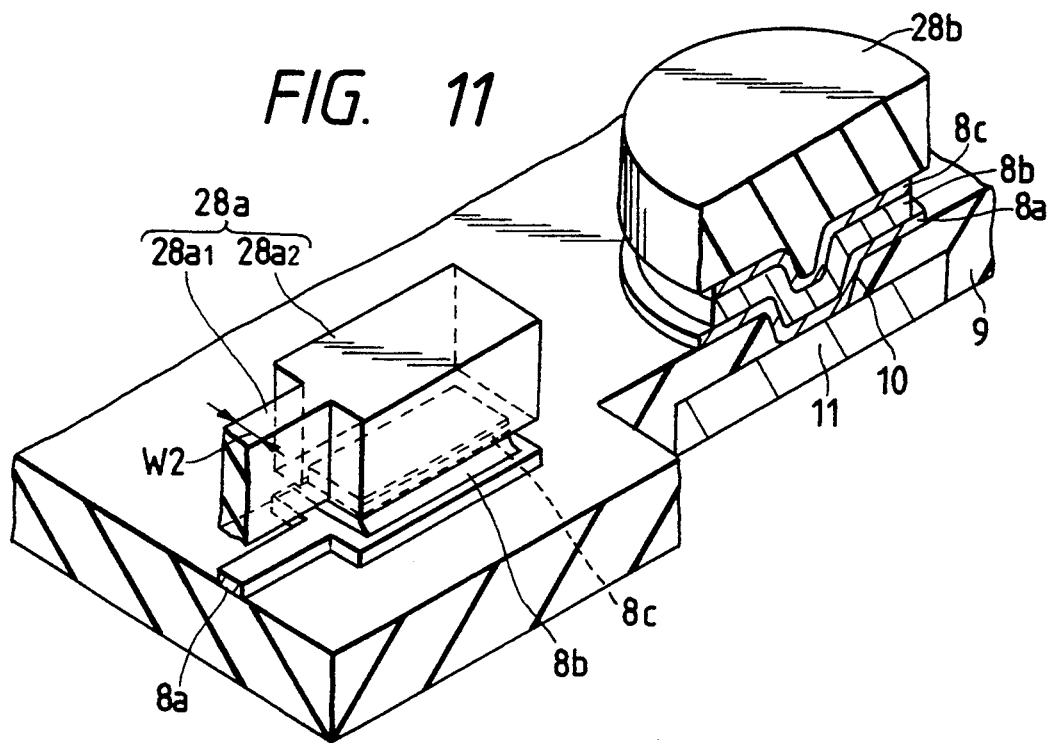
FIG. 11 is another partial perspective view depicting the method for forming the fuse arrangement of FIG. 2.
Figure 12:
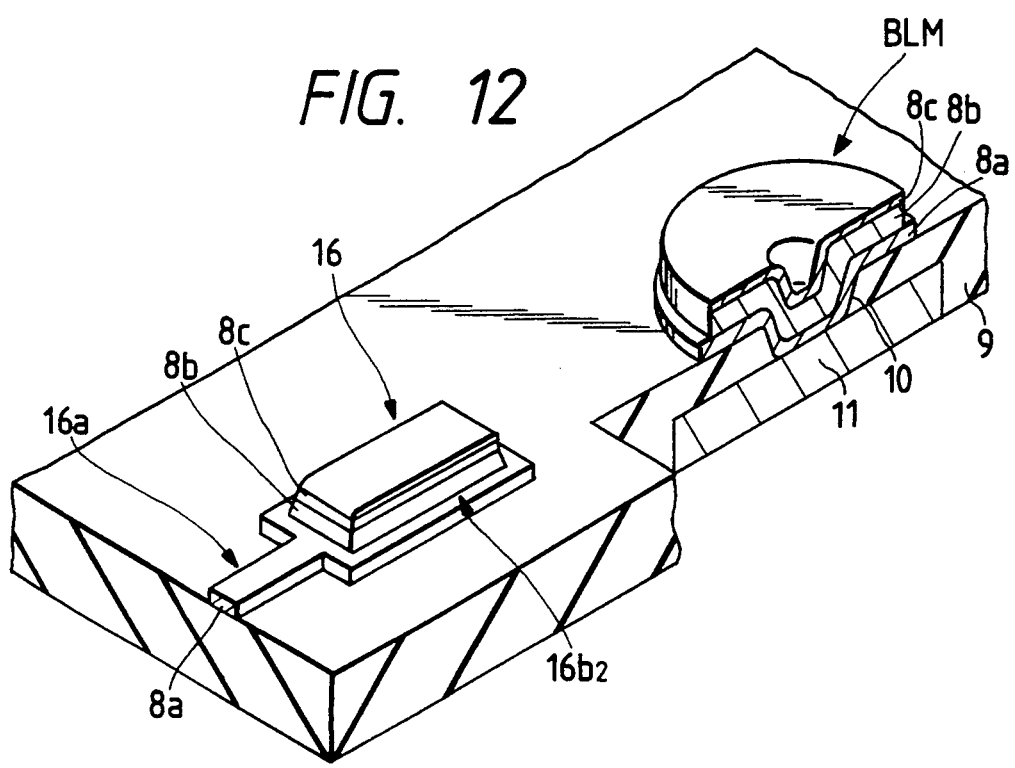
FIG. 12 is another partial perspective view describing the method for forming the fuse arrangement of FIG. 2.

As depicted in FIG. 11, the metal layer 8a is then patterned by dry etching with the resist patterns 28a and 28b used as the etching mask. After this, the resist patterns 28a and 28b are removed so as to form the fuse arrangement 16 and the substrate metal BLM concurrently, as shown in FIG. 12. The concurrent patterning of the fuse arrangement 16 and substrate metal BLM in the first embodiment affords two benefits. One benefit is that no new photo mask is needed to form the fuse 16. The other benefit is that no new production step needs to be included in the fuse forming process. Thereafter, the CCB bumps 6 are formed on the substrate metal BLM illustratively by lift-off or by metal mask evaporation.

Figure 13:
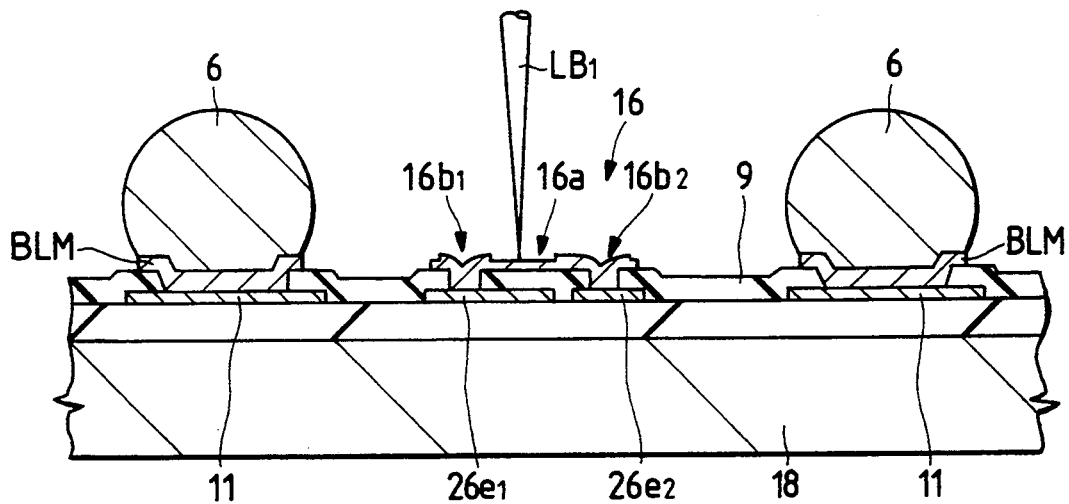
FIG. 13 is a partial sectional view of the semiconductor substrate on which a fuse is being cut.
Figure 14:
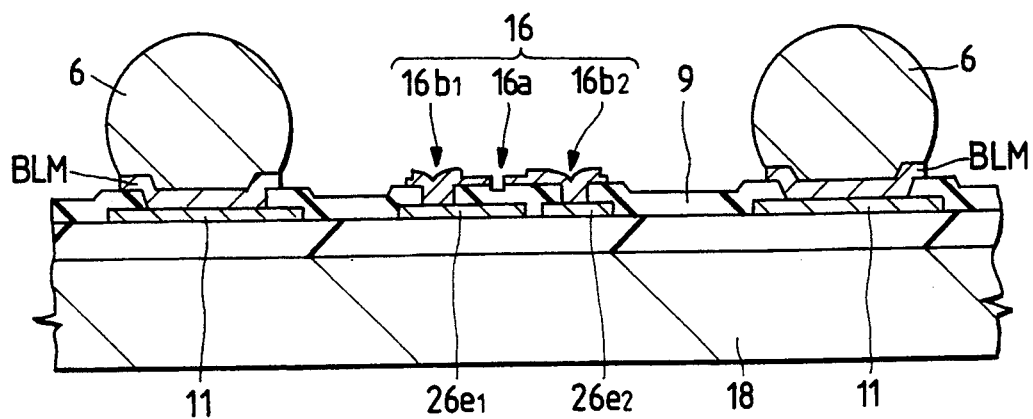
FIG. 14 is a partial sectional view of the semiconductor substrate on which the fuse has been cut.
Figure 15:
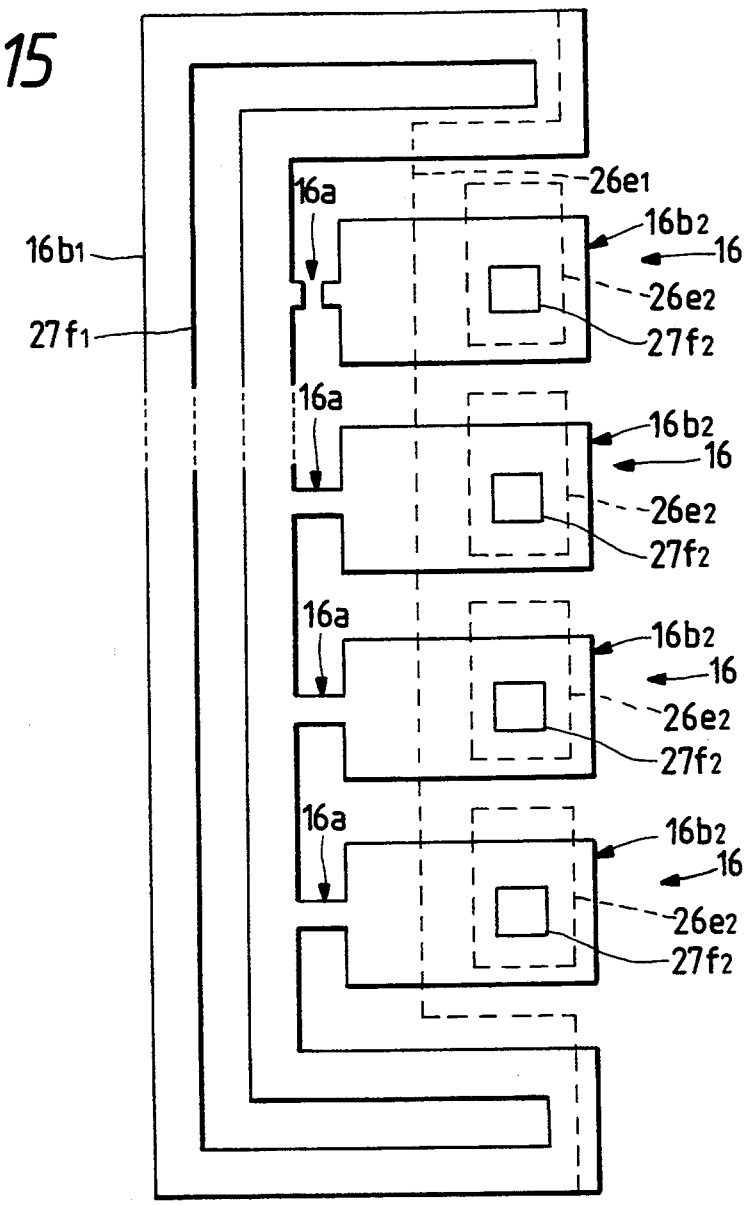
FIG. 15 is an overall plan view of the fuse of FIG. 14 after it has been cut.

With the CCB bumps 6 formed, each semiconductor chip 7 on the semiconductor wafer is subjected to a probe check. Depending on the result of the probe check, a laser beam (energy beam) LB1 is irradiated at the cutting portion 16a of the target fuse 16, as shown in FIG. 13. The beam irradiation cuts the fuse 16, as illustrated in FIGS. 14 and 15. Since the cutting portion 16a of the fuse 16 is made of only one metal layer 8a (FIG. 6), a beam of relatively low energy may be used to cut the fuse 16. With the first embodiment, the laser beam LB1 is irradiated to cut the fuse in an oxidized atmosphere. This setup is devised so as to oxidize the fuse 16 for easier sublimation, whereby the target fuse is cut with greater ease.

Thereafter, another probe check is carried out. A "FAILED" mark is attached to any semiconductor chip 7 found to be defective as a result of the check. The semiconductor chips 7 are then detached from the semiconductor wafer. Of the detached semiconductor chips 7, only the good ones are mounted each on the package substrate shown in FIG. 1. The good chips are each sealed in an airtight fashion by the cap 12, whereby the chip carrier 1a is produced.

As described, the first embodiment of the invention offers the following major advantages:

(1) Furnishing the fuse arrangement 16 on top of the surface protective film 9 eliminates the conventional need to remove insulation and/or wiring layers covering the fuses when the target fuse 16 is to be cut. This makes cutting of the desired fuse easier than ever before.

(2) With no need to make a hole in the surface protective film 9 covering the semiconductor chip 7 when the fuse 16 is to be cut, the conventionally experienced problem of ions and other impurities intruding through that hole is circumvented.

(3) With the cutting portion 16a of the fuse 16 composed only of the metal layer 8a, the target fuse is cut by a laser or the like at a relatively low energy level. This minimizes irradiation-induced collateral damage to the elements and wires under the fuse arrangement 16.

(4) Part of the third wiring layer 26c1, the fourth wiring layer 26d1 and the fifth wiring layer 26e1 extend under the fuse arrangement 16. With these extensions acting as the laser shielding body, it is possible to suppress damage to the elements and wires under the fuse arrangement 16, the damage being attributable to the cutting of the fuse by the laser beam LB1 or the like.

(5) The third wiring layer 26c1, the fourth wiring layer 26d1 and the fifth wiring layer 26e1 constitute an integral laser shielding body that dissipates carriers such as charges generated upon laser irradiation. Thus the carrier-induced damage to the elements or wires nearby is minimized.

(6) Part of the third wiring layer 26c1, the fourth wiring layer 26d1 and the fifth wiring layer 26e1 extend under the fuse arrangement 16, while the top of the surface protective film 9 under the fuse arrangement 16 is made flat. This construction prevents inadvertent cutting of fuses caused by substrate stagger, whereby the reliability of the fuse arrangement 16 is ensured.

(7) Part of the noncutting portion 16b1 of the fuse arrangement 16 extends partially around the periphery of the latter. With the extended portion acting as the guard ring, it is possible to inhibit inadvertent cutting of fuses typically attributable to static electricity. Furthermore, carriers such as charges generated upon cutting of the fuse 16 may be dissipated via the noncutting portion 16b1. Another benefit of this structure is that it prevents the intrusion of ions and other impurities.

(8) The through holes 27f1 arranged partially around the periphery of the fuse arrangement 16 prevent the spreading of cracks that may develop in the surface protective film 9 typically as a result of a difference in thermal expansion coefficient between the fuse arrangement 16 and the surface protective film 9.

(9) The advantages (2) through (8) above ensure high levels of reliability and yield of the semiconductor chip 7 having the fuse arrangement 16.

(10) Because the fuse arrangement 16 is patterned concurrently with the patterning of the substrate metal BLM, there is no need to prepare separately a new photo mask by which to pattern the fuse arrangement 16. In addition, no further production step needs to be added to form the fuse arrangement 16. Therefore, the fuse arrangement 16 is formed without recourse to added photo masks or more production steps.

Second Embodiment

The second embodiment of the invention will now be described with reference to FIGS. 16 through 22.

Figure 16:
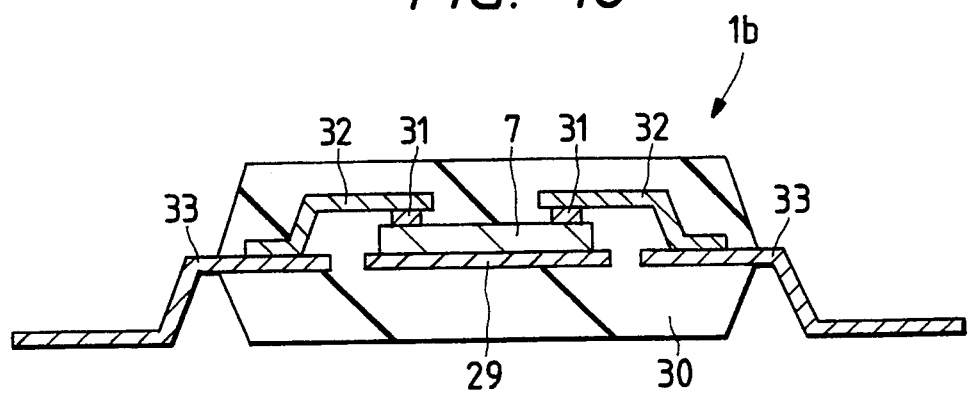
FIG. 16 is a sectional view of a semiconductor integrated circuit device practiced as a second embodiment of the invention.

The second embodiment shown in FIG. 16 is illustratively a QFP (quad flat package) 1b. In FIG. 16, the semiconductor chip 7 is mounted on a die pad 29 and sealed in a package body 30 typically made of epoxy resin. The chip 7 is connected electrically to lead wires 33 through TAB bumps 31 and TAB lead wires 32. The TAB bumps 31 are illustratively composed of gold (Au); the TAB lead wires 32, of copper (Cu); and the lead wires 33, of 42 alloy.

Figure 17:
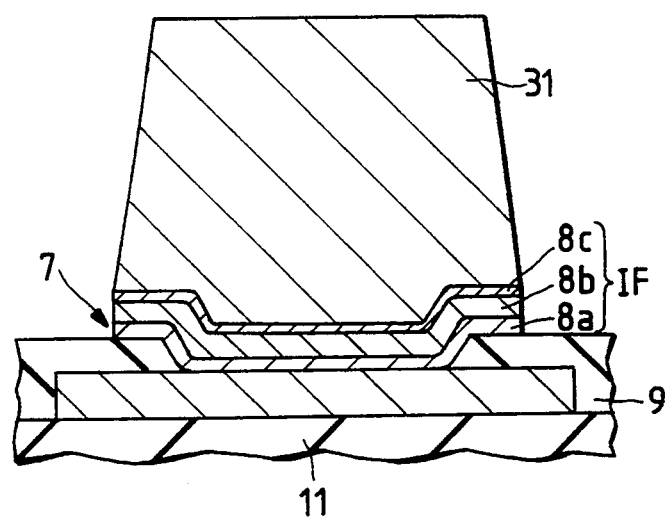
FIG. 17 is a sectional view of a TAB bump and a substrate metal for the bump.

As depicted in FIG. 17, the TAB bumps 31 are connected electrically to outgoing electrodes 11 via a substrate metal (TAB substrate metal) IF. The substrate metal IF is typically made of the three metal layers 8a, 8b and 8c, deposited in that order from the bottom up. In the second embodiment, the metal layer 8a is made illustratively of titanium (Ti); the layer 8b, of nickel (Ni); and the layer 8c, of gold (Au).

Figure 18:
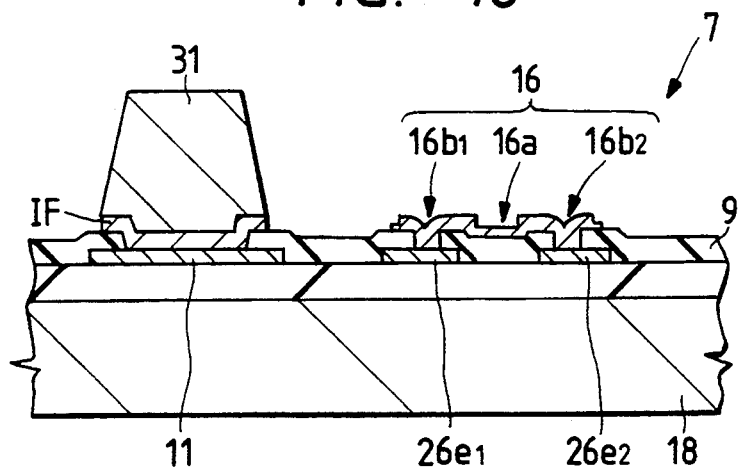
FIG. 18 is a sectional view of a fuse arrangement constituting part of a redundancy circuit in the second embodiment of FIG. 16.

As shown in FIG. 18, the second embodiment has its fuse arrangement 16 formed on the surface protective film 9 and composed of the ingredients of the substrate metal IF. This means that as with the first embodiment, the second embodiment does not require making a hole in the surface protective film 9 when the target fuse 16 is to be cut. This makes cutting of the target fuse easer and prevents the intrusion of ions and other impurities from that hole in the surface protective film 9.

Figure 19:
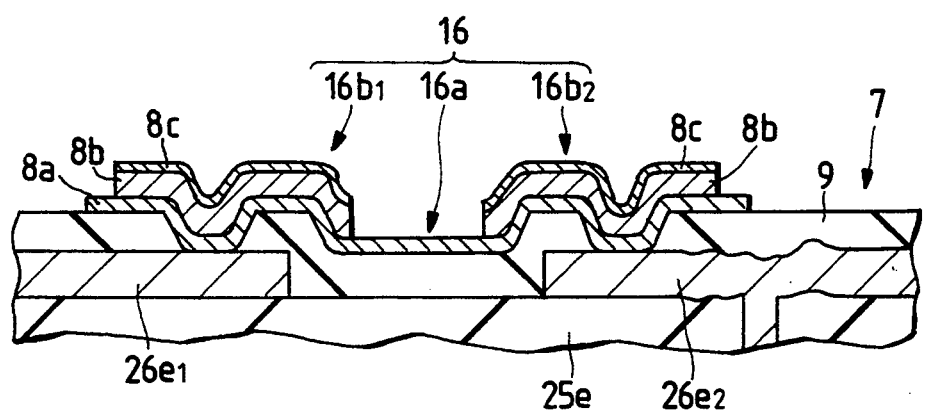
FIG. 19 is an enlarged sectional view of the fuse arrangement of FIG. 18.

As depicted in FIG. 19, the second embodiment still has the cutting portion 16a of the fuse 16 composed of the metal layer 8a alone, the layer 8 being one of the ingredients of the substrate metal IF (FIG. 17). Thus, as with the first embodiment, the second embodiment allows the desired fuse 16 to be cut by a laser beam or the like at a relatively low energy level.

The noncutting portions 16b1 and 16b2 of the fuse arrangement 16 are made of the metal layers 8a, 8b and 8c constituting the substrate metal IF. In the second embodiment, the noncutting portions 16b1 and 16b2 are designed to overhang the substrate staggers of the surface protective film 9, whereas the cutting portion 16a is formed over a relatively flat area of the film 9. This construction is intended to inhibit inadvertent cutting of fuses induced by substrate stagger, thereby ensuring the reliability of the fuse arrangement 16.

The second embodiment has no laser shielding body provided beneath the fuse arrangement 16. The construction allows desired wiring to be installed under the fuse arrangement 16. This amounts to significant easing of the restrictive rules imposed on the wiring layout.

Figure 20:
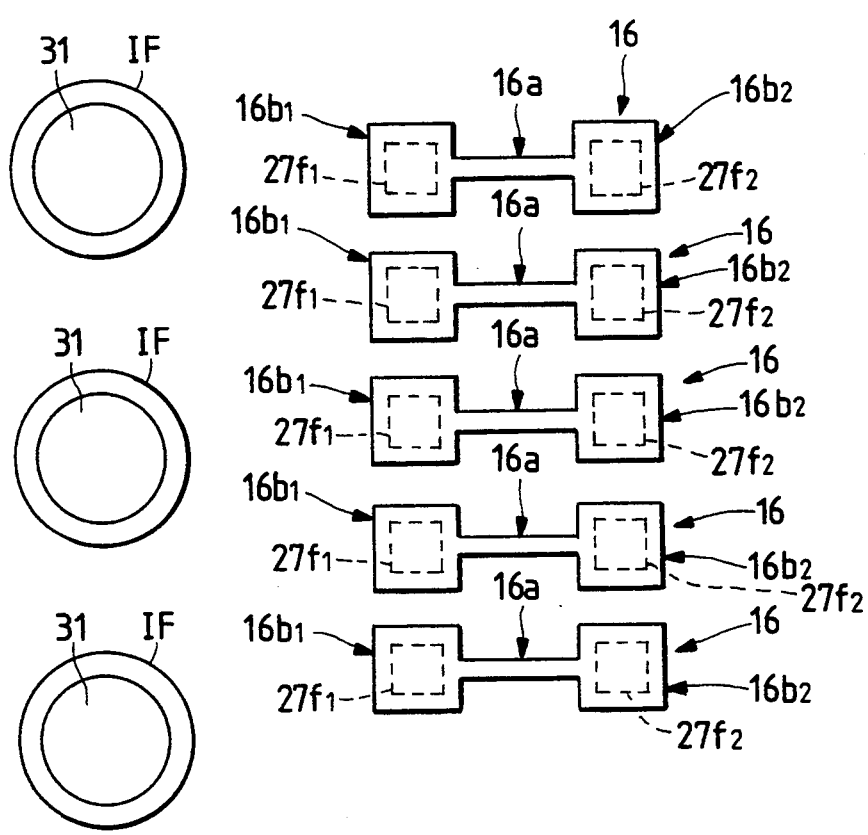
FIG. 20 is a plan view of the fuse arrangement of FIG. 18.

FIG. 20 is an overall plan view of the fuse arrangement 16 of the second embodiment. As shown in FIG. 20, the second embodiment has the noncutting portions 16b1 of the fuse arrangement 16 typically provided separately. The fuse arrangement 16 of this structure is patterned at the same time as the substrate metal IF, as in the case of the first embodiment. Thus, as with the first embodiment, the fuse arrangement 16 is formed without recourse to additional photo masks or further production steps.

Figure 21:
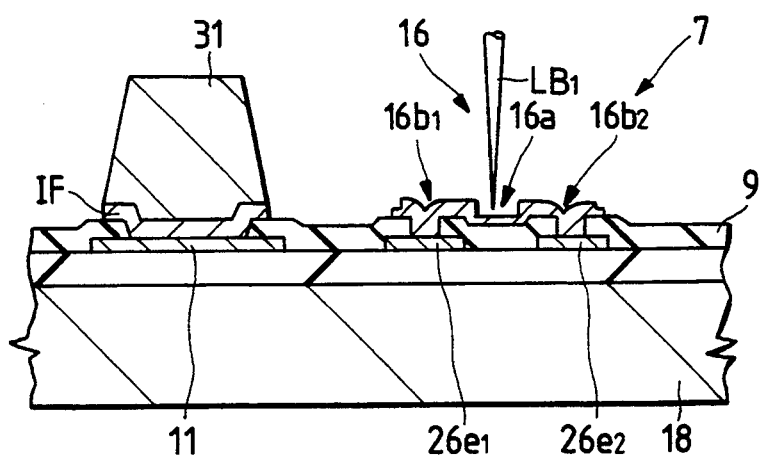
FIG. 21 is a partial sectional view of the semiconductor substrate on which a fuse is being cut.
Figure 22:
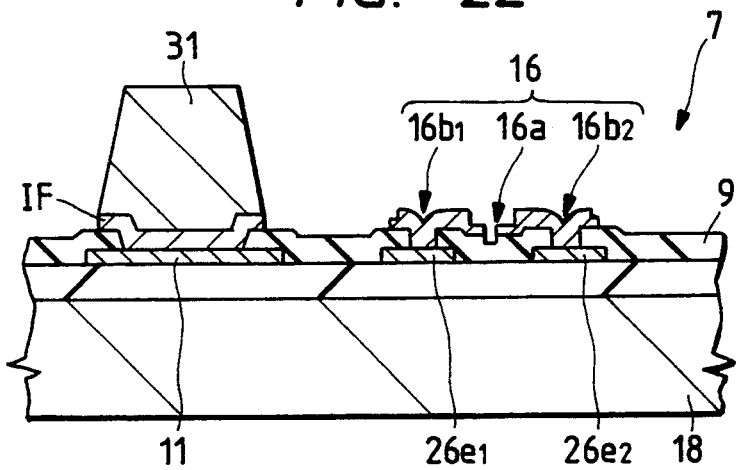
FIG. 22 is a partial sectional view of the semiconductor substrate on which the fuse has been cut.

As with the first embodiment, the semiconductor chip 7 is subjected to a probe check before cutting of the fuse arrangement 16. Depending on the result of the probe check, a laser beam $LB_1$ is irradiated at the cutting portion 16a of the target fuse 16, as shown in FIG. 21. The laser beam irradiation cuts the fuse 16, as illustrated in FIG. 22.

As described, the second embodiment offers one major benefit in addition to the above-described advantages (1) through (3) and (10) derived from the first embodiment. Specifically, with no laser shielding body provided under the fuse arrangement 16, desired wiring may instead be furnished thereunder. This amounts to appreciable easing of the restrictive rules imposed on the wiring layout.

Third Embodiment

The third embodiment of the invention will now be described with reference to FIGS. 23 and 24.

Figure 23:
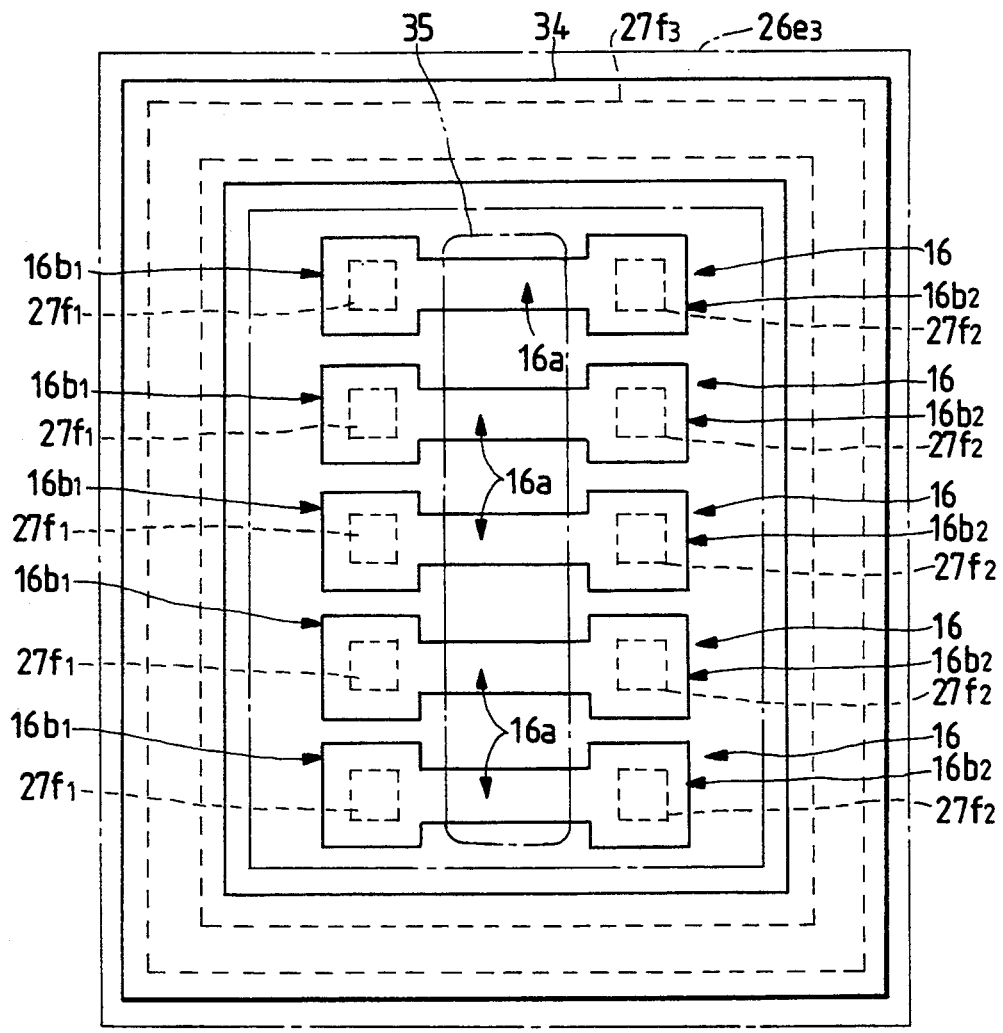
FIG. 23 is an overall enlarged plan view of a fuse arrangement constituting part of a redundancy circuit in a semiconductor integrated circuit device practiced as a third embodiment of the invention.
Figure 24:
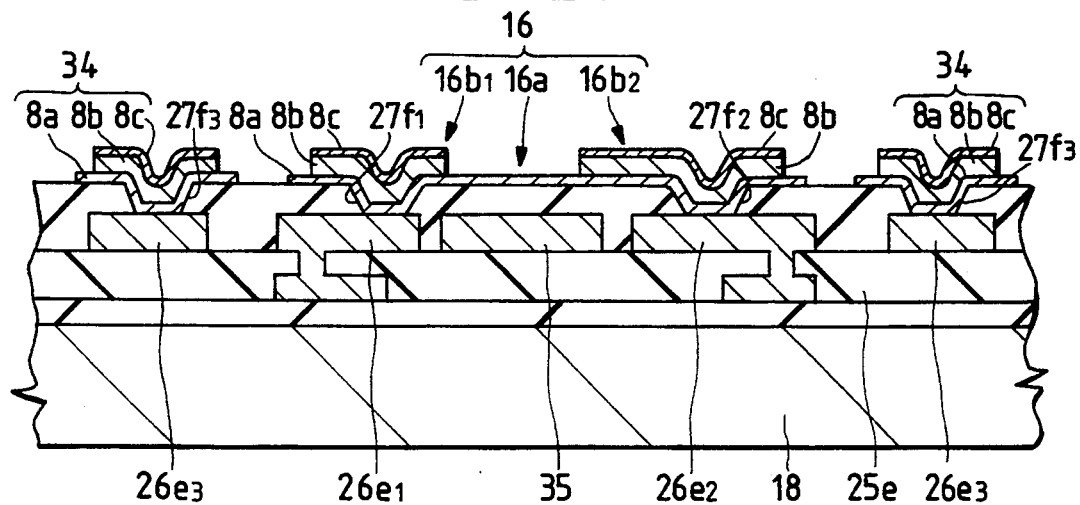
FIG. 24 is a sectional view of the fuse arrangement of FIG. 23.

In the third embodiment, as depicted in FIGS. 23 and 24, a guard ring 34 formed independently of the fuse arrangement 16 completely surrounds the periphery of the latter. This guard ring construction is more effective than that of the first embodiment.

As illustrated in FIG. 24, the guard ring 34 is composed of the metal layers 8a, 8b and 8c constituting the fuse arrangement 16, the layers being deposited in that order from the bottom up. Thus with the third embodiment, the guard ring 34 is patterned at the same time as the fuse arrangement 16 and substrate metal BLM (or IF). However, the cutting portion 16a of the fuse 16 is formed from the metal layer 8a alone, as with the first and the second embodiments.

The guard ring 34 is connected electrically to the fifth wiring layer 26e3 in a flat ring shape via a through hole 27f3 formed in the surface protective film 9, as shown in FIGS. 23 and 24. The through hole 27f3 extends along the guard ring 34, completely surrounding the fuse arrangement 16. This hole structure prevents the spreading of cracks that may develop in the surface protective film 9 typically as a result of a difference in thermal expansion coefficient between the film 9 and the fuse arrangement 16.

Under the fuse arrangement 16 is a laser shielding body 35 provided independently of the fifth wiring layer 26e1. As with the first embodiment, this construction suppresses collateral damage to the elements and-/or wires under the fuse arrangement 16, the damage being attributable to the cutting of a target fuse by a laser beam or the like.

The laser shielding body 35 keeps flat the top of the surface protective film 9 under the cutting portions 16a of the fuse arrangement 16. For the same reason as described for the first embodiment, this construction ensures the reliability of the fuse arrangement 16.

As described, the third embodiment offers the following major benefits in addition to the above-described advantages (1) through (3) and (10) derived from the first embodiment:

(1) With the laser shielding body 35 provided under the fuse arrangement 16, collateral damage to the elements and/or wires under the fuse arrangement 16 is suppressed, the damage being attributed to the cutting of a target fuse by a laser beam or the like.

(2) The laser shielding body 35 is furnished under the fuse arrangement 16, with the top of the surface protective film 9 made flat under the latter. This construction inhibits inadvertent cutting of the fuse arrangement 16 otherwise caused by substrate stagger, whereby the reliability of the fuse arrangement 16 is ensured.

(3) With the guard ring 34 completely surrounding the fuse arrangement 16, the guard ring effect is made greater than that of the first embodiment.

(4) With the through hole 27f3 completely surrounding the fuse arrangement 16, it is possible to suppress cracks that may develop in the surface protective film 9 typically as a result of a difference in thermal expansion coefficient between the film 9 and the fuse arrangement 16.

Fourth Embodiment

The fourth embodiment of the invention will now be described with reference to FIGS. 25 and 26.

Figure 25:
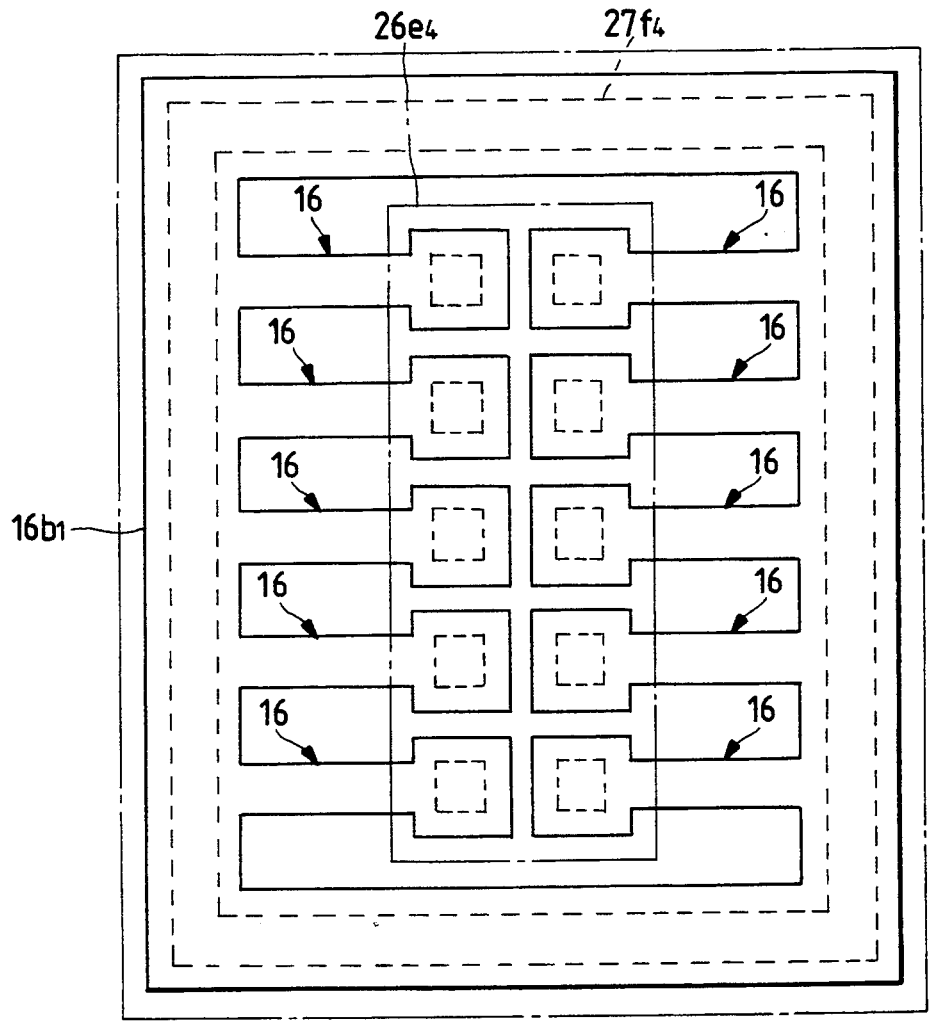
FIG. 25 is an overall enlarged plan view of a fuse arrangement constituting part of a redundancy circuit in a semiconductor integrated circuit device practiced as a fourth embodiment of the invention.
Figure 26:
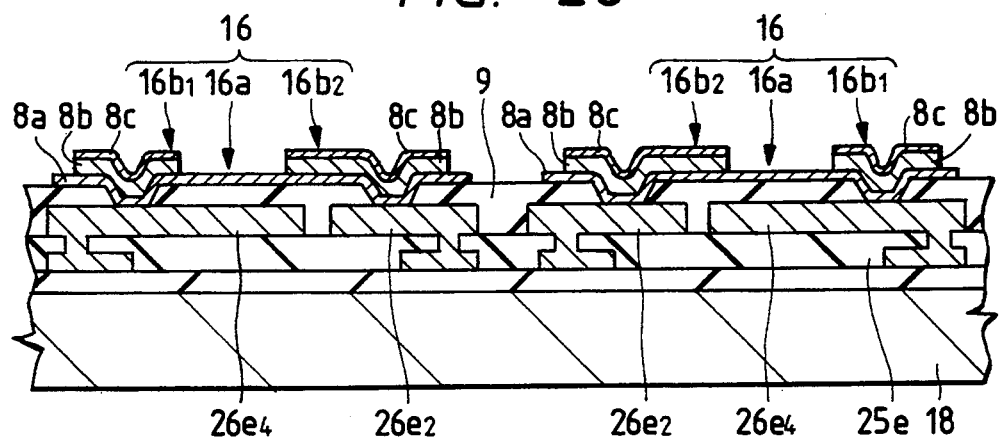
FIG. 26 is a partial sectional view of the fuse arrangement of FIG. 25.

As shown in FIGS. 25 and 26, the fourth embodiment has its fuse arrangement 1 completely surrounded by the noncutting portion 16b1, the latter doubling as a guard ring. This construction makes the area of the fuse arrangement 16 in the fourth embodiment smaller than in the third embodiment. It is also possible to install in the fourth embodiment a larger number of individual fuses 16 than in the third embodiment without an appreciable increase in the fuse area.

The noncutting portion 16b1 is connected electrically to the fifth wiring layer 26e4 in a flat ring shape via a through hole 27f4 in the surface protective film 9, as illustrated in FIGS. 25 and 26. The through hole 27f4 completely surrounds the fuse arrangement 16 along the noncutting portion 16b1. As with the third embodiment, this construction prevents the spreading of cracks that may develop in the surface protective film 9 typically as a result of a difference in thermal expansion coefficient between the film 9 and the fuse arrangement 16.

In the fourth embodiment, as in the case of the first, part of the fifth wiring layer 26e4 extends under the fuse arrangement 16 and acts as a laser shielding body. This structure works in the same manner as in the first embodiment, preventing collateral damage to the elements and/or wires under the fuse arrangement 16, the damage being otherwise caused upon cutting of a fuse by a laser beam or the like.

As with the first embodiment, an extension of the fifth wiring layer 26e4 keeps flat the top of the surface protective film 9 under the cutting portion 16a of the fuse arrangement 16. This prevents inadvertent cutting of the fuse arrangement 16, thereby ensuring the reliability thereof.

As described, the fourth embodiment offers the following major benefits in addition to the advantages (1) through (6), (9) and (10) derived from the first embodiment:

(1) Surrounding the fuse arrangement 16 completely, the noncutting portion 16b1 in the fourth embodiment provides a better guard ring effect than in the first embodiment.

(2) With the through hole 27f4 completely surrounding the fuse arrangement 16, it is possible to prevent the spreading of cracks that may develop in the surface protective film 9 typically as a result of a difference in thermal expansion coefficient between the film 9 and the fuse arrangement 16.

(3) With the noncutting portion 16b1 doubling as the guard ring, the area of the fuse arrangement 16 in the fourth embodiment is made smaller than in the third embodiment. Moreover, the fourth embodiment may have a larger number of individual fuses 16 than the third embodiment without incurring an appreciable increase in the fuse area.

Fifth Embodiment

The fifth embodiment of the invention will now be described with reference to FIGS. 27 through 34.

Figure 27:
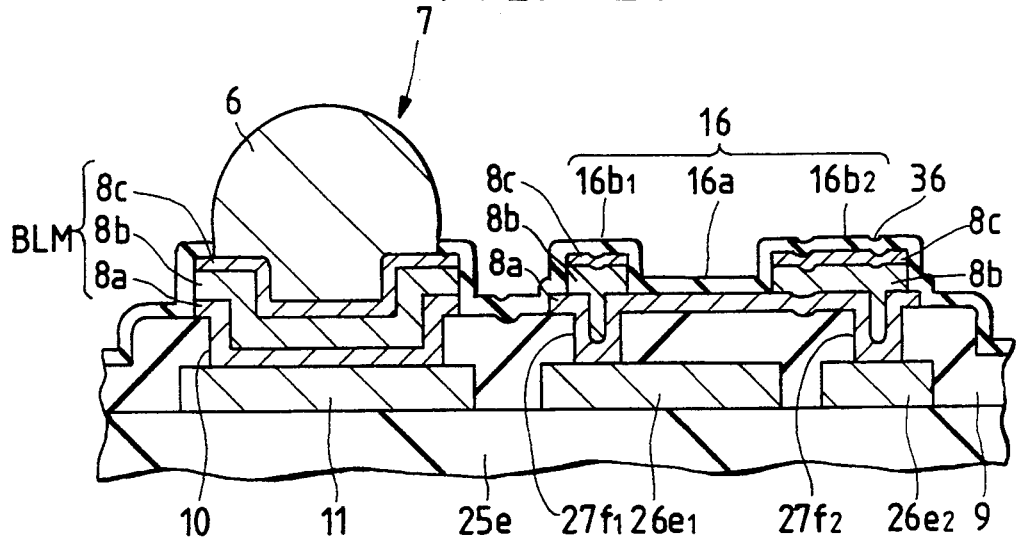
FIG. 27 is a partial sectional view of a semiconductor integrated circuit device practiced as a fifth embodiment of the invention.

In the fifth embodiment, as shown in FIG. 27, the fuse arrangement 16 is protectively covered with a fuse protective film 36 deposited on the surface protective film 9. This construction allows the fifth embodiment to avoid corrosion, oxidation or peeling of the fuse arrangement 16 typically arising from the presence of ions, moisture and other impurities.

The fuse protective film 36 is illustratively composed of $SiO_2$ and is deposited substantially all over the principal plane of the semiconductor chip 7 except for the top of the substrate metal BLM. The thickness of the fuse protective film 36 is set approximately between 50 and 500 nm, variable depending on the film material and on the heat treatment condition following film formation. If the fuse protective film 36 is made too thin, ions, moisture and other impurities may infiltrate therethrough; if the film is too thick, cracks may develop therein during cutting of the target fuse 16, adversely affecting the adjacent fuses 16.

Figure 28:
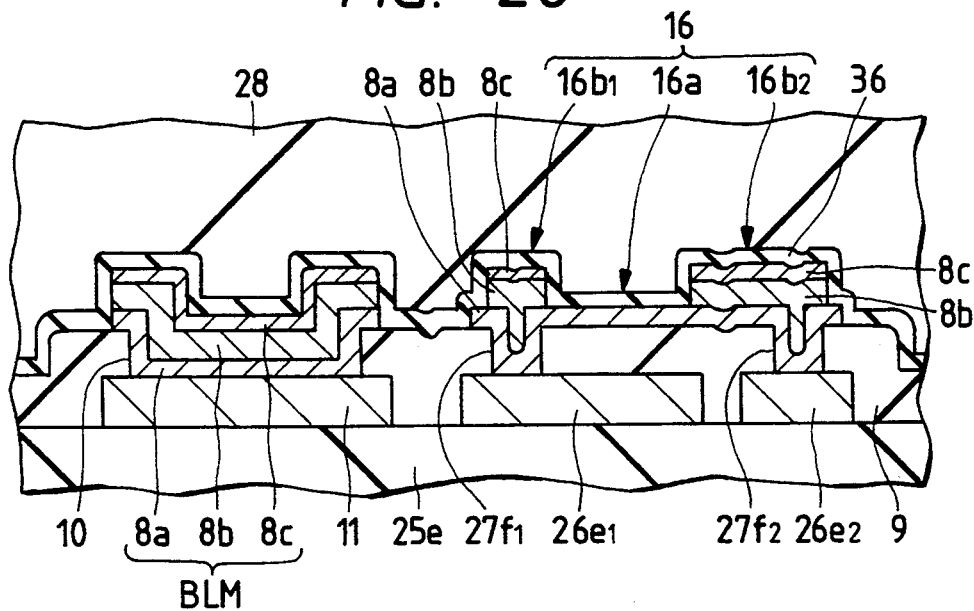
FIG. 28 is a view describing a method for producing the fifth embodiment of FIG. 27.
Figure 29:
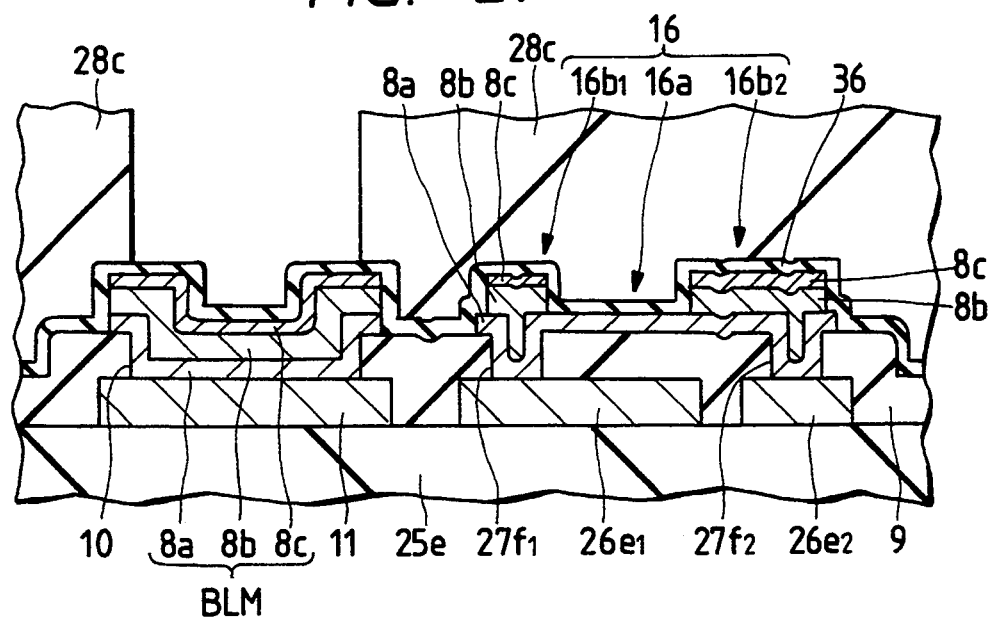
FIG. 29 is another view depicting the method for producing the fifth embodiment of FIG. 27.

The method by which the fifth embodiment is produced will now be discussed with reference to FIGS. 28 through 31. First, as shown in FIG. 28, the fuse protective film 36 is deposited by CVD or like method on the surface protective film 9 so as to cover the fuse arrangement 16 and the substrate metal BLM. Onto the fuse protective film 36 thus deposited, a resist film 28 is formed. These steps precede the separation of the semiconductor chip 7 from the semiconductor wafer, not shown.

The resist film 28 is then patterned by photolithography into a resist pattern 28c on the surface protective film 9. As sketched in FIG. 29, the resist pattern 28c is designed to expose only that part of the fuse protective film 36 which lies on top of the substrate metal BLM.

Thereafter, the resist pattern 28c is used as an etching mask by which to etch and remove the fuse protective film 36 from the top of the substrate metal BLM. This exposes the top of the substrate metal BLM in the manner shown in FIG. 30.

Figure 31:
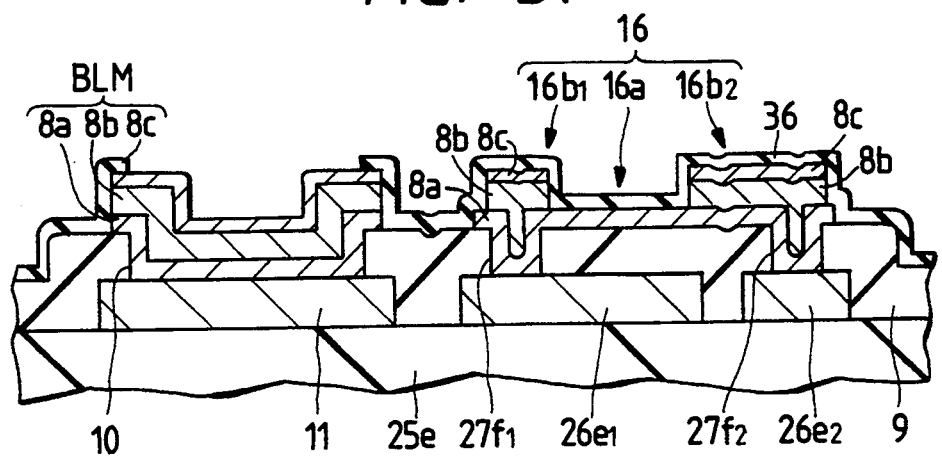
FIG. 31 is another view explaining the method for producing the fifth embodiment of FIG. 27.

Lastly, the resist pattern 28c is removed as depicted in FIG. 31. With the resist pattern 28c removed, the CCB bumps 6 of FIG. 27 are provided on the substrate metal BLM.

Figure 32:
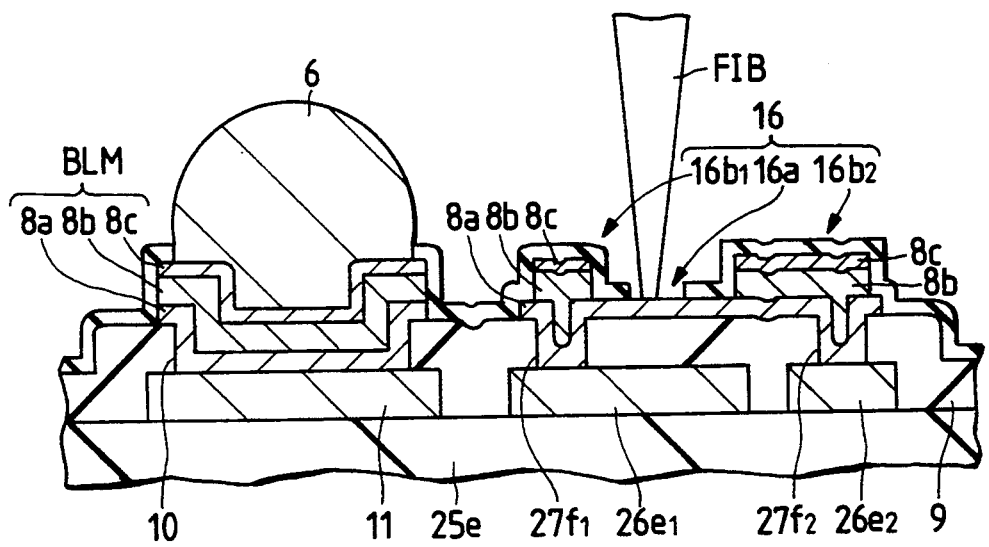
FIG. 32 is a view depicting a method for cutting a fuse in the fifth embodiment of FIG. 27.
Figure 33:
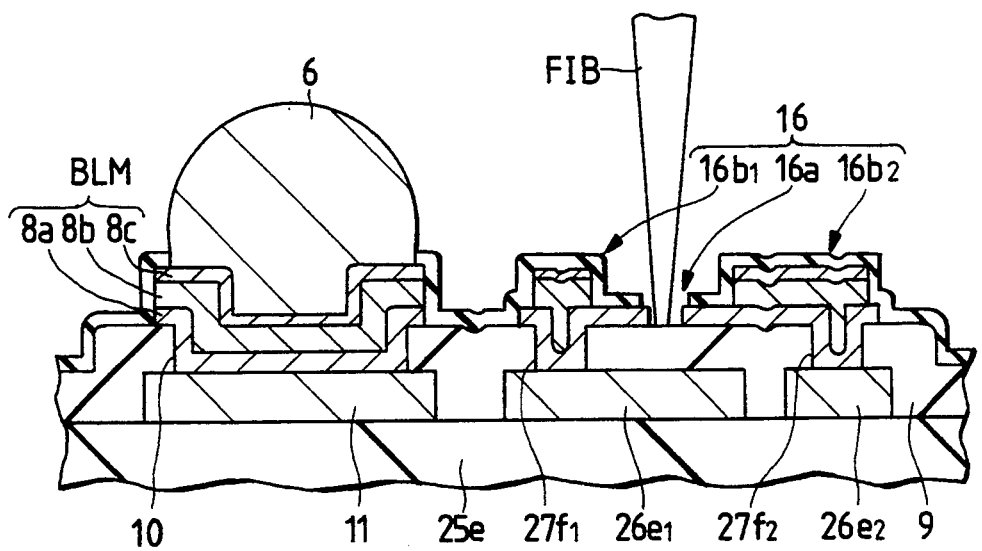
FIG. 33 is another view showing the method for cutting the fuse in the fifth embodiment of FIG. 27.

The process by which the target fuse 16 of the fifth embodiment is cut will now be discussed with reference to FIGS. 32 through 34. In a vacuum chamber, a focused ion beam FIB is illustratively irradiated at a predetermined spot of the fuse protective film 36 to remove that spot, as depicted in FIG. 32. The beam irradiation exposes part of the target fuse 16. This step may be performed either before or after the separation of the semiconductor chip 7 from the semiconductor wafer. Also in the vacuum chamber, the focused ion beam FIB is irradiated at the cutting portion 16a of the target fuse 16, as indicated in FIG. 33. The beam irradiation cuts the fuse 16.

The fuse 16 may be cut not only with the focused ion beam FIB but also with other means as well. For example, a laser beam may be used alternatively to cut the fuse. Where the laser beam is utilized, the beam passes through the fuse protective film 36 and is absorbed by the fuse. When heated by the laser beam, the fuse evaporates and disconnects.

However, the focused ion beam FIB is preferred in cutting the fuse because it offers the following three major advantages over the laser beam. First, the laser beam destroys the fuse protective film 36 by utilizing the impact from expansion and evaporation of the fuse 16. The impact is apt to cause cracks in the fuse protective film 36. By contrast, the focused ion beam FIB removes the fuse protective film 36 by etching using ions, rarely if ever causing cracks in the film. Second, whereas the laser beam having passed through the fuse protective film can cause damage to the elements and/or wires under the fuse arrangement 16, the focused ion beam FIB is unlikely to cause such damage. Third, since the laser beam destroys the fuse protective film 36 by utilizing the impact from expansion and evaporation of the fuse 16, debris from the destruction may turn into impurities later posing threat to the circuit performance. By contrast, the focused ion beam FIB poses no such threat.

Figure 34:
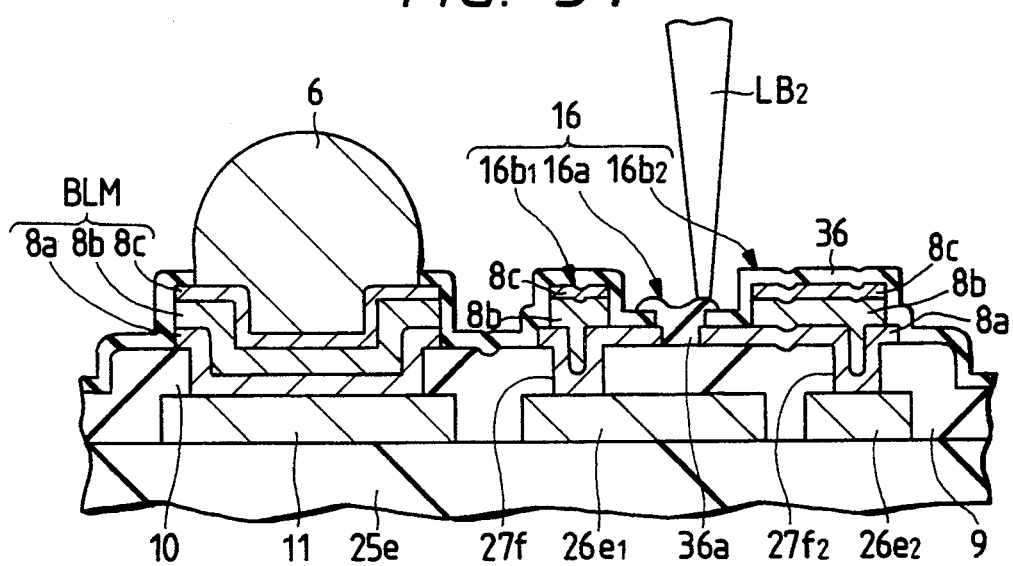
FIG. 34 is another view sketching the method for cutting the fuse in the fifth embodiment of FIG. 27.
Figure 35:
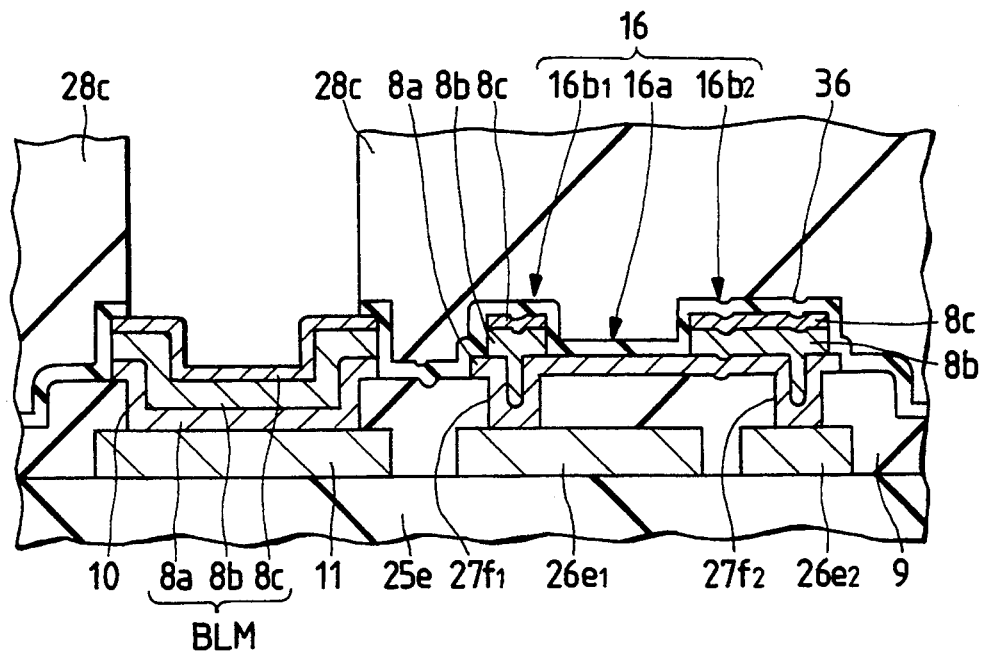
FIG. 35 is a view presenting a method for producing the fifth embodiment of FIG. 27, the method being implemented as a sixth embodiment of the invention.

After the target fuse 16 has been cut, a laser beam (energy beam) $LB_2$ is irradiated at the exposed portion of the fuse 16 for selective CVD in a reactive gas atmosphere, as shown in FIG. 34. The beam irradiation forms a fuse protective film 36a that covers the exposed fuse portion. The fuse protective film 36a is composed illustratively of $SiO_2$. The film prevents intrusion of ions, moisture and other impurities through the exposed portion of the fuse 16. In forming the fuse protective film 36a, the reactive gas may alternatively be applied in a concentrated manner to the film forming region alone by means of a gas nozzle or the like.

The energy beam for creating the fuse protective film 36a is not limited to the laser beam $LB_2$; a focused ion beam or an electron beam may be alternatively used. Another alternative is to pattern the fuse protective film 36a by photolithography, as is conventionally done.

Constructed as described, the fifth embodiment provides the following major advantages:

(1) The fuse protective film 36 covering the fuse arrangement 16 on the surface protective film 9 of the semiconductor chip 7 suppresses corrosion, oxidation or peeling of fuses otherwise caused by the intrusion of ions, moisture or other impurities. With these irregularities eliminated, the variation in fuse resistance value otherwise caused thereby is inhibited. This in turn prevents a redundancy circuit malfunction conventionally attributed to the fuse resistance value variation.

(2) Cutting the target fuse 16 by the focused ion beam FIB prevents cracks from developing in the fuse protective film 36 during fuse cutting. The use of the focused ion beam FIB minimizes collateral damage to the elements and/or wires under the fuse arrangement 16 during fuse cutting. In addition, the fuse cutting operation by focused ion beam inhibits impurities that may develop from other cutting methods.

(3) Because that part of the target fuse 16 which was exposed upon cutting is again covered with the fuse protective film 36a, it is possible to prevent the intrusion of ion, moisture and other impurities through the exposed part. This prevents corrosion, oxidation or peeling of the fuse arrangement 16.

(4) The advantages (1) through (3) above combine to enhance the yield and reliability of the semiconductor integrated circuit device embodying the invention.

Sixth Embodiment

Figure 30:
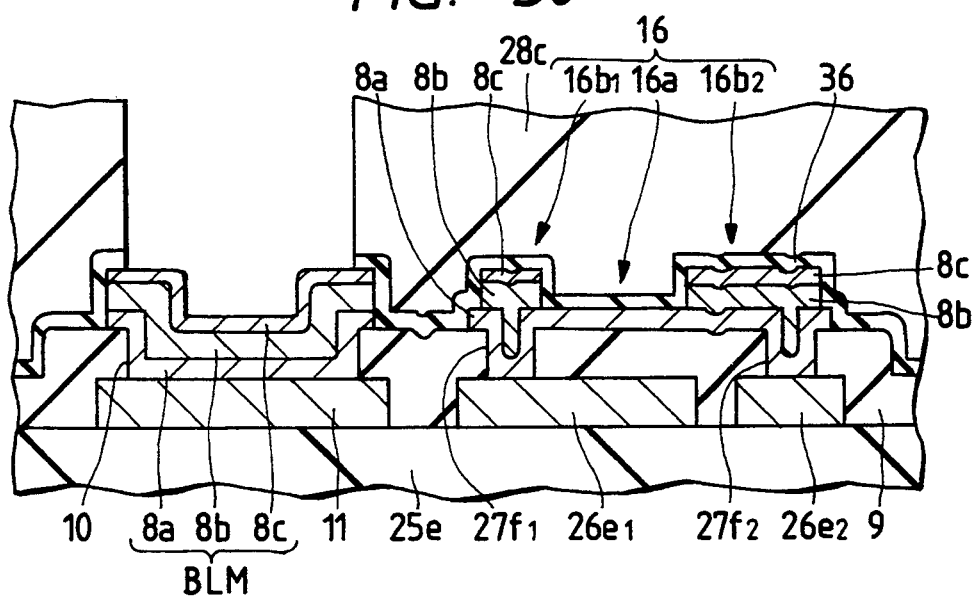
FIG. 30 is another view showing the method for producing the fifth embodiment of FIG. 27.

The sixth embodiment of the invention will now be described with reference to FIGS. 30 and 36. These figures are views presenting the method for producing the fifth embodiment of FIG. 27, the method being implemented as the sixth embodiment of the invention.

As with the fifth embodiment, the resist pattern 28c is formed on the fuse protective film 36 so as to expose that part of the fuse protective film 36 which lies on top of the substrate metal BLM. The resist pattern 28c serves as an etching mask by which to etch and remove that part of the fuse protective film 36 which is on top of the substrate metal BLM. As in the case of the fifth embodiment, these steps precede the separation of the semiconductor chip 7 (FIG. 27) from the semiconductor wafer.

Figure 36:
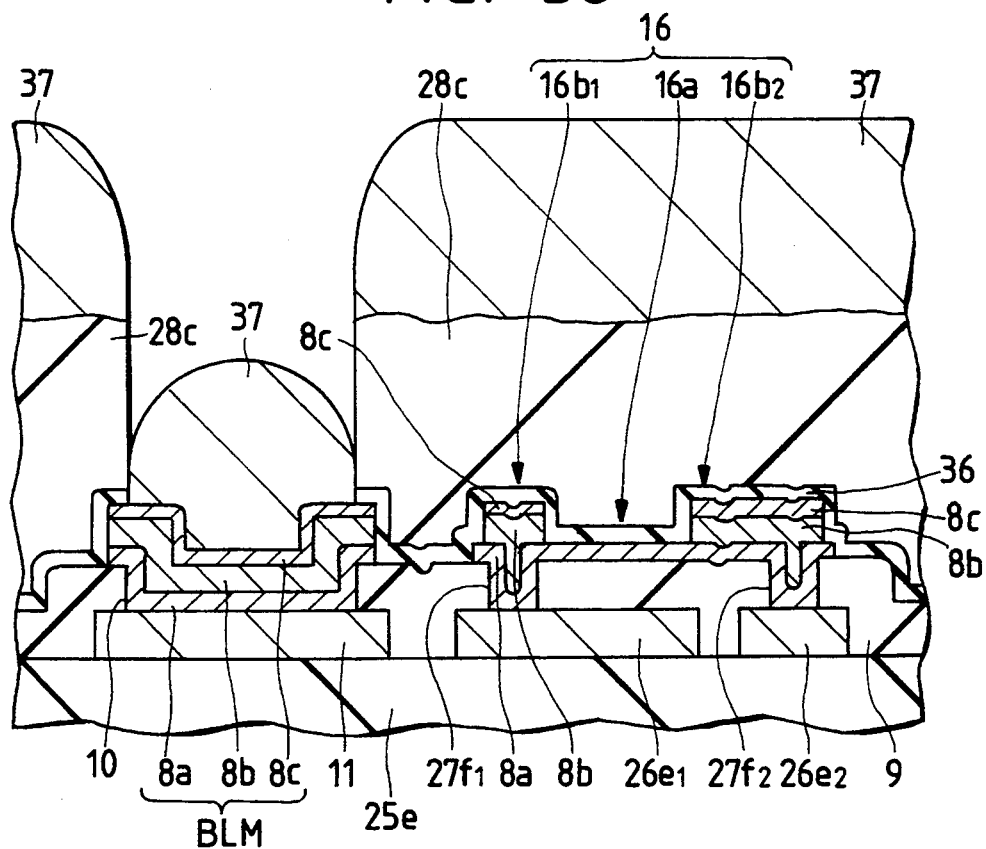
FIG. 36 is another view portraying the method for producing the fifth embodiment of FIG. 27, the method being implemented as the sixth embodiment.

Then with the sixth embodiment, as depicted in FIG. 36, solder (bump forming metal) 37 illustratively made of a Pb/Sn alloy is deposited by evaporation or by other methods onto the semiconductor wafer with the resist pattern 28c left as it is. The solder 37 is intended typically to form CCB bumps 6 (FIG. 27). In other words, the resist pattern 28c used as the etching mask in forming the fuse protective film 36 is also utilized as a deposition mask for CCB bump formation; there is no need to prepare an additional photo mask.

Removing the resist pattern 28c also removes the solder 37 deposited thereon. This leaves the solder 37 only on the substrate metal BLM. After this, heat treatment is carried out to melt the solder 37 on the substrate metal BLM. Surface tension from the melted solder forms the semi-spherical CCB bumps 6 (FIG. 27).

As described, the sixth embodiment offers the following major benefit in addition to the advantages derived from the fifth embodiment. Specifically, because the resist pattern 28c used as the etching mask to form the fuse protective film 36 is utilized as the deposition mask for turning the solder 37 into the CCB bumps, the semiconductor integrated circuit device having the fuse protective film 36 is produced without having to devise new photo masks and without any appreciable increase in the number of production steps. Therefore, the sixth embodiment affords a highly reliable semiconductor integrated circuit device without substantial increase in production cost or in production time.

Seventh Embodiment

The seventh embodiment of the invention will now be described with reference to FIGS. 37 through 39.

Figure 37:
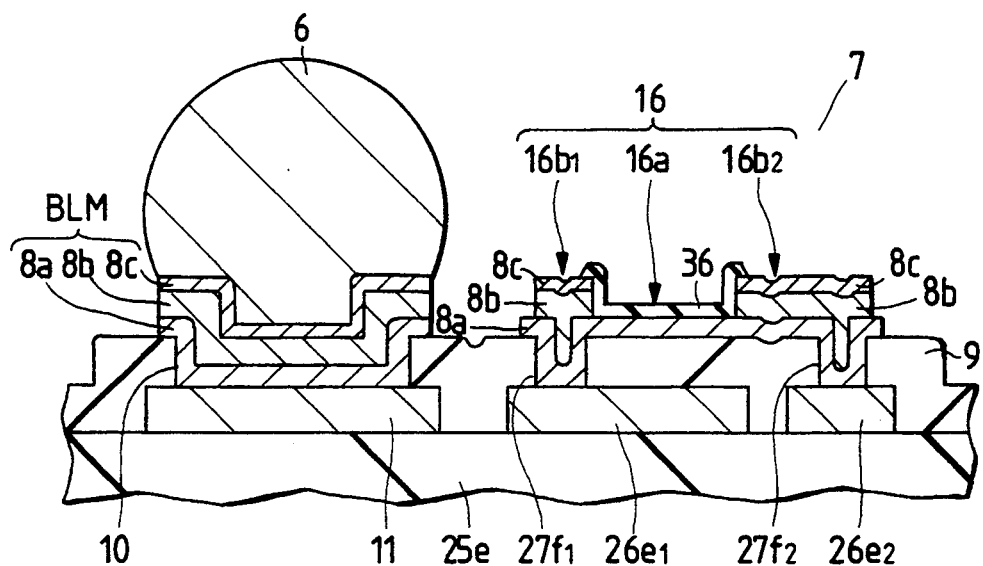
FIG. 37 is a partial sectional view of a semiconductor integrated circuit device practiced as a seventh embodiment of the invention.
Figure 38:
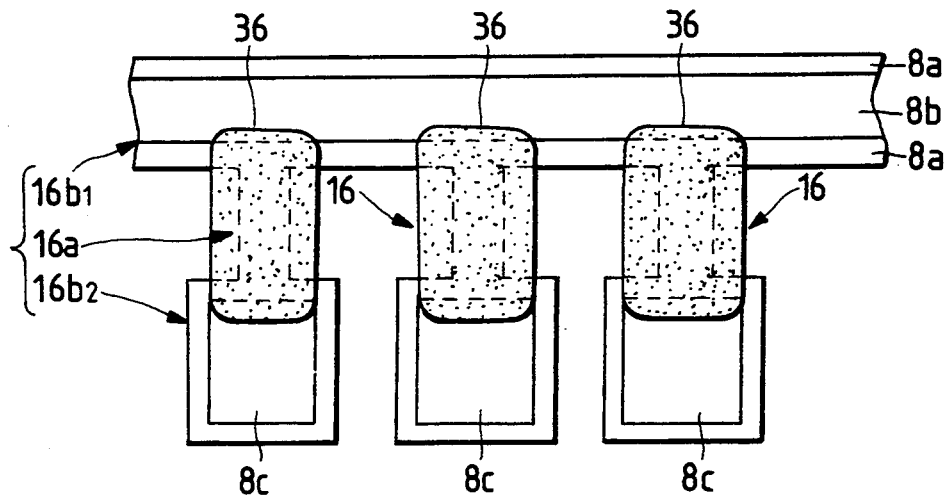
FIG. 38 is a partial plan view of the seventh embodiment of FIG. 37.
Figure 39:
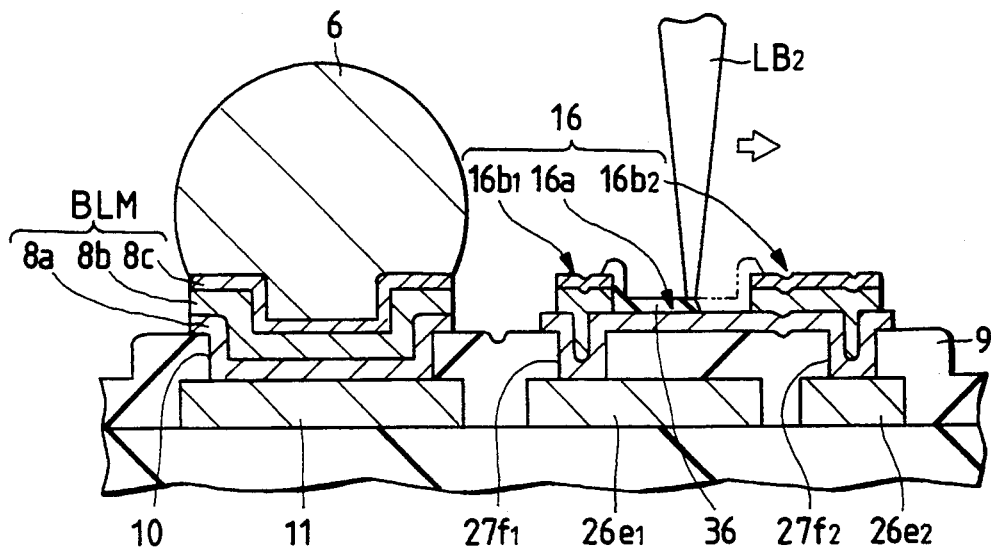
FIG. 39 is a view showing a method for producing the seventh embodiment of FIG. 37.

As illustrated in FIGS. 37 and 38, the seventh embodiment has its fuse protective film 36 formed only over the cutting portions of the fuse arrangement 16. The cutting portions are located within the metal layer 8c of the noncutting portions 16b1 and 16b2 constituting part of the fuse arrangement 16, the cutting portions being wide enough to cover the surfaces of the metal layer 16a between the noncutting portions 16b1 and 16b2.

The fuse protective film 36 is formed in such a manner as to slightly overhang the noncutting portions 16b1 and 16b2 of the fuse arrangement 16. Because the noncutting portions 16b1 and 16b2 have a top metal layer (the metal layer 8c illustratively made of gold) that offers a fuse protective function, having the fuse protective film 36 slightly overhang the metal layer 8c of the noncutting portions 16b1 and 16b2 provides excellent protection for the target fuse 16.

With the seventh embodiment, as shown in FIG. 38, the fuse protective film 36 is divided into a plurality of parts protecting the individual fuses 16. If cracks occur upon fuse cutting in the fuse protective film 36 covering the target fuse 16, this construction prevents such cracks from spreading to the film 36 covering the other fuses 16.

The fuse protective film 36 is prepared as follows: In a suitable reactive gas atmosphere, a laser beam $LB_2$ or the like is irradiated only at the cutting portion of the target fuse 16 for selective CVD, as depicted in FIG. 39. The beam irradiation forms the fuse protective film 36. As in the case of the fifth embodiment, reactive gas may alternatively be applied in a concentrated manner to the film forming region alone when the fuse protective film 36 is to be formed.

The energy beam for creating the fuse protective film 36 is not limited to the laser beam $LB_2$ alone; other beams such as a focused ion beam or an electron beam may be used instead. Another alternative is to pattern the fuse protective film 36 by photolithography, as is conventionally done.

As described, the seventh embodiment offers the following two major benefits in addition to the advantages derived from the fifth embodiment:

(1) Because the fuse protective film 36 is divided into multiple parts protecting the individual fuses 16, cracks that may occur in one patch of the film 36 from cutting the corresponding fuse 16 are prevented from spreading to the other protective film patches covering the rest of the fuses 16. With the remaining fuses 16 thus protected from deterioration in their reliability as a result of such cracks, the yield and reliability of the semiconductor integrated circuit device of this structure are enhanced.

(2) The selective film forming method based on laser CVD creates the fuse protective film 36 without having to add more photo masks or without any appreciable increase in the number of production steps. Thus the semiconductor integrated circuit device of high reliability is produced without any significant increase in production cost or in production time.

Eighth Embodiment

Figure 41:
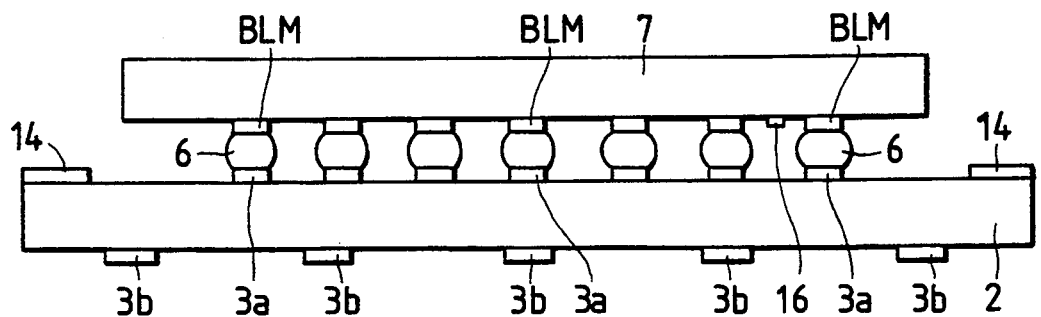
FIG. 41 is a view describing a method for producing the eighth embodiment of FIG. 40.
Figure 42:
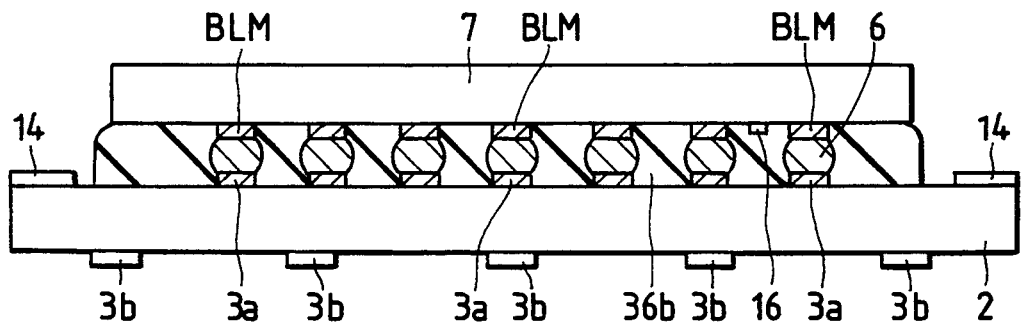
FIG. 42 is another view depicting the method for producing the eighth embodiment of FIG. 40.

The eighth embodiment of the invention will now be described with reference to FIGS. 40 through 42.

Figure 40:
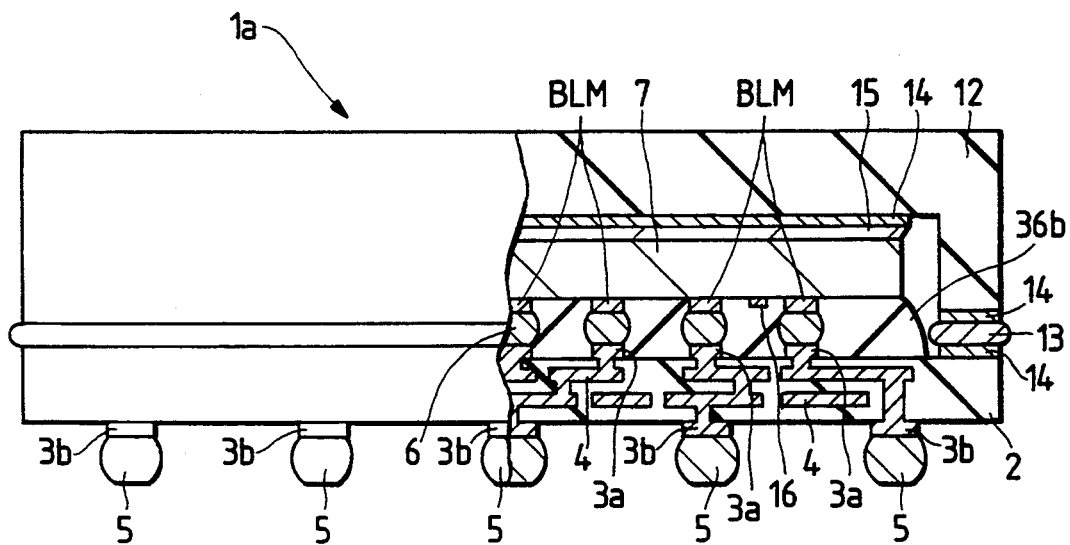
FIG. 40 is a partial sectional view of a semiconductor integrated circuit device practiced as an eighth embodiment of the invention.

As shown in FIG. 40, the eighth embodiment has a fuse protective film 36b packed between the package substrate 2 and the semiconductor chip 7 within a package made of the package substrate 2 and cap 12 of the chip carrier 1a. The fuse protective film 36b is typically composed of poly-para-xylene or of polyimide. As in the case of the fifth embodiment, this protective film structure prevents corrosion, oxidation or peeling of the fuse arrangement 16 otherwise caused by the presence of ions, moisture and other impurities.

It should be noted that the fuse protective film 36b need not be fully packed within the package or between the package substrate 2 and the semiconductor chip 7. Specifically, the film 36b need only be provided in such an amount that covers at least the fuse arrangement 16.

The chip carrier 1a of the above construction is produced as follows. First, the semiconductor chip 7 is mounted on the package substrate 2 with the CCB bumps 6 provided therebetween, as shown in FIG. 41. Then the fuse protective film 36b illustratively made of poly-paraxylene or of polyimide is packed between the semiconductor chip 7 and the package substrate 2, as depicted in FIG. 42.

With the fuse protective film 36b packed, the bonding metal layer 14 of the package substrate 2 is soldered to the bonding metal layer 14 of the cap 12 (FIG. 40). At the same time, the back of the semiconductor chip 7 is soldered to the bonding metal layer 14 on the inner wall of the cap 12. This forms the chip carrier 1a shown in FIG. 1.

As described, the eighth embodiment has the fuse protective film 36b packed illustratively between the package substrate 2 and the semiconductor chip 7. This construction prevents corrosion, oxidation or peeling of the fuse arrangement 16 otherwise caused by the presence of ions, moisture and other impurities. With such irregularities suppressed, the fuse resistance value of the fuse arrangement 16 is protected against variation otherwise attributed thereto. Little variation in the fuse resistance value minimizes the incidence of redundancy circuit malfunction. Thus the yield and reliability of the semiconductor integrated circuit device practiced as the eighth embodiment are boosted.

Although the description above contains many specificities, these should not be construed as limiting the scope of the invention but as merely providing illustrations of the presently preferred first through eighth embodiments of this invention. Many other different embodiments of the invention may be made without departing from the spirit and scope thereof.

For example, although the first embodiment has its CCB bump substrate metal made of the Cr/Cu/Au alloy, any other substrate metal may be used as long as it is composed of three stacked metal layers, one for bonding to the substrate, another for preventing the diffusion of atoms in the metal layer structure, and the other for preventing surface oxidation and other metal deterioration. One such substrate metal may be made of a Ti/Ni/Au stacked film structure; another, of a Ti/Pt (platinum)/Au stacked film structure.

Figure 43:
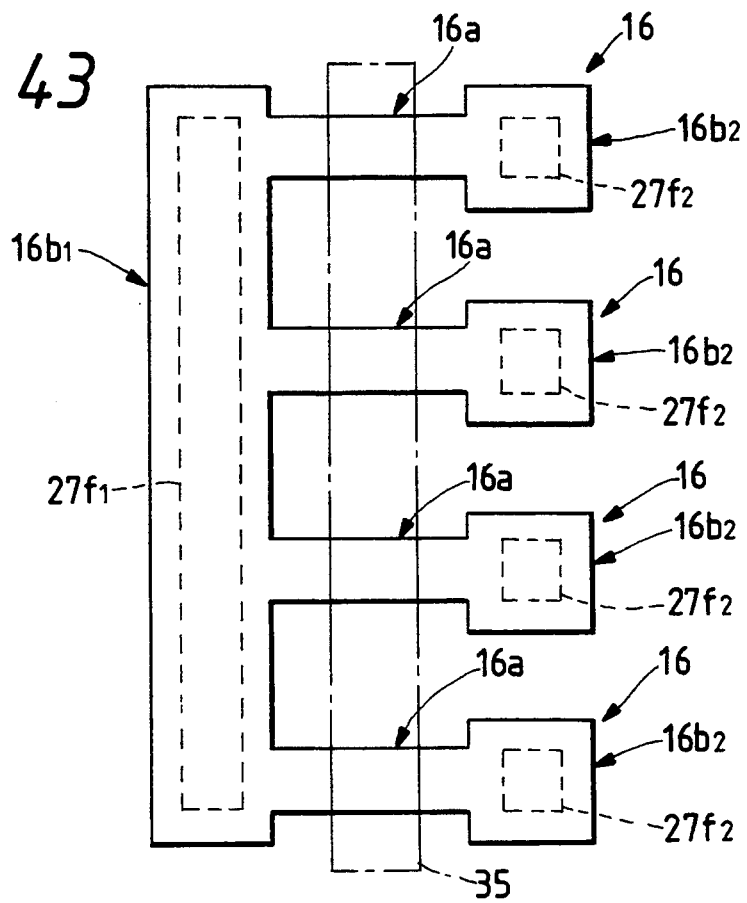
FIG. 43 is an overall enlarged plan view of a fuse arrangement constituting part of a redundancy circuit in a semiconductor integrated circuit device practiced as a variation of the first embodiment.
Figure 44:
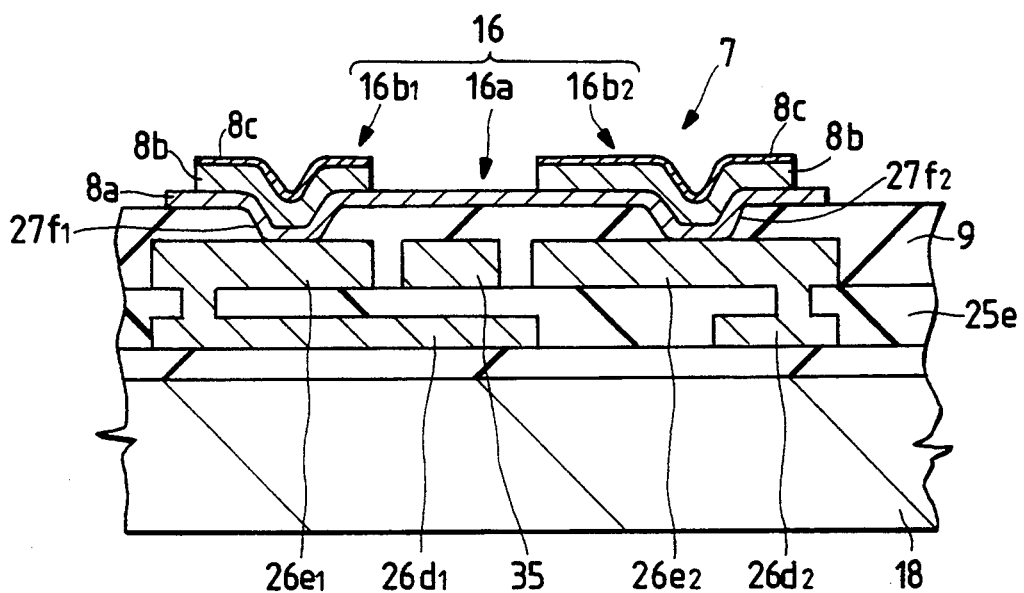
FIG. 44 is a partial sectional view of the fuse arrangement of FIG. 43.

The first embodiment has an integral construction combining the laser shielding body with the wiring under the fuse arrangement. An alternative to this construction is the separation of the laser shielding body 35 from the fifth wiring layer 26e1, as shown in FIGS. 43 and 44.

Figure 45:
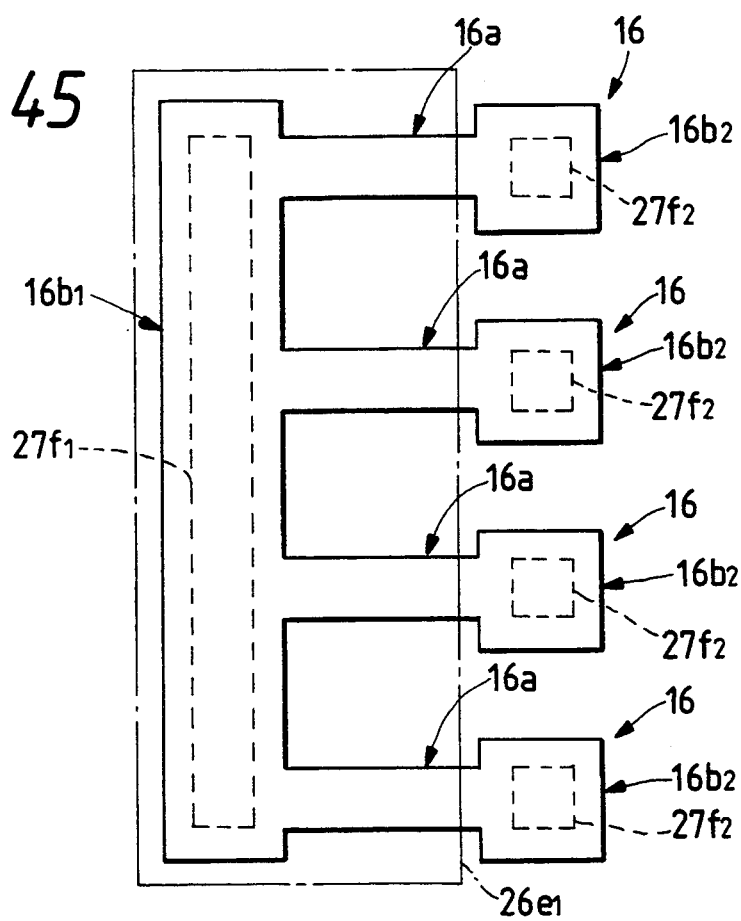
FIG. 45 is an overall enlarged plan view of a fuse arrangement constituting part of a redundancy circuit in a semiconductor integrated circuit device practiced as another variation of the first embodiment.
Figure 46:
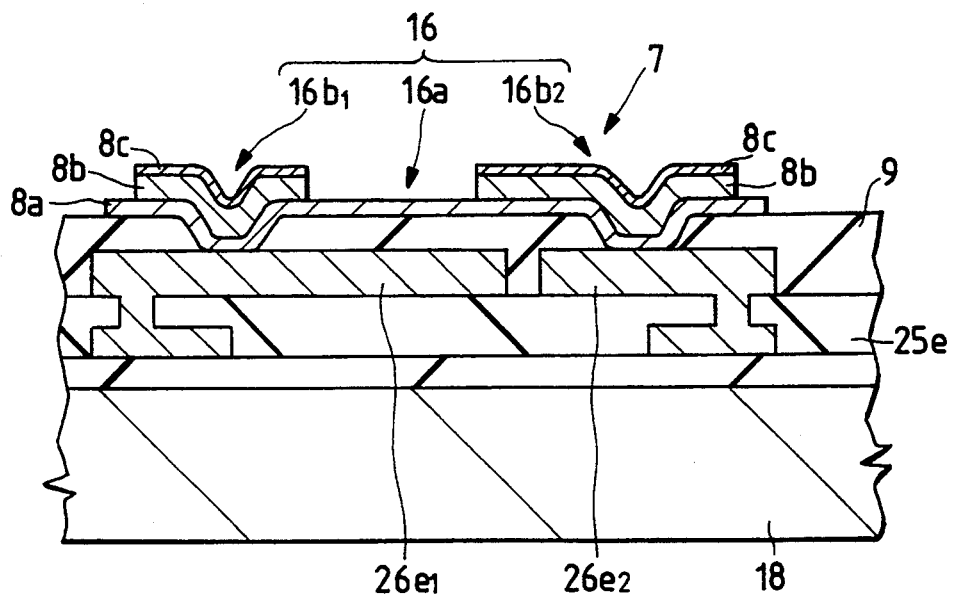
FIG. 46 is a partial sectional view of the fuse arrangement of FIG. 45.
Figure 47:
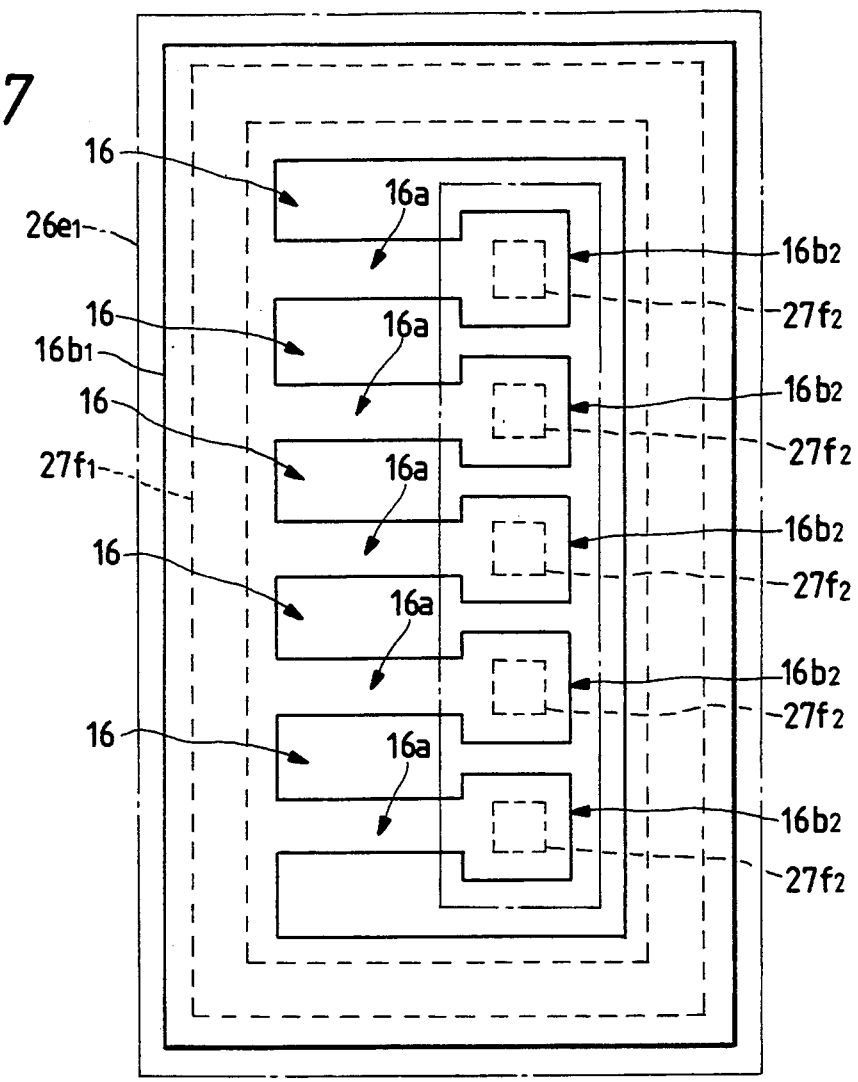
FIG. 47 is an overall enlarged plan view of a fuse arrangement constituting part of a redundancy circuit in a semiconductor integrated circuit device practiced as another variation of the first embodiment.
Figure 48:
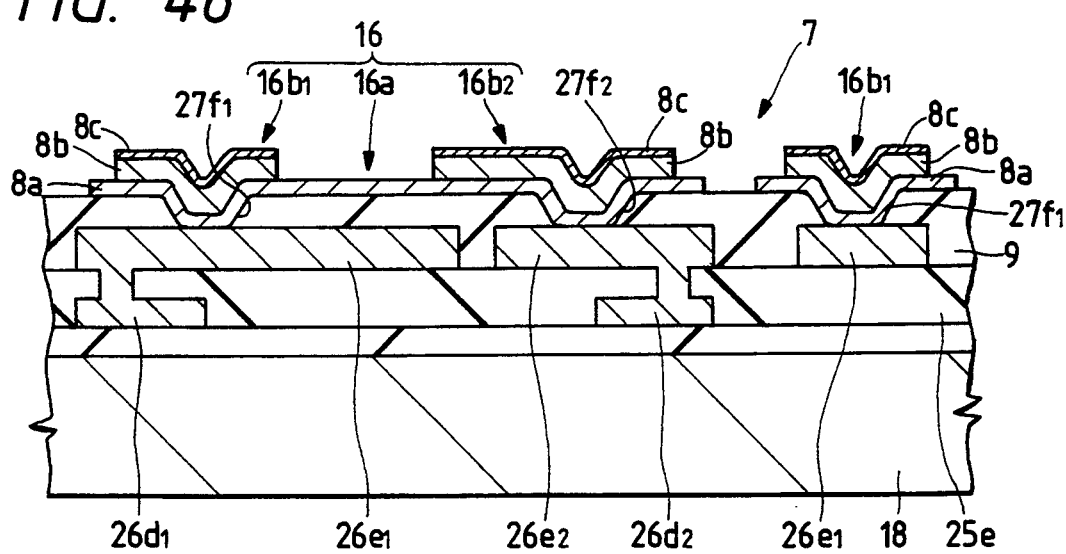
FIG. 48 is a partial sectional view of the fuse arrangement of FIG. 47.

In the first embodiment, part of the noncutting portions of the fuse arrangement 16 are extended to surround part of the latter. Alternatively, as depicted in FIG. 45 and 46, the noncutting portion 16b1 on the one side is continuously connected to let the through hole 27f1 extend alongside thereof. Another alternative is to let the noncutting portion 16b1 of the fuse arrangement 16 extend completely to surround the periphery of the fuse arrangement 16, as shown in FIGS. 47 and 48. This modification provides a better guard ring effect than the first embodiment.

The first embodiment utilizes part of the third through the fifth wiring layers as the laser shielding body. Alternatively, either part of the fourth and the fifth wiring layers, or part of the fifth wiring layer alone may be employed as the laser shielding body. In this case, the wiring layers below the laser shielding body may be used for wiring channels as desired.

The second embodiment has its TAB bump substrate metal made of the Ni/Au alloy. Alternatively, any other substrate metal may be used as long as it is composed of three stacked metal layers, one for bonding to the substrate, another for preventing the diffusion of atoms in the metal layer structure, and the other for preventing surface oxidation and other metal deterioration. One such substrate metal may be made of a Cr/Cu/Au stacked film structure; another, of a Ti/Pt/Au stacked film structure.

Figure 49:
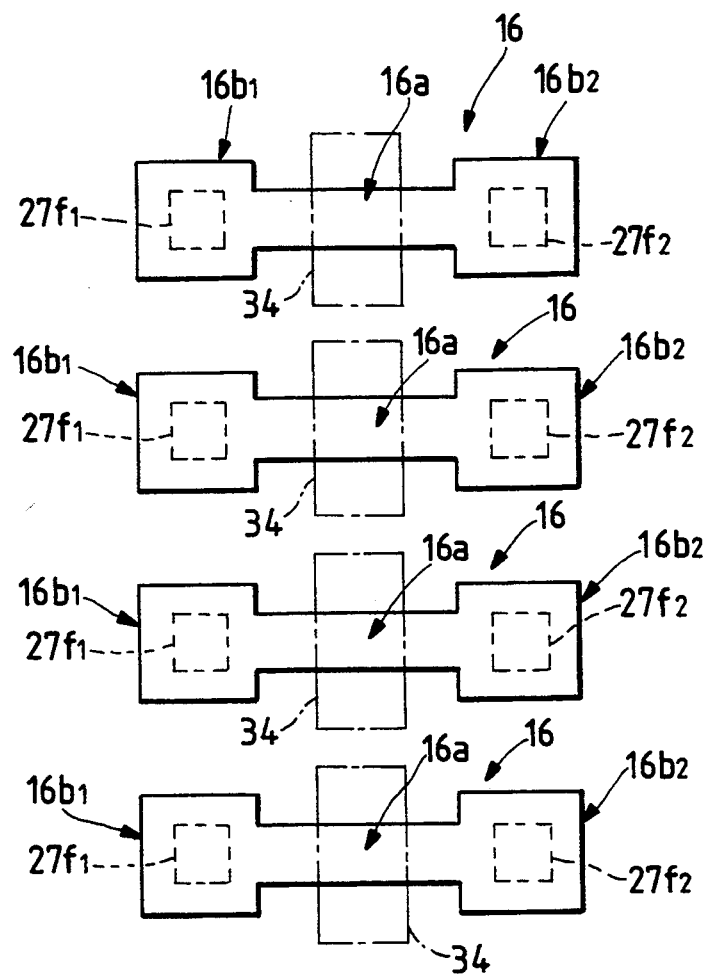
FIG. 49 is an overall enlarged plan view of a fuse arrangement constituting part of a redundancy circuit in a semiconductor integrated circuit device practiced as a variation of the second embodiment.
Figure 50:
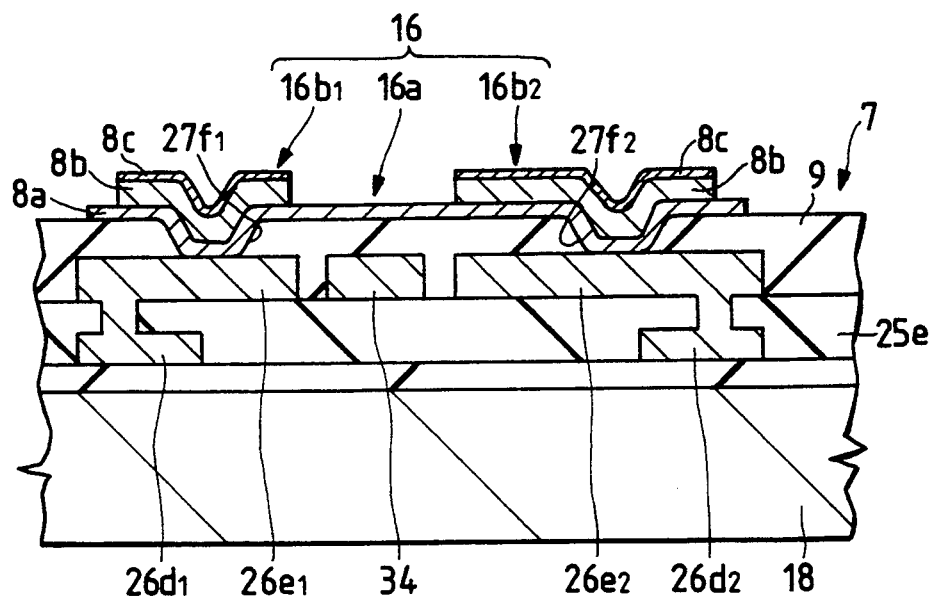
FIG. 50 is a partial sectional view of the fuse arrangement of FIG. 49.

The second embodiment has no laser shielding body. An alternative to this construction is to provide a laser shielding body 34 under the cutting portion 16a of the fuse arrangement 16, as shown in FIGS. 49 and 50.

With the first and the second embodiments, a laser beam is used to cut fuses. Alternatively, any other suitable energy beam such as an ion beam may be utilized to cut the target fuse.

In the first through the fourth embodiments, the top insulation film serves as the surface protective film. Alternatively, the highest of the wiring layers which is used as an interlayer insular ion film may double as the surface protective film.

Figure 51:
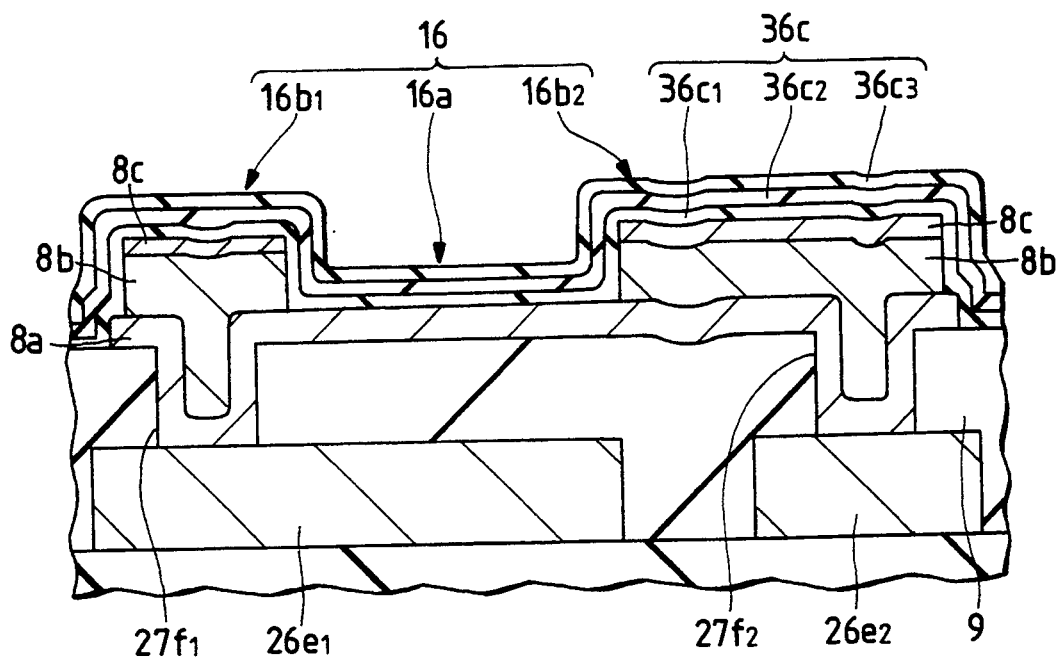
FIG. 51 is a partial sectional view of a semiconductor integrated circuit device practiced as a variation of any one of the fifth through the seventh embodiments.

In the fifth through the seventh embodiments, the fuse protective film is composed of $SiO_2$. Alternatively, the fuse protective film may be made of an $Si_3N_4$ film, PSG (phospho-silicate glass) film or a combination of such films. FIG. 51 is a partial sectional view of a semiconductor integrated circuit device practiced as a variation of any one of the fifth through the seventh embodiments. In this variation is the fuse protective film 36c that has a stacked layer structure comprising three films. The bottom insulation film 36c1 constituting part of the fuse protective film 36c is illustratively composed of $SiO_2$ and is designed to prevent cracks from developing in the film 36c as a result of the stress from the fuse 16 being cut. The middle insulation film 36c2 is typically made of $Si_3N_4$ and is intended to keep out the intrusion of ions, moisture and other impurities. The top insulation film 36c3 is illustratively composed of $SiO_2$.

Ninth Embodiment

The ninth embodiment off the invention will now be described with reference to FIGS. 52 through 66. This embodiment is actually a collection of variations of the redundancy circuit technology applied to the first through the eighth embodiments discussed above.

Figure 52:
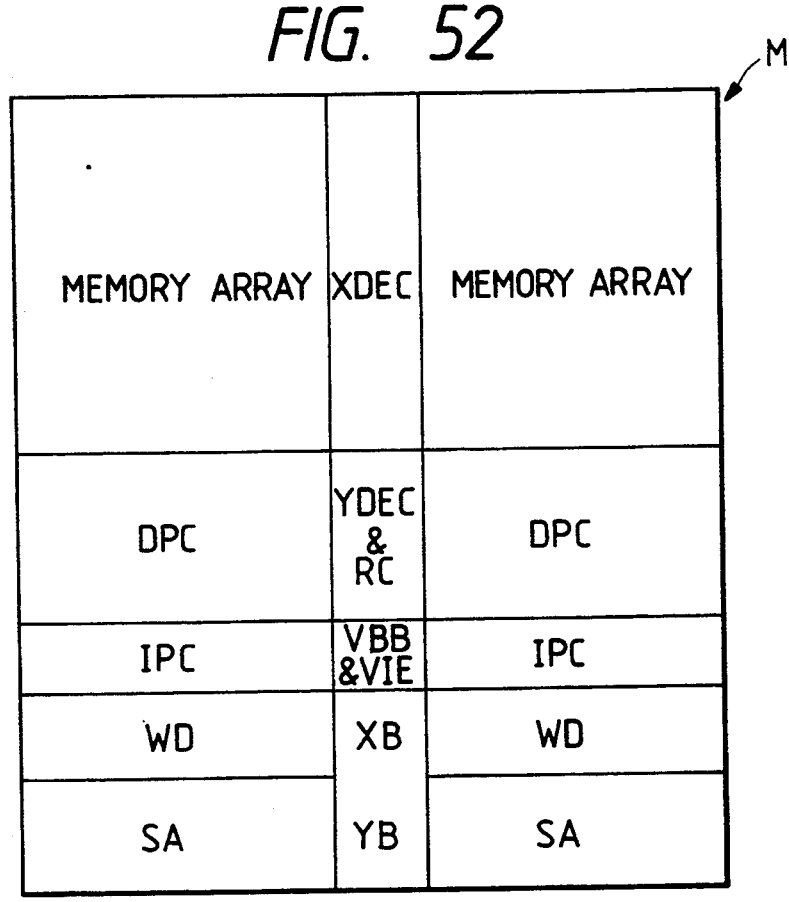
FIG. 52 is an overall layout view of a static RAM incorporated in a semiconductor integrated circuit device practiced as a ninth embodiment of the invention.
Figure 53A:
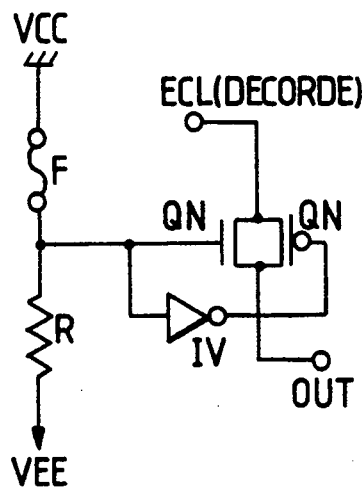
FIG. 53 is a set of circuit diagrams of switch circuits that may be included in the ninth embodiment, each of the switch circuits acting to replace a defective circuit with a redundancy backup circuit upon receipt of a redundancy signal generated in accordance with the connecting/cutting status of the fuse arrangement.
Figure 53C:
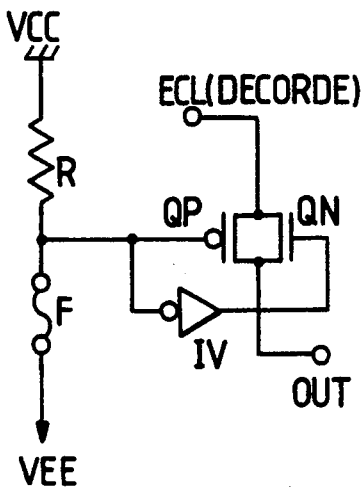
Figure 53B:
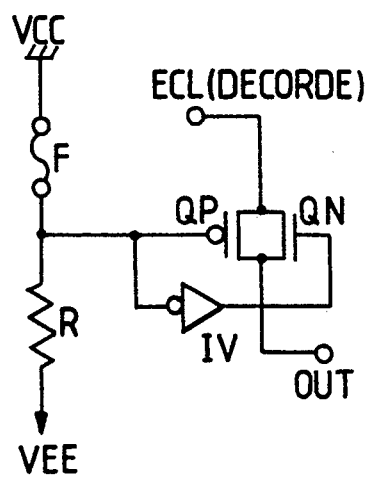
Figure 53D:
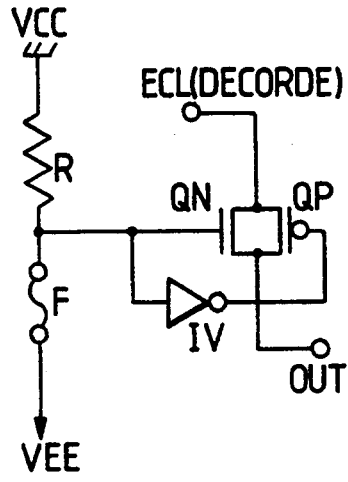

FIG. 52 is an overall layout view of a static RAM M incorporated in a semiconductor integrated circuit device practiced as the ninth embodiment. The static RAM M corresponds to the memory circuit block M in the first embodiment. The upper half of the static RAM M comprises an X decoder XDEC containing the same type of driver as that in a Y decoder YDEC, to be described later.

The X decoder XDEC are flanked on both sides by two memory arrays (memory mats). Below the memory arrays are direct peripheral circuits DPC such as bias circuits and column switches. Below the direct peripheral circuits DPC are internal power circuits IPC that generate memory cell operating voltages. Write drivers WD and sense amplifiers SA are provided below the internal power circuits IPC.

In the middle of the static RAM M are constant voltage generation circuits such as VBB and VIE providing a reference voltage and a constant current source. Under the VBB and VIE are address buffers XB and YB. The Y decoder YDEC and a redundancy circuit RC are located between the right- and left-hand side direct peripheral circuits DPC. The redundancy circuit RC comprises a fuse circuit, a transmission gate and a redundancy Y driver.

FIG. 53 is a set of circuit diagrams of switch circuits that may be included in the ninth embodiment, each of the switch circuits acting to replace a defective circuit with a redundancy backup circuit upon receipt of a redundancy signal generated in accordance with the connecting/disconnecting status of the fuse arrangement. These switch circuits each include the combination of an ECL (emitter coupled logic) circuit with CMOS (complementary metal oxide semiconductor) circuit forming part of the static RAM. The circuit elements of the switch circuits, like those making up the first through the eighth embodiments, are mounted on the semiconductor chip 7. In other words, the fuse elements of the ninth embodiment are the same in construction as those of the first through the eighth embodiments.

FIGS. 53 (A) through 53 (D) indicate four switch circuits that generate four redundancy signals while providing switching control. The circuit of FIG. 53 (A) has a fuse 16 (F) on the side of the circuit ground potential VCC (0 V) and a high resistance R on the side of the negative supply voltage VEE(−4 V). The high resistance R is designed to have a sufficiently high resistance value compared with the value in effect when the fuse 16 (F) is connected. Stated differently, the "high resistance" refers to a high resistance value relative to the resistance value of the fuse. In this setup, with the fuse 16 (F) left uncut, a high-level redundancy signal such as the circuit ground potential VCC is generated; with the fuse 16 (F) cut off, a low-level redundancy signal such as the supply voltage VEE is generated.

The redundancy signal thus generated is supplied to the gate of an N-channel type MOSFET QN. The redundancy signal is also fed through an inverter circuit IV to the gate of a P-channel type MOSFET QP. The N- and P-channel type MOSFET's QN and QP are connected in parallel and act as a CMOS transmission gate that transmits an input signal ECL selectively to an output terminal OUT. When the redundancy signal is brought High, both transistors QN and QP of the transmission gate are turned on, thus transmitting the input signal ECL to the output terminal OUT. When the redundancy signal is brought Low, the two transistors QN and QP are turned off to inhibit the transmission of the input signal ECL to the output terminal OUT.

In the circuit of FIG. 53 (B), as with that of FIG. 53 (A), a fuse 16 (F) is provided on the side of the circuit ground potential VCC and a high resistance R on the side of the negative supply voltage VEE. In this setup, leaving the fuse 16 (F) uncut allows a high-level redundancy signal such as the circuit ground potential VCC to develop; cutting the fuse 16 (F) causes a low-level redundancy signal such as the supply voltage VEE to be generated.

Contrary to the signal handled in the circuit of FIG. 53 (A), the above redundancy signal is supplied to the gate of a P-channel type MOSFET QP and is fed through an inverter circuit IV to the gate of an N-channel type MOSFET QN. In contrast to the workings of the circuit of FIG. 53 (A), bringing the redundancy signal Low turns on the two transistors QN and QP and transmits the input signal ECL to the output terminal OUT; bringing the redundancy signal High turns off both signals QN and QP and inhibits the transmission of the input signal ECL to the output terminal OUT.

Unlike the circuits of FIGS. 53 (A) and 53 (B), the circuit of FIG. 53 (C) has a fuse 16 (F) located on the side of the supply voltage VEE and a high resistance R on the side of the circuit ground potential VCC. In this setup, as opposed to the workings of the circuits of FIGS. 53 (A) and 53 (B), keeping the fuse 16 (F) uncut generates a low-level redundancy signal such as the supply voltage VEE, and cutting the fuse 16 (F) develops a low-level redundancy signal such as; the circuit ground potential VCC.

The above redundancy signal is supplied to the gate of a P-channel type MOSFET QP and fed through an inverter IV to the gate of an N-channel type MOSFET QN. This redundancy signal routing is the reverse of that in the circuit of FIG. 53 (A). In this transmission gate, as with the circuit of FIG. 53 (B), bringing the redundancy signal Low turns on the two transistors QN and QP to transmit the input signal ECL to the output terminal OUT; bringing the redundancy signal High turns off both signals QN and QP and inhibits tile transmission of the input signal ECL to the output terminal OUT.

The circuit of FIG. 53 (D), contrary to that of FIG. 53 (A) or 53 (B), has a fuse 16 (F) on the side of the supply voltage VEE and a high resistance R on the side of the circuit ground potential VCC. In this setup, as opposed to the workings of the circuits of FIGS. 53 (A) and 53 (B), keeping the fuse 16 (F) uncut generates a low-level redundancy signal such as the supply voltage VEE, and cutting the fuse 16 (F) creates a low-level redundancy signal such as the circuit ground potential VCC.

The above redundancy signal is supplied to the gate of an N-channel MOSFET QN and is fed via an inverter circuit IV to the gate of a P-channel MOSFET QP, as in the circuit of FIG. 53 (A). In this transmission gate, as with the circuit of FIG. 53 (A), bringing the redundancy circuit High turns on the two transistors QN and QP for transmission of the input signal ECL to the output terminal OUT; bringing the redundancy signal Low turns off both transistors QN and QP and inhibits the transmission of the input signal ECL to the output terminal OUT.

A truth table attached to FIGS. 53 (A) through 53 (D) summarizes the connecting/disconnecting status of the fuse 16 (F) with respect to the transmission gate workings. As indicated in the table, keeping the fuse connected opens the transmission gates of FIGS. 53 (A) and 53 (C) and closes those of FIGS. 53 (B) and 53 (D). In contrast, having the fuse cut reverses the gate operating status, i.e., the transmission gates of FIGS. 53 (A) and 53 (C) are both closed while those of FIGS. 53 (B) and 53 (D) are opened.

Figure 54A:
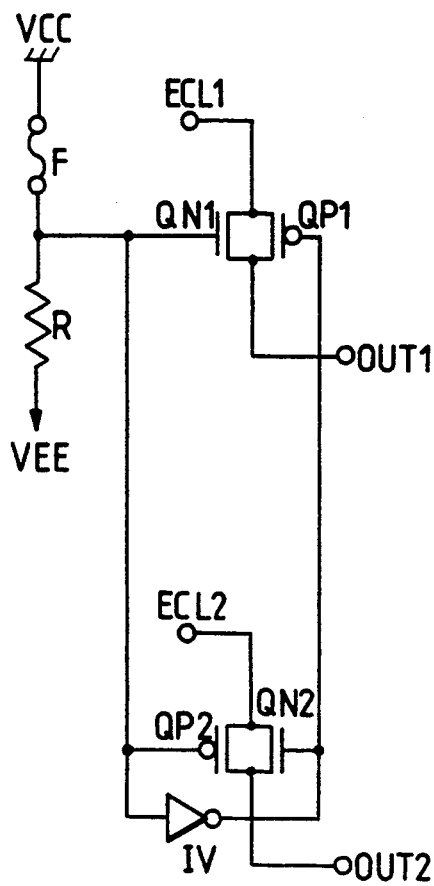
FIG. 54 is a set of basic circuit diagrams of redundancy circuits each combining the fuse arrangement of FIG. 53 with a transmission gate.
Figure 54B:
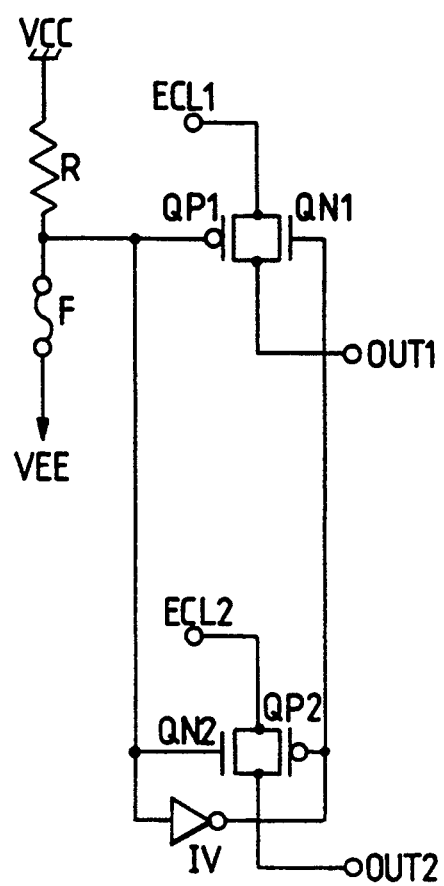
Figure 55:
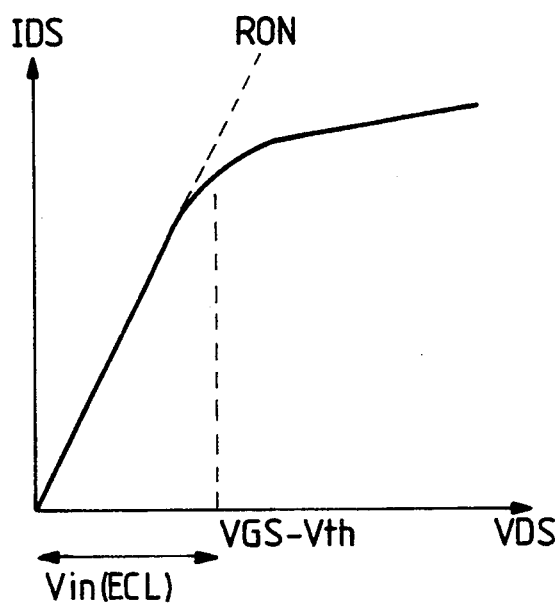
FIG. 55 is a view depicting the current versus voltage characteristic of a switch MOSFET in connection with the ninth embodiment.

FIG. 54 is a set of basic circuit diagrams of redundancy circuits each combining a fuse arrangement with a transmission gate, as described above with reference to FIGS. 53 (A) through 53 (D). The circuit of FIG. 54 (A) has a fuse F located on the ground potential side for generating a redundancy signal. The redundancy signal, when generated, is supplied to the gate of an N-channel type MOSFET QN1 constituting part of a first transmission gate, as well as to the gate of a P-channel type MOSFET QP2 constituting part of a second transmission gate. The redundancy signal is also fed via an inverter IV to the gate of a P-channel MOSFET QP1 constituting part of the first transmission gate, and to the gate of an N-channel MOSFET QN2 constituting part of the second transmission gate.

Keeping the fuse F connected brings the redundancy signal High and thereby turns on the transistors QN1 and QP1 constituting the first transmission gate. This in turn transmits an input signal ECL1 to an output terminal OUT1. At this point, the High redundancy signal turns off the transistors QP2 and QN2 constituting the second transmission gate, which prevents an input signal ECL2 from getting transmitted to an output terminal OUT2. Conversely, cutting the fuse F brings the redundancy signal Low and thereby turns off the transistors QN1 and QP1 constituting the first transmission gate. This suppresses the transmission of the input signal ECL1 to the output terminal OUT1. At this point, the Low redundancy signal turns on the transistors QP2 and QN2 constituting the second transmission gate, which allows the input terminal ECL2 to be transmitted to the output terminal OUT2.

In an illustrative application, the input signals ECL1 and ECL2 are each used as a decode signal with which to select particular data lines. In this application, the output terminal OUT1 is connected to a data line selection circuit of a true circuit, and the output terminal OUT2 to a data line selection circuit of a redundancy circuit. When the fuse F remains connected, the corresponding data lines of the true circuit are selected; when the fuse F is cut, the data lines of the redundancy circuit are selected in place of the true circuit.

The circuit of FIG. 54 (B), as opposed to that of FIG. 54 (A), has a fuse F located on the side of the supply voltage VEE for generating a redundancy signal. Contrary to the workings of the circuit in FIG. 54 (A), the redundancy signal in the circuit of FIG. 54 (B) is supplied to the gate of a P-channel type MOSFET QP1 constituting part of a first transmission gate, and to the gate of an N-channel type MOSFET QN2 constituting part of a second transmission gate. The transmission signal is also fed via an inverter circuit IV to the gate of an N-channel type MOSFET QN1 constituting part of the first transmission gate, as weal as to the gate of a P-channel type MOSFET QP2 constituting part of the second transmission gate.

With the circuit of FIG. 54 (B), reversing of the fuse position, i.e., reversing of the redundancy signal level is combined with the switching of places between the P- and N-channel type MOSFET's in the transmission gate setup. This provides switching operations similar to those of the circuit of FIG. 54 (A). That is, keeping the fuse F connected brings the redundancy signal Low and thereby turns on the transistors QP1 and QN1 constituting the first transmission gate. This transmits the input signal ECL1 to the output terminal OUT1. At this point, the Low redundancy signal turns off the transistors QP2 and QN2 constituting the second transmission gate, which prevents the input signal ECL2 from getting transmitted to the output terminal OUT2. Conversely, cutting the fuse F brings the redundancy signal High and thereby turns off the transistors QP1 and QN1 constituting the first transmission gate. This suppresses the transmission of the input signal ECL1 to the output terminal OUT1. At this point, the High redundancy signal turns on the transistors QP2 and QN2 constituting the second transmission gate, which allows the input terminal ECL2 to be transmitted to the output terminal OUT2.

In another illustrative application, the input signals ECL1 and ECL2 are each used as a decode signal with which to select particular data lines. In this application, as in the preceding one, the output terminal OUT1 is connected to a data line selection circuit of a true circuit, and the output terminal OUT2 to a data line selection circuit of a redundancy circuit. When the fuse F remains connected, the corresponding data lines of the true circuit are selected; when the fuse F is cut, the data lines of the redundancy circuit are selected in place of the true circuit.

Where a transmission gate is opened to let an input signal ECL reach an output terminal OUT, as depicted in the above examples, the signal ECL should preferably be transmitted at high speed so as to enhance circuit performance. Therefore, an ON resistance value of the transmission gate should be as low as possible. With the ninth embodiment, as shown in FIG. 05, the amplitude of an input signal Vin (ECL) is as small as that of a base-to-emitter voltage VBE or 2VBE for the bipolar transistor. It follows that the ON resistance RON is utilized in the unsaturated region of the current (IDS) to voltage (VDS) characteristic for the MOSFET. This permits an optimum combination of the ECL signal with an MOSFET-based transmission gate for high speed signal transmission.

Figure 56:
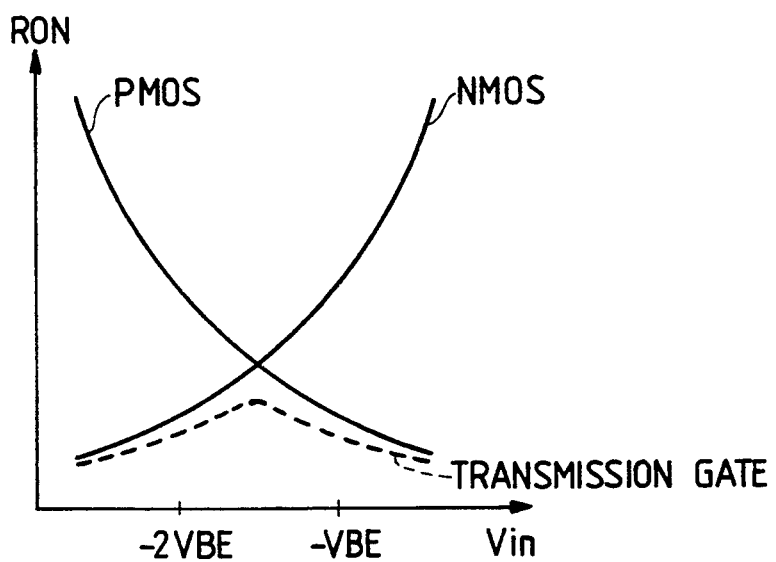
FIG. 56 is a view presenting the resistance characteristic of a CMOS transmission gate in connection with the ninth embodiment.

FIG. 56 shows the resistance characteristic of a CMOS transmission gate in which an N-channel type MOSFET and a P-channel type MOSFET are connected in parallel. As illustrated, the ECL signal with an amplitude of VBE to 2VBE is allowed to take advantage of the region where the ON resistance value RON is low for both the High and the Low levels. This ensures high speed signal transmission.

Figure 57:
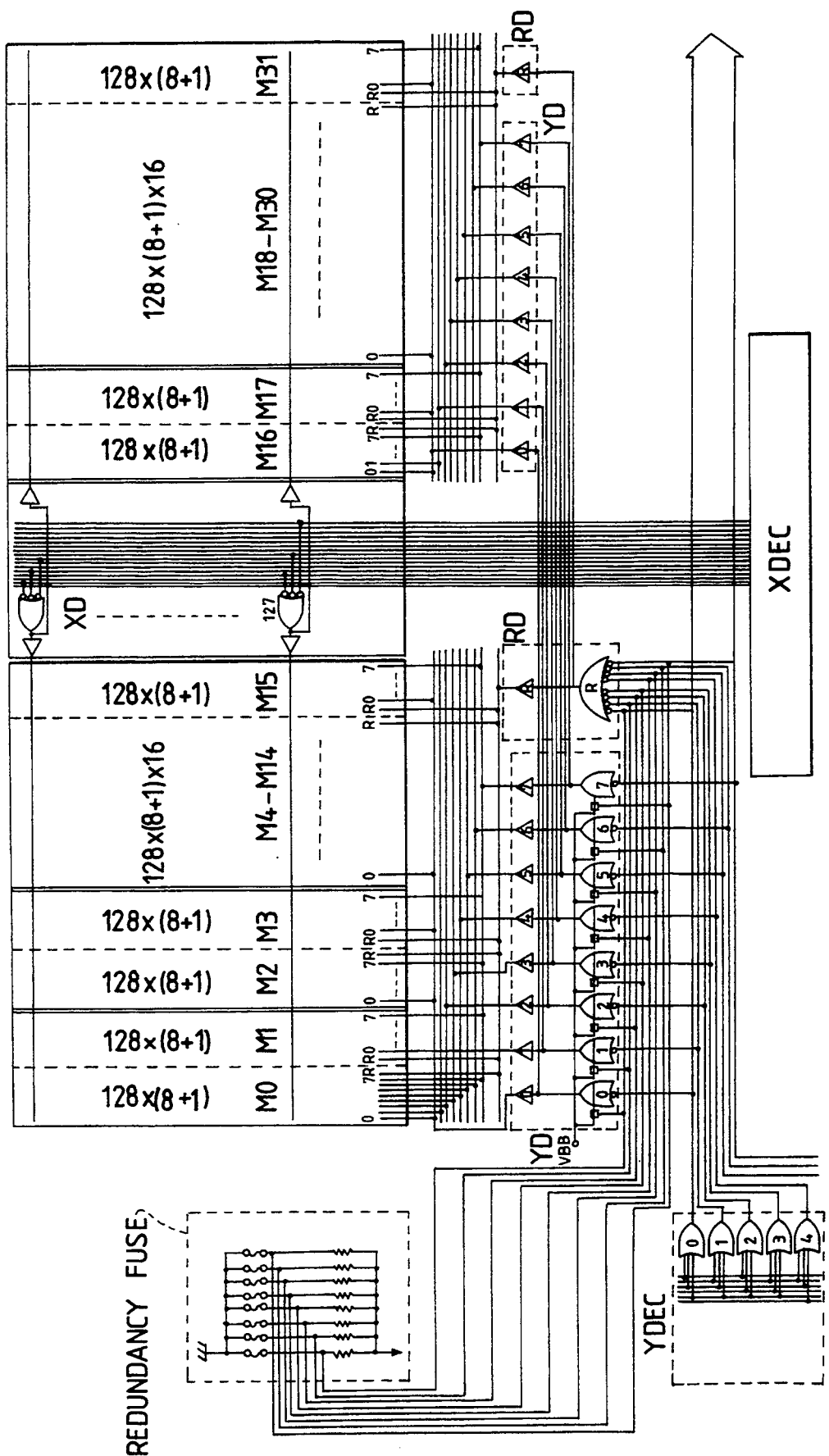
FIG. 57 is a partial block diagram of the static RAM of FIG. 52.

FIG. 57 is a partial block diagram of the static RAM (memory circuit blocks) in connection with the ninth embodiment. Each of the circuit blocks in the figure corresponds substantially to the physical geometry on the actual semiconductor substrate. In the description that follows, the left-hand side of the block diagram is regarded as the upper side.

The memory array comprises two memory mats sandwiching from right and left an X driver XD in the middle. The left-hand side memory mat is divided into 16 blocks, i.e., memory blocks M0 through M15. Likewise the right-hand side memory mat is divided into 16 blocks, i.e., memory blocks M16 through M31.

One memory block M0 comprises 128 word lines, eight pairs of true complementary data lines corresponding to data line selection signals 0 through 7, and a pair of redundancy complementary data lines corresponding to one redundancy data line selection signal R. The above memory block M0 and the memory block M1 adjacent thereto have a horizontal symmetry of redundancy data lines bisected by a broken line, as illustrated. In other words, the redundancy complementary data lines of the memory block M0 are located adjacent to those of the memory block M1. The same layout applies to pairs of memory blocks M2 and M3, ..., M14 and M15 on the left-hand side, and to pairs of M16 and M17, ..., M30 and M31 on the right-hand side. Structured in this manner, the memory array has a total capacity of about 32 kilobits (128×8×32=32,768) with the exception of the redundancy circuit capacity.

The complementary data line selection signals 0 through 7 are generated by each of two Y drivers YD on the right- and the left-hand sides. The left-hand side Y driver YD is used commonly by the memory blocks M0 through M15 in the left-hand side memory mat; the right-hand side Y driver YD, by the memory blocks M16 through M31 in the right-hand side memory mat. The redundancy complementary data line selection signal R generated by each of two redundancy drivers RD located likewise on the right- and left-hand sides is used commonly by the memory blocks M0 through M15 on the one hand, and by M16 through M31 on the other.

Each of the above-described Y drivers YD is composed of a logic portion and an output portion, to be described later. The right-hand side Y driver has its logic portion (for generating a selection signal) shared by the left-hand side Y driver. In other words, the Y driver YD and the redundancy driver RD for the right-hand side memory mat are made of their output portions alone.

A total of eight redundancy fuses 16 are provided for the true complementary data lines of each of the memory blocks M0 through M32. In this setup, if any of the eight pairs of complementary data lines in each of the 32 memory blocks M0 through M31 fail, the faulty pair are replaced with the corresponding redundancy backup pair. If the complementary data lines of the same Y address fail, all the faulty lines of that address may be replaced with their backup lines.

The above remedy operation occurs as follows: Suppose that the pair of complementary data lines corresponding to address 0 in the memory block M0 have failed, the address being one of Y addresses 0 through 7 common to the memory blocks M0 through M31. In that case, the faulty pair of complementary data lines corresponding to the true complementary data line selection signal 0 of the memory block M0 are replaced with the redundancy pair of complementary data lines corresponding to the redundancy complementary data line selection signal R. Furthermore, in each of the trouble-free memory blocks M1 through M31, the true complementary data lines of address 0 are replaced concurrently with their respective redundancy complementary data lines. Thus if the address of the defect is the same, 32 pairs of faulty complementary data lines are all remedied in the 32 memory blocks M0 through M31. Where another set of redundancy fuses and Y drivers is added to the above-described setup, two faulty pairs out of the eight pairs of complementary data lines may be remedied concurrently throughout the 32 memory blocks M0 through M31.

The logic gates in the redundancy driver RD corresponding to the left-hard side memory mat constitute an OR gate. This OR gate generates the redundancy data line selection signal R no matter which of the redundancy signals corresponding to the eight fuses is created. The Y decoder YDEC produces selection signals corresponding to the eight Y addresses, as described above. FIG. 57 illustrates five logic gate circuits 0 through 4 contained in the Y decoder YDEC.

The X driver comprises 128 logic gate circuits 0 through 127 and two word drivers, the logic gate circuits receiving pre-decode signals from the X decoder, the word drivers receiving output signals from the logic gate circuits. The two word drivers correspond to the right- and left memory mats. In other words, the memory blocks M0 through M15 in the left-hand side memory mat and the blocks M16 through M31 in the right-hand side memory mat share the same word lines.

Although not shown in FIG. 57, each memory block comprises sense amplifiers that are activated by the complementary data line selection signal. Thus the static RAM of the ninth embodiment is accessed in units of a large number of bits, typically 32 bits.

Figure 58:
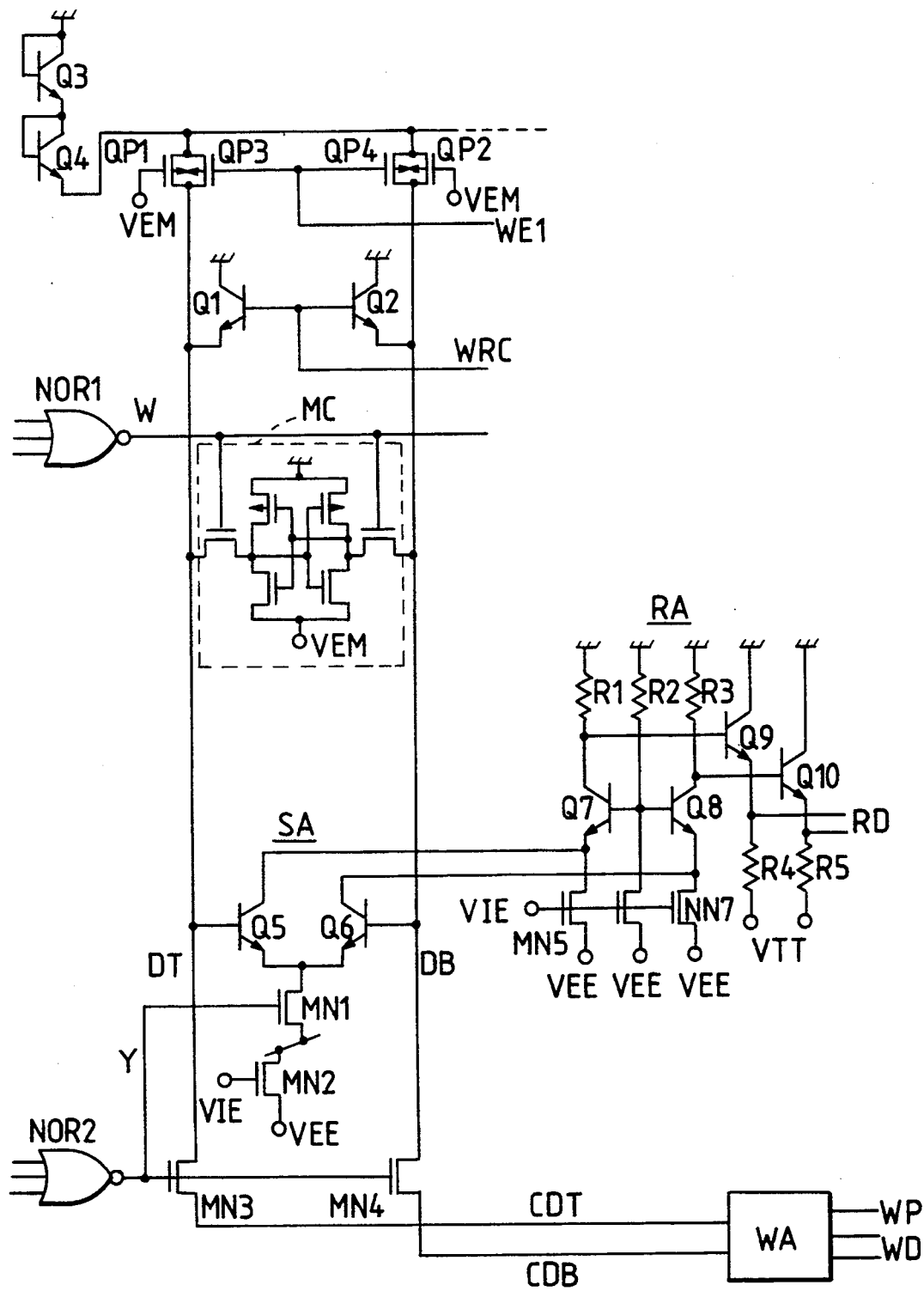
FIG. 58 is a circuit diagram of a pair of complementary data lines in a memory block of the static RAM of FIG. 52.

FIG. 58 is a circuit diagram of a pair of complementary data lines in a memory block of the above-described static RAM. The setup of FIG. 58 illustratively comprises a word line W, a word line selection circuit, a memory cell MC, a pair of complementary data lines DT and DB along with their load circuit, a write recovery circuit, a sense amplifier and a column switch. The sense amplifier is matched with a read amplifier in addition to a data input circuit IB.

The memory cell MC includes a CMOS latch circuit and a transmission gate MOSFET. The CMOS latch circuit has the input and the output of a CMOS inverter circuit connected crisscross, the CMOS inverter circuit being made of a P-channel type MOSFET and an N-channel type MOSFET. The transmission gate MOSFET, used for address selection, is located between the input and output nodes of the CMOS latch circuit on the one hand, and the complementary data lines DT and DB on the other. In the memory cell MC, the operating voltage on the high-level side is a circuit ground potential Vcc and the operating voltage on the low-level side is a constant voltage VEM generated by a voltage generation circuit.

The memory cell of this construction is entirely CMOS. Alternatively, the P-channel type MOSFET may be replaced with a high resistance load illustratively made of a polysilicon layer or the like. The high resistance load is set to have a resistance value high enough to permit the flow of a small current that protects the memory level in the N-channel type MOSFET gate against a drain leak current. In this respect, the high resistance load has a significance appreciably different from that of a load associated with the ordinary ratio type inverter circuit. Using this type of high resistance load drastically reduces the memory cell size (i.e., occupying area). However, if the low-level side operating voltage of the memory cell is set for −3.2 V to −3.3 V, the operation of the memory cell can become unstable. In that sense, the use of entirely CMOS type memory cells is preferred.

The gate of the MOSFET in the transmission gate of the memory cell is connected to the corresponding word line W. The word line W is driven by a word line selection circuit NOR1 constituted by a level conversion circuit having logic functions to be described later. In the setup of FIG. 58, the logic function portion and the word driver are integrated into a single portion.

The complementary data lines DT and DB are furnished with data line load means composed of P-channel type MOSFET's MP1 and MP2. The MOSFET's MP1 and MP2 are afforded relatively low levels of conductance in consideration of write characteristics. The gates of the MOSFET's MP1 and MP2 are fed constantly with the constant voltage VEM. The source and the drain path of the MOSFET's MP1 and MP2 are connected parallelly and respectively to the source and the drain path of P-channel type MOSFET's MP3 and MP4 having relatively high levels of conductance.

The gates of the MOSFET's MP3 and MP4 are supplied with a write control signal WE1. These gates are turned on except when a write operation is carried out. In other words, the MOSFET's MP3 and MP4, together with the MOSFET's MP1 and MP2, constitute the data line load for read operations. For a read operation, the signal amplitude of the complementary data lines is limited so as to implement high-speed read performance. For a write operation, the control signal WE1 turns off the MOSFET's MP3 and MP4 having relatively high levels of conductance. This causes the MOSFET's MP1 and MP2 having relatively low levels of conductance to constitute a load on the complementary data lines DT and DB. Given this load, the signal amplitude of the write data placed on the complementary data lines is enlarged for high-speed write performance.

The above-described load circuit is supplied with a bias voltage level-shifted by transistors Q3 and Q4 in a diode connection. Therefore, the high level of the signal amplitude for the complementary data lines DT and DB is made as low as −2 VBE. This reduces the signal amplitude for the complementary data lines DT and DB during a write operation, which makes high-speed write performance possible. Because data are written to the memory cell predominantly on a low-level signal placed on the complementary data line DT or DB, a high level of as low as −2 VBE works without problem in this embodiment. Therefore, the gate potential of the activated memory MOSFET in the memory cell is switched off by the complementary data line being brought Low via the transmission gate MOSFET. As a result, the deactivated memory MOSFET is activated so as to write data in reverse.

The complementary data lines DT and DB are connected to a pair of common complementary data lines CDT and CDB via N-channel type MOSFET's MN3 and MN4 for the column switch. The common complementary data lines CDT and CDB, in turn, are connected to output terminals of a data input buffer IB that transmits write data. The gates of the MOSFET's MN3 and MN4 for the column switch are supplied with a column selection signal Y generated by a NOR gate NOR2. The NOR gate NOR2 is composed of a level conversion circuit.

The complementary data lines DT and DB are connected to the bases of differential transistors Q5 and Q6 constituting a sense amplifier. This memory thus operates on the column sense mode. The emitter common to both differential transistors Q5 and Q6 is connected to a constant current MOSFET MN2 via a switch MOSFET MN1 that receives the column selection signal. On receiving the above-mentioned constant voltage VIE, the gate of the constant current MOSFET MN2 generates a constant current. If the memory is accessed in units of, say, 32 bits, the constant current MOSFET MN2 is provided for common use with the constant current MOSFET's for the eight sense amplifiers in one memory block corresponding to the eight column addresses.

The collectors of the differential transistors Q5 and Q6 are input to a read amplifier RA that performs current-to-voltage conversion. More specifically, the collectors of the transistors Q5 and Q6 are connected to the emitters of transistors Q7 and Q8 whose bases receive a bias voltage generated by a resistance R2. The resistance R2 permits the flow of a constant current generated by the MOSFET that receives the constant voltage VIE. The emitters of the transistors Q7 and Q8 are provided with constant current MOSFET's MN5 and MN7 as well as with resistances R1 and R3 for current-to-voltage conversion, the MOSFET'S receiving the constant voltage VIE.

A high- or low-level signal corresponding to the data stored in the selected memory cell is placed on the complementary data lines DT and DB. The high-/low-level signal turns on/off the differential transistors Q5 and Q6 constituting the sense amplifier. In response to the differential transistors Q5 and Q6 being turned on or off, the constant current flows to the resistance R1 or R3 via the MOSFET MN1, etc., turned on by the column selection signal Y. The resistances R1 and R3 convert the read signal into a voltage signal. The voltage signal is output through an emitter follower circuit comprising transistors Q9 and Q10 as well as emitter resistances R4 and R5.

The transistors Q1 and Q2 constitute a write recovery circuit that is turned on by a recovery signal WRC generated upon completion of a write operation. An activated write recovery circuit transmits a write signal, thereby resetting at high speed the complementary data lines DT and DB having a relatively large difference of level therebetween. The recovery signal WRC is output via the emitter follower output transistors. With the transistors Q1 and Q2 coupled in a Darlington connection to the output transistors generating the recovery signal WRC, the complementary data lines DT and DB are brought to the same level as the bias level of −2 VBE corresponding to the bias circuit (containing transistors Q3 and Q4).

Figure 59:
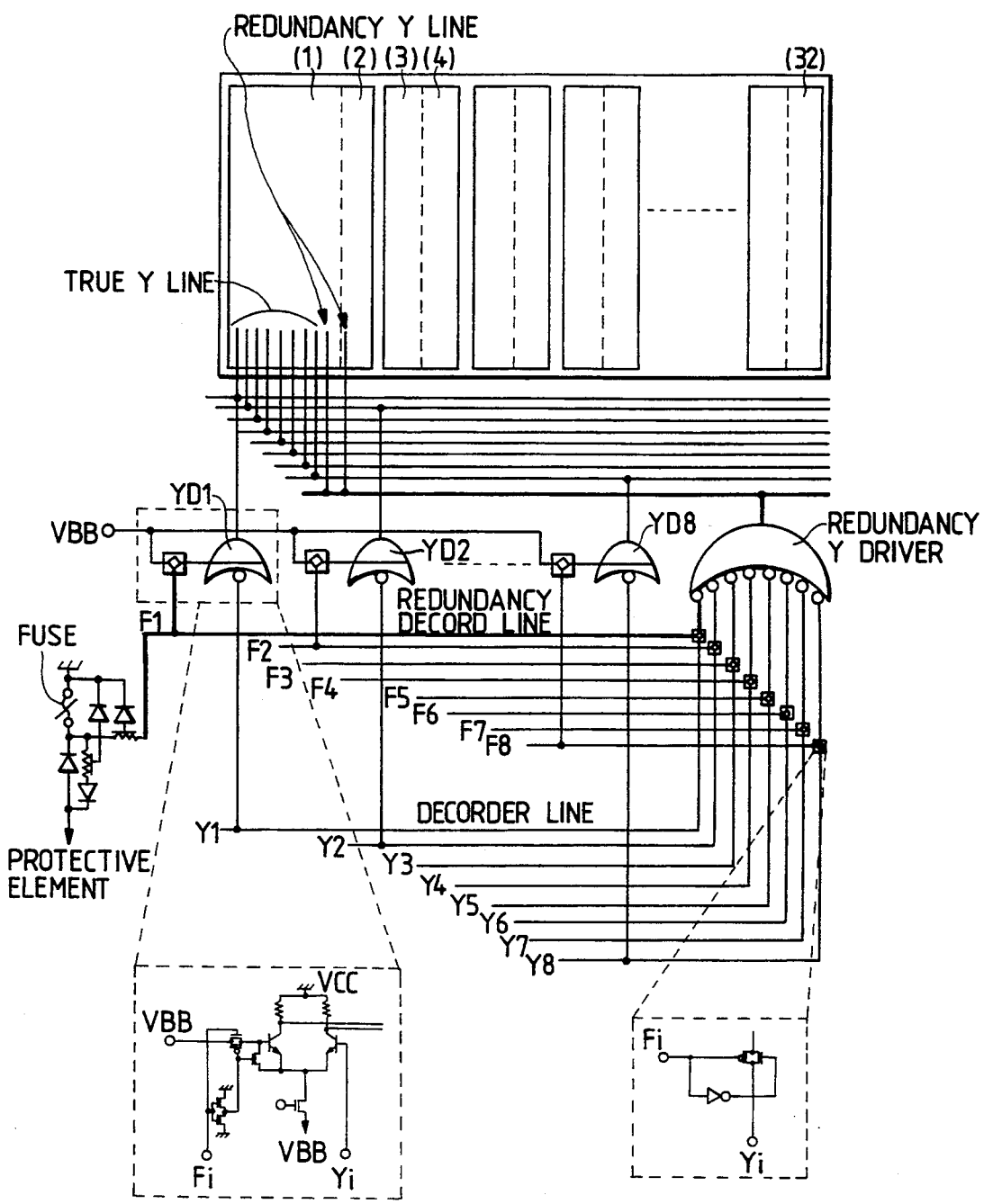
FIG. 59 is a schematic block diagram showing part of the inventive static RAM.

FIG. 59 is a schematic block diagram showing part of the static RAM according to the invention. Specifically, FIG. 59 illustrates a major portion of the setup shown in FIG. 57, emphasizing a true Y driver and a redundancy Y driver. The fuse arrangement 16 is furnished with protective elements that protect the internal circuits against static electricity destruction stemming from the charges generated by laser beam irradiation or the like for fuse cutting.

A redundancy signal F1 is generated for a single fuse 16. This redundancy signal F1 is used to control the operation of the true Y driver on the one hand, while being input to the Y driver on the other. In this embodiment, when the fuse 16 is cut to stop the operation of the true Y driver, the redundancy signal F1 is brought from the high VCC to a low level such as VEE. The low-level redundancy signal F1 inhibits the reference voltage VBB of the true Y driver, and permits the supply of an output signal generated by a CMOS inverter circuit to activate an nMOS between base and emitter. This brings the output signal of the true Y driver forcibly to the nonselected level regardless of the decode signal Y1. With the redundancy signal F1 brought Low, the above-described transmission gate is opened so that the Y decode signal Y1 will be transmitted to the input of an OR gate constituting the redundancy Y driver. In this manner, the redundancy Y line is selected in place of the true Y line corresponding to the redundancy signal F1.

The memory blocks (1) through (32) in FIG. 59 correspond to the memory blocks M0 through M31 in FIG. 57. Each memory block comprises eight pairs of true complementary data lines (true Y lines) and the matching redundancy complementary data lines (redundancy Y lines). These redundancy Y lines are used in common by the eight pairs of complementary data lines of all memory blocks (1) through (32). Therefore, if any one of the eight pairs of complementary data lines fail, the faulty pair are replaced with the corresponding redundancy Y lines.

Figure 60:
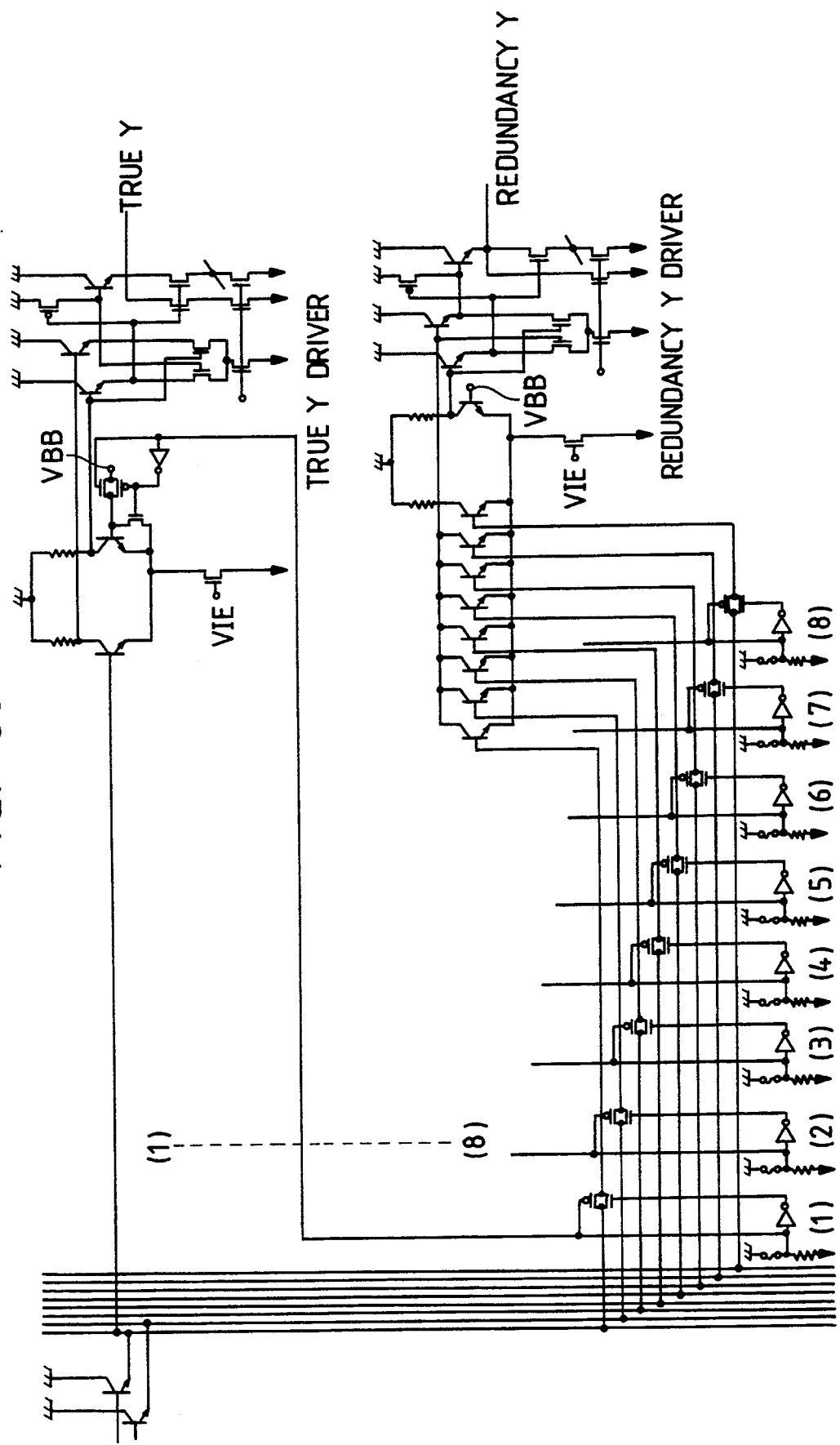
FIG. 60 is a circuit diagram specifically describing a true Y driver and a redundancy Y driver for use in the inventive static RAM.

FIG. 60 is a circuit diagram specifically describing a true Y driver and a redundancy Y driver contained in the static RAM. The Y decoder is composed of an ECL wired-OR logic circuit. That is, as shown in FIG. 60, connecting the emitters of the ECL output transistors generates a decode signal that brings Low that which is selected. For example, where eight decode signals are to be generated as described, complementary address signals y0, y0B–y2, y2B corresponding to a three-bit Y address signal Y0–Y2 are combined. If the signals y0B, y1B and y2B are all Low, the decode signal corresponding to address 0 is generated. Reference characters y1–y2 designate an internal address signal in phase with the Y address signal, and reference characters y1B–y2B represent an address signal opposite in phase to the Y address signal Y0–Y2. Although not shown in FIG. 60, the output lines are subjected to a constant current load so as to let the above wired-OR logic work.

The above-mentioned eight decode signals are led through an ECL circuit and an output driver combining a bipolar transistor with a CMOS circuit, the latter two being located on the output side of the ECL circuit. The operation generates a true Y selection signal.

The eight decode signals are matched with eight sets of fuse and switch circuits (1) through (8), examples of the circuits being illustrated in FIG. 53. A fuse 16 and a high resistance generate a redundancy signal for the circuit (1). On the one hand, the redundancy signal for the circuit (1) is supplied to a switch circuit made of an inverter circuit and a CMOS transmission gate. The switch circuit feeds the corresponding decode signal to the input of the logic gate constituting the redundancy Y driver. On the other hand, the redundancy signal for the circuit (1) is directed at two designation. One destination is the transmission gate that selectively transmits the reference voltage VBB for the ECL circuit receiving the corresponding decode signal. The other destination is the gate of an MOSFET that short-circuits the base and emitter of the transistor receiving the reference voltage VBB.

When the fuse of the circuit (1) above is cut, a low-level redundancy signal is generated. This opens the CMOS transmission gate corresponding to the redundancy Y driver, transmitting the decode signal to the ECL logic gate of the redundancy Y driver. In the ECL circuit of the true Y driver, the above low-level redundancy signal closes the CMOS transmission gate for transmitting the reference voltage VBB, thereby suppressing the supply of the reference voltage VBB. At the same time, the switch MOSFET is turned on and the transistor on the VBB side is turned off. These operations fix the true Y selection signal of the true Y driver to the nonselected level regardless of the decode signal being input. As a result, when the memory is accessed for the above circuit (1), the redundancy Y driver operates in place of the true Y driver to generate the redundancy Y selection signal.

The redundancy signal created as per the status of the fuses in the circuits (2) through (8) works in two ways. On the one hand, the redundancy signal controls the CMOS transmission gate that transmits the corresponding decode signal to the ECL OR gate having a total of eight inputs. On the other hand, the redundancy signal controls the transmission gate and switch MOSFET in a manner that substantially inhibits the operation of the true Y driver for the corresponding address. In other words, cutting one fuse provides 16-bit redundancy switchover.

Figure 61:
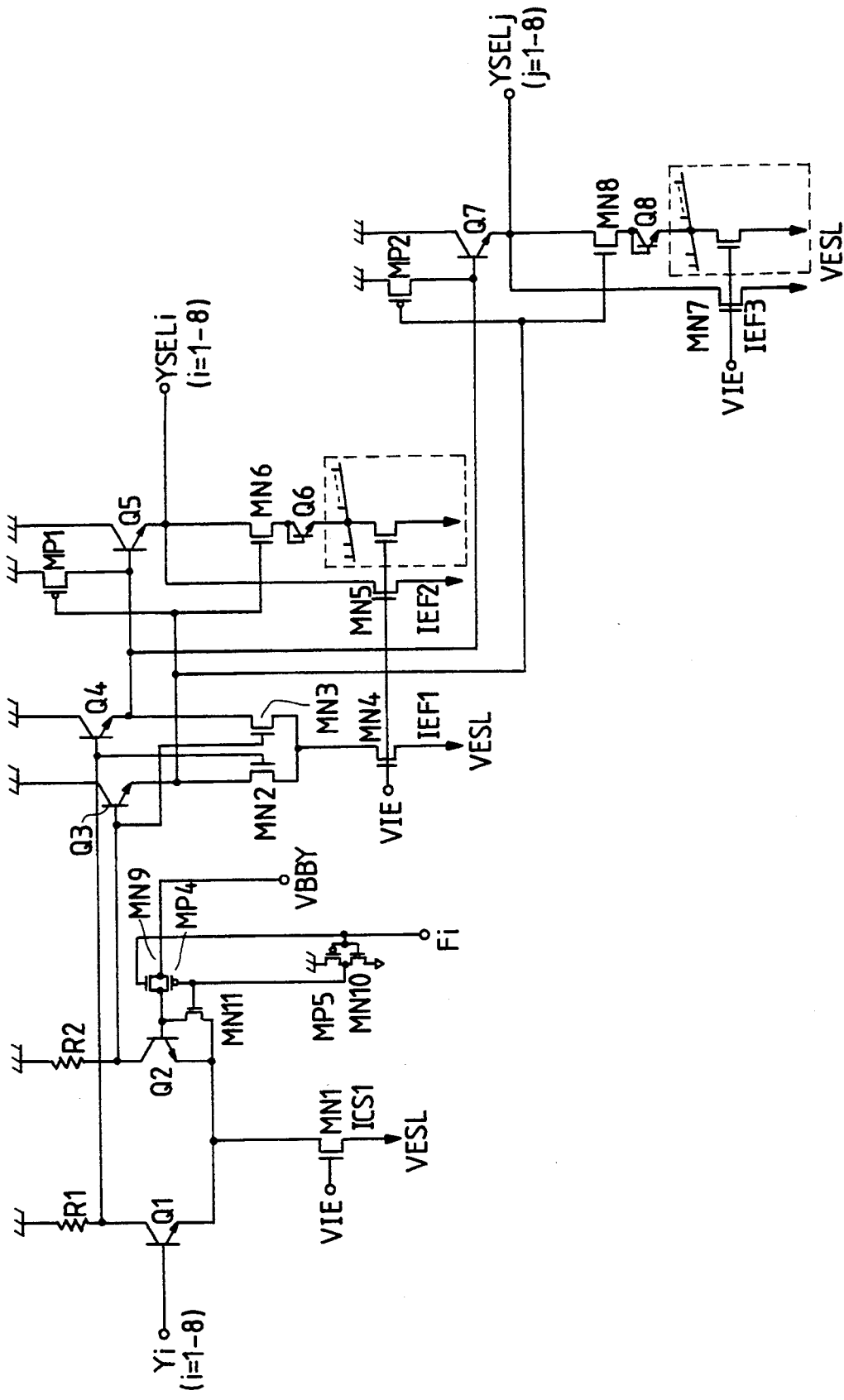
FIG. 61 is a circuit diagram specifically depicting another true Y driver for use in the inventive static RAM.

FIG. 61 is a circuit diagram specifically depicting another true Y driver for use in the static RAM. A decode signal Yi (i=1–8) is supplied to the base of a transistor Q1. A transistor Q2, forming a differential pair with the transistor Q1, has its base fed with a reference voltage VBBY through a CMOS transmission gate made of an N-channel MOSFET MN9 and a P-channel MOSFET MP4. The gate of the N-channel type MOSFET MN9 is supplied with a redundancy signal Fi (low level in remedy state, high level in non-remedy state). Through a CMOS inverter circuit composed of a P-channel type MOSFET MP3 and an N-channel MOS- FET MN10, an inverted signal of the redundancy signal Fi is sent to the gate of the P-channel type MOSFET MP4. The inverted signal generated by the CMOS inverter circuit is also fed to the gate of an N-channel type switch MOSFET MN11.

The emitter common to the differential transistors Q1 and Q2 is furnished with an N-channel type MOSFET MN1. When its gate is fed with a constant voltage VIE, the MOSFET MN1 allows a constant current ICS1 to flow. The collectors of the differential transistors Q1 and Q2 are provided with load resistances R1 and R2, respectively.

The ECL circuit of the above construction generates an output signal that is converted to the CMOS level by a level conversion circuit.. This conversion circuit is furnished as a Y driver. A pair of emitter follower transistors Q3 and Q4, on receiving a complementary output signal from the ECL circuit above, generate a complementary output signal of their own. This characteristic is utilized in simplifying the circuit structure and reducing current dissipation. Specifically, a differential pair of N-channel type switch MOSFET's MN2 and MN3 are provided, whereas a constant current source MOSFET MN4 is used in common by the two emitter follower transistors Q3 and Q4. The gates of the differential switch MOSFET's MN2 and MN3 are switched on and off in a complementary manner when supplied with specific input signals. These input signals for the MOSFET's MN2 and MN3 are fed in a crisscross manner to the bases of the emitter follower transistors Q3 and Q4.

For example, suppose that the collector output of the transistor Q1 is High and that of the transistor Q2 is Low in the ECL circuit. In this case, the MOSFET MN2 corresponding to the emitter follower transistor Q3 receiving the low-level output signal is turned on by the other output signal being brought High. This allows a constant current IEF1 generated by the constant current source MOSFET MN4 to flow to the transistor Q3, generating the low-level output signal. At this point, the MOSFET MN3 associated with the emitter of the emitter follower transistor Q4 corresponding to the high-level output signal is turned off by the low-level output signal. Therefore, all emitter current of the emitter follower transistor Q4 flows as the base current of the output transistor Q5. This shortens the rise time of the true Y selection signal YSELi.

On the other hand, suppose that the collector output of the transistor Q1 is Low and that of the transistor Q2 is High in the ECL circuit. In this case, the MOSFET MN2 corresponding to the emitter follower transistor Q4 receiving the low-level output signal is turned on by the other output signal being brought High. This allows the constant current IEF1 to flow to the transistor Q4, generating the low-level output signal. At this point, the MOSFET MN2 associated with the emitter of the emitter follower transistor Q3 corresponding to the high-level output signal is turned off by the low-level output signal. Therefore, all of the emitter current of the emitter follower transistor Q4 is used as a charging current for the gates of the P-channel type MOSFET MP1 and N-channel type MOSFET MN6. This also shortens the rise time of the true Y selection signal YSELi.

In another example, the supply voltage $V_{EE}$ may be set for −4 V and the level-converted signal amplitude for 2.4 V. In this case, a voltage of about 0.8 V appears between source and drain of the MOSFET MN1 and other components making up the constant current source. Thus the MOSFET setup serves as an excellent current source.

The ninth embodiment contains, and is not limited by, the constant current source MOSFET MN5 that lets a small bias current IEF2 flow to the output transistor Q5. This constant current source compensates for the base-to-emitter voltage VBE of the transistor Q5 after the true Y selection signal YSELi has been raised to the predetermined high level, or while the true Y selection signal remains at the nonselected level.

The transistor Q in the diode connection constitutes a level shift circuit. The insertion of the level shift element causes a rise in the source potential of the N-channel type MOSFET MN6 through which the emitter current of the output transistor Q5 flows, the rise matching the presence of the level shift element. As shown by the broken line in FIG. 61, the N-channel type MOSFET that lets the constant current pass through is used commonly by the true Y driver of the memory array. The MOSFET MN6 corresponding to the Y selection signal changing from High to Low and the other MOSFET MN6 corresponding to the Y selection signal in the nonselected state constitute a differential pair. In this construction, only the N-channel type MOSFET MN6 corresponding to the Y selection signal changing from High to Low is actually turned on. This permits high-speed extraction of a Y selection line based on the constant current generated by the common constant current source MOSFET. When they selection line is brought to the predetermined low level, the constant current generated by the constant current source MOSFET passes through the output transistor Q5 and is routed thereby in a distributed manner, the output transistor Q5 matching the nonselected Y selection line.

The MOSFET-generated constant current for high-speed extraction of a Y selection signal is set for a relatively large current value. By contrast, the constant current IEF2 produced by the MOSFET MN5 that compensates for the base-to-emitter voltage VBE of the output transistor Q5 is set for a very small current value.

In the above-described ECL circuit, the constant current ICS1 and the resistances R1 and R2 generate an output signal ICS1×R1 or ICS1×R2. This output signal is set to be slightly higher in ECL level than usual. Therefore, the output signal of a relatively high level is employed to address the Y selection/nonselection of the memory array made of CMOS circuits, or to match the input signal to the CMOS circuits.

An inverted output signal and a noninverted output signal generated by the collector resistances R1 and R2 of the differential transistors Q1 and Q2 above constitute a complementary output signal. This complementary output signal is supplied to the bases of the emitter follower transistors Q4 and Q3, as described above. The emitters of the emitter follower transistors Q3 and Q4 are connected to the load circuit discussed earlier. The collector output of the transistor Q1 corresponds to the inverted output signal of the ECL circuit above. This collector output is fed to the base of the output transistor Q5 through the emitter follower transistor Q4. The collector output of the transistor Q2 corresponding to the noninverted output of the ECL circuit above passes through the emitter follower transistor Q3 and goes to the gate of the N-channel type MOSFET MN6. Intended for active pull-down use, the MOSFET MN6 is connected to the emitter of the output transistor Q5. On the source side of the active pull-down N-channel type MOSFET MN6 is a constant current source used in common by the Y driver and having the level converting and logic functions similar to those of equivalent constructions.

The ninth embodiment is provided with, and not limited by, the P-channel type MOSFET MP1 for active pull-up use. Furnished between the base and collector of the output transistor Q5, the MOSFET MP1 compensates for the output signal high level as it is supplied with the output signal from the emitter follower transistor Q3; the output signal corresponds to the noninverted output mentioned above. The threshold voltage Vth of the MOSFET MP1 is illustratively set for −0.5 V.

The emitter of the emitter follower output transistor Q5 is connected to the gates of the switch MOSFET's MN3 and MN4 for Y selection (see FIG. 58) as well as to the gate of the switch MOSFET MN1 that lets operating currents flow to sense amplifiers. In this circuit example, the supply voltage VCC on the high level side of the circuit is set for ground potential (e.g., 0 V) that matches the ECL circuit; the supply voltage VEE on the low level side of the circuit is set for, but not limited to, a negative voltage of, for example, about −4 V.

The low level VL of the output signal level-converted by this circuit example is obtained from the following equation:

$$VL = -[ICS1 \times R1 + VBE(Q4) + VBE(Q5)] \quad (1)$$

where, VBE(Q4) and VBE(Q5) are the base-to-emitter voltages of the emitter follower transistors Q4 and Q5, respectively. When the output signal of this low level LV is formed, the output signal of the opposite phase is brought High. This turns on the N-channel type MOSFET MN6 for active pull-down use. Thus the constant current source allows the Y selection line to be pulled down to the low level VL at high speed.

The high level VH of the output signal level-converted by this circuit example is obtained from the following equation:

$$VH = -VBE(Q5) \quad (2)$$

When the inverted output signal of the ECL circuit above is High, the emitter follower output transistors Q4 and Q5 constitute a Darlington connection. This allows a high-speed rise from the low level VL to −[VBE(Q4)+VBE(Q5)] to take place. Therefore, the signal change of ICS1×R1 occurs at high speed in response to the signal change in the differential switch circuit. At this point, the low level of the noninverted output signal turns on the P-channel type MOSFET MP1 for active pull-up use. This brings the base potential of the output transistor Q5 to the ground potential of the circuit, which eventually raises the high level VH to the level given by equation (2) above. In other words, the P-channel type MOSFET MP1 for active pull-up use compensates for the level drop in the base-to-emitter voltage VBE(Q4) of the emitter follower transistor Q4.

As described, the time required to raise the Y selection line from the low nonselected level to the high selected level is the total sum of three time periods, t1, t2 and t3. The time t1 is a time required for the emitter follower transistor Q4 to raise the base potential of the transistor Q5 from the low level LV+VBE(Q5) (given by equation (1) above) by ICS1×R1 to −VBE(Q4). The time t2 is a time required for the P-channel type MOSFET MP1 for active pull-up use to raise the base potential of the transistor Q5 from −VBE(Q4) to ground potential 0 V. The time t3 is a time required for the output transistor Q5 to charge the Y selection line. During the time t1, the base potential of the transistor Q5 already starts rising towards the ground potential of 0 V so that the P-channel type MOSFET MP1 will start conducting in response to the low level of the noninverted output signal from the ECL level. Furthermore, the transistor Q5 raises the level of the Y selection line at high speed to the above-mentioned high level VH so that the Y selection line will be charged with a particular current. This particular current is obtained by multiplying by a current amplification factor the base current supplied by the P-channel type MOSFET MP1.

The absolute value of the amplitude of the output signal from the level conversion circuit of the ninth embodiment is expressed as $$ICS1s \times R1 \times VBE(Q4)$$

This signal amplitude is set so as to overlap with that of the signal of the CMOS circuit. For example, the operating voltage on the high level side of the CMOS circuit is set for the high level VH while the operating voltage on the low level side thereof is set for the low level VL. More specifically, the supply voltage VEE is set for about −4 V and the signal amplitude for about 2.4 V. Since the base-to-emitter voltage VBE of the transistor is generally about 0.8 V, the value ICS1×R1 is set approximately for 1.6 V. It follows that the high level of the input decode signal needs to be kept at about −1.6 V so as not to let the differential transistors Q1 and Q2 constituting the ECL circuit (current switch circuit) operate in the saturated region.

At an ambient temperature of 25° C., the high level of the ECL level signal is between −1.105 and −0.810 V and the low level thereof between 1,850 and −1.475 V in amplitude. The signal levels of such narrow amplitudes require readjusting the decode signal of the ECL level before its input to the ECL circuit of the Y driver. Therefore, the decode signal is routed through emitter follower transistors or through a suitable level shift circuit so that the high level of the signal will not exceed the above-mentioned level of −1.6 V. Correspondingly, the reference voltage VBBY is, for example, at −2 V. This is the voltage obtained by having the ECL level reference voltage shifted in level in response to the level shift of the above input signal. The low level of the decode signal fed to the base of the input differential transistor Q1 constituting part of the ECL circuit is set for about −2.4 V. Therefore, the potential of the emitter common to the differential-transistors Q1 and Q2 is about −3.2 V. This means that a sufficient voltage is ensured for operating the transistors or MOSFET's composing the constant current source even when the supply voltage VEE is made as low as −4 V.

The output signal passing through the emitter follower transistors Q3 and Q4 is fed to the input of the Y driver. The Y driver generates the Y selection signal YSELj (j=1-8) and includes output transistors of the above type, the N-channel type MOSFET MN7 for active pull-down use, and P-channel type MOSFET MP2 for active pull-up use. Accordingly, where the memory array is divided into the left- and right-hand side memory mats, the Y selection signal YSELj corresponds to the right-hand side memory mat.

Figure 62:
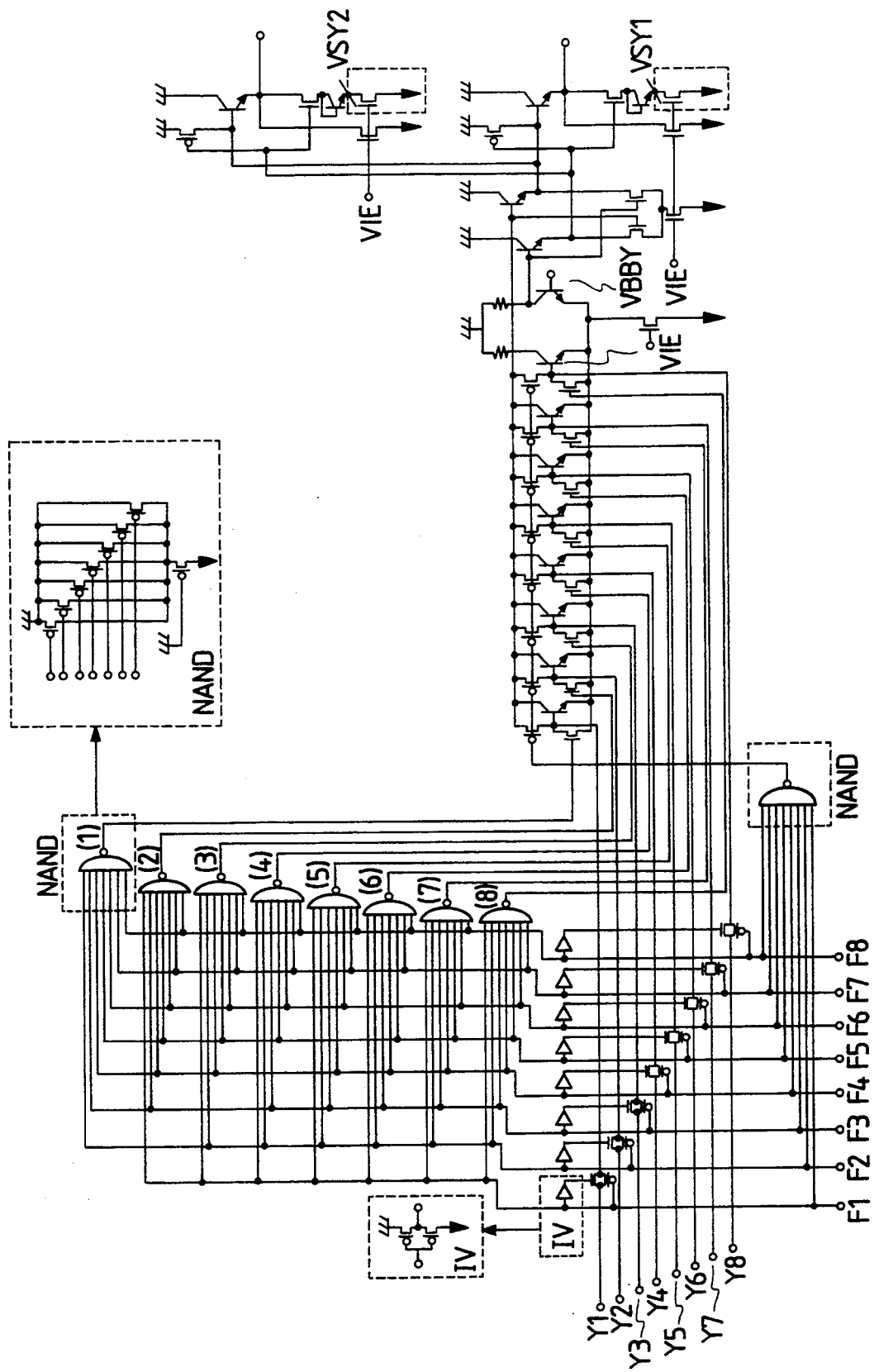
FIG. 62 is a circuit diagram specifically sketching another redundancy Y driver for use in the inventive static RAM.

FIG. 62 is a circuit diagram specifically sketching another redundancy Y driver for use in the static RAM. In this circuit example, a CMOS transmission gate under switching control of a redundancy signal switches the actual transmission path of a decode signal from the true Y driver to the redundancy Y driver to remedy the fault. In a NOR gate used in the redundancy Y driver, a closed transmission gate would bring the output to the high impedance state. The output is kept from being brought High by having a P-channel type switch MOSFET placed between the base and collector of each input transistor and by having an N-channel type switch MOSFET furnished between the base and emitter of each input transistor.

The gate of the switch MOSFET located between the base and collector of each of the input transistors is supplied commonly with an output signal from an eight-input NAND gate circuit NAND that receives redundancy signals F1 through F8. Of these switch MOSFET's, the P-channel type MOSFET's are turned on in response to the output signal of the NAND gate NAND being brought Low when no fault remedy operation is performed for any Y address, i.e., when all redundancy signals F1 through F8 are High. All transmission gates are closed in response to the redundancy signals F1 through F8 being brought High. In this state, if the switch MOSFET located between the collector and base of each of the input transistors is turned on, these transistors are forcibly turned on, i.e., brought into diode connection. This brings the output signal of the logic gate portion Low, thereby fixing to the nonselected level (i.e., low level) the redundancy Y selection signal generated by the redundancy Y driver corresponding to the two memory mats.

When any one of the redundancy signals F1 through F8 is brought Low, the CMOS transmission gate corresponding to that signal opens. This allows the applicable decode signal to be supplied to the base of the above-mentioned input transistor. When the decode signal corresponding to the fault address is generated in this manner, the redundancy Y driver acts to produce a redundancy Y selection signal. At this point, the bases of the remaining seven input transistors are prevented from being brought High by having a seven-input NAND gate NAND provided for the N-channel type switch MOSFET located between the base and emitter of each of the input transistors. For example, the gate of the N-channel type switch MOSFET provided between base and emitter of the input transistor corresponding to the redundancy signal F1 is supplied with the output signal from the seven-input NAND gate circuit that receives the remaining redundancy signals F2 through F5. In this setup, the switch MOSFET is turned off provided all the other redundancy signals F2 through F8 are not being remedied.

If any of Y addresses 1 through 8 is being remedied, the corresponding N-channel type switch MOSFET alone is turned off, and the applicable decode signal is sent to the base of the input transistor. The N-channel type switch MOSFET provided between the base and emitter of each of the remaining seven input transistors is turned on, which forcibly turns off the input transistors. In this manner, only when a given Y address is being remedied does the OR gate circuit furnished in the redundancy Y driver allow the corresponding decode signal to be fed to the base of the corresponding input transistor. At this point, all the other input transistors are forcibly turned off. If no Y address is remedied, all input transistors are forcibly turned off, which brings the redundancy Y selection signal Low.

As illustrated specifically in FIG. 62, the eight- and seven-input NAND gates are each composed of N-channel type MOSFET's acting as loads with respect to eight or seven parallelly connected P-channel type MOSFET's, the MOSFET count corresponding to the number of inputs. This setup constitutes a NAND gate circuit made of a minimum number of elements. Because these elements are small in size and can be integrated to a high degree, putting together the P- and N-channel type MOSFET's connected between collector and base and between the base and emitter of the input transistors amounts to only a limited volume within the entire redundancy Y driver.

Figure 63:
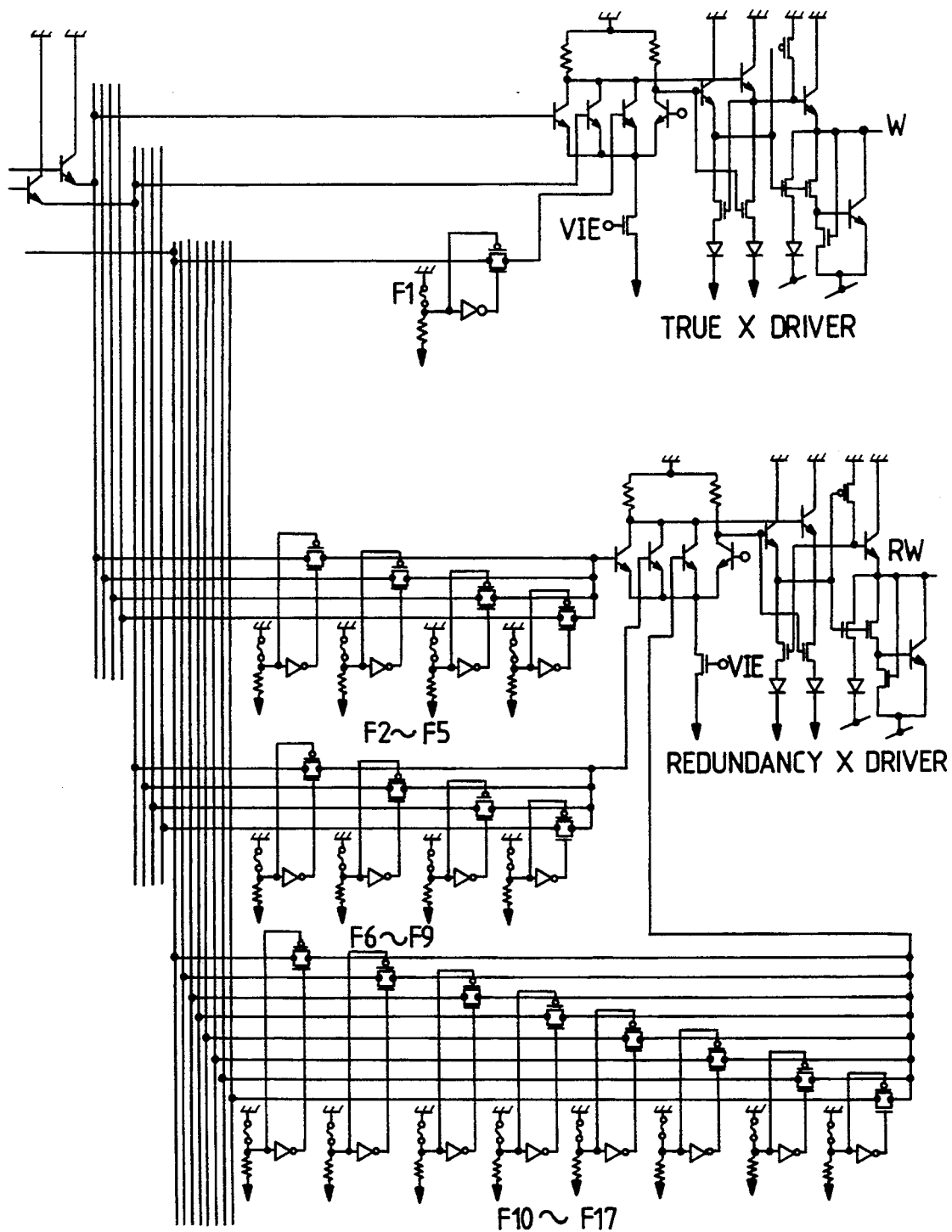
FIG. 63 is a circuit diagram of an X redundancy circuit used in connection with the invention.

FIG. 63 is a circuit diagram of an X redundancy circuit used in connection with the invention. Where 128 word lines are provided, as in the setup of FIG. 57, wired logic involves forming two groups of four decode signals and one group of eight decode signals. The three groups of pre-decode signals are combined into 128 word line selection signals (i.e., $4 \times 4 \times 8 = 128$).

The logic gate portion of the true X driver is a three-input ECL circuit that receives the pre-decode signals in three groups. One of the three inputs is connected with a CMOS transmission gate placed under switching control of the redundancy signal generated by the fuse F described earlier. The CMOS transmission gate inhibits transmission of the pre-decode signal so that the defective word line W will be fixed to the nonselected level.

The redundancy X driver selects a redundancy word line RW in place of a true word line W. The three groups of pre-decode signals correspond to fuses F2 through F5, F6 through F9, and F10 through F17. One of the pre-decode signals is used to select the defective word line. The corresponding pre-decode signal is selected by selectively cutting one of the fuses. The cutting of the fuse opens a transmission gate so that the corresponding pre-decode signal will be supplied to the three-input transistors of the redundancy Y driver. Once the pre-decode signal for selecting the defective word line is generated in this manner, the input transistors are turned off so that a selection signal for the high-level redundancy word line RW will be formed. This selection signal is transmitted to the redundancy word line RW via the driver that performs the level conversion operations described earlier.

In the ninth embodiment, a total of 17 fuse circuits and transmission gates combine to form a simple circuit constitution. This constitution permits any one defective word line from among the 128 word lines to be replaced with a redundancy word line.

Figure 64:
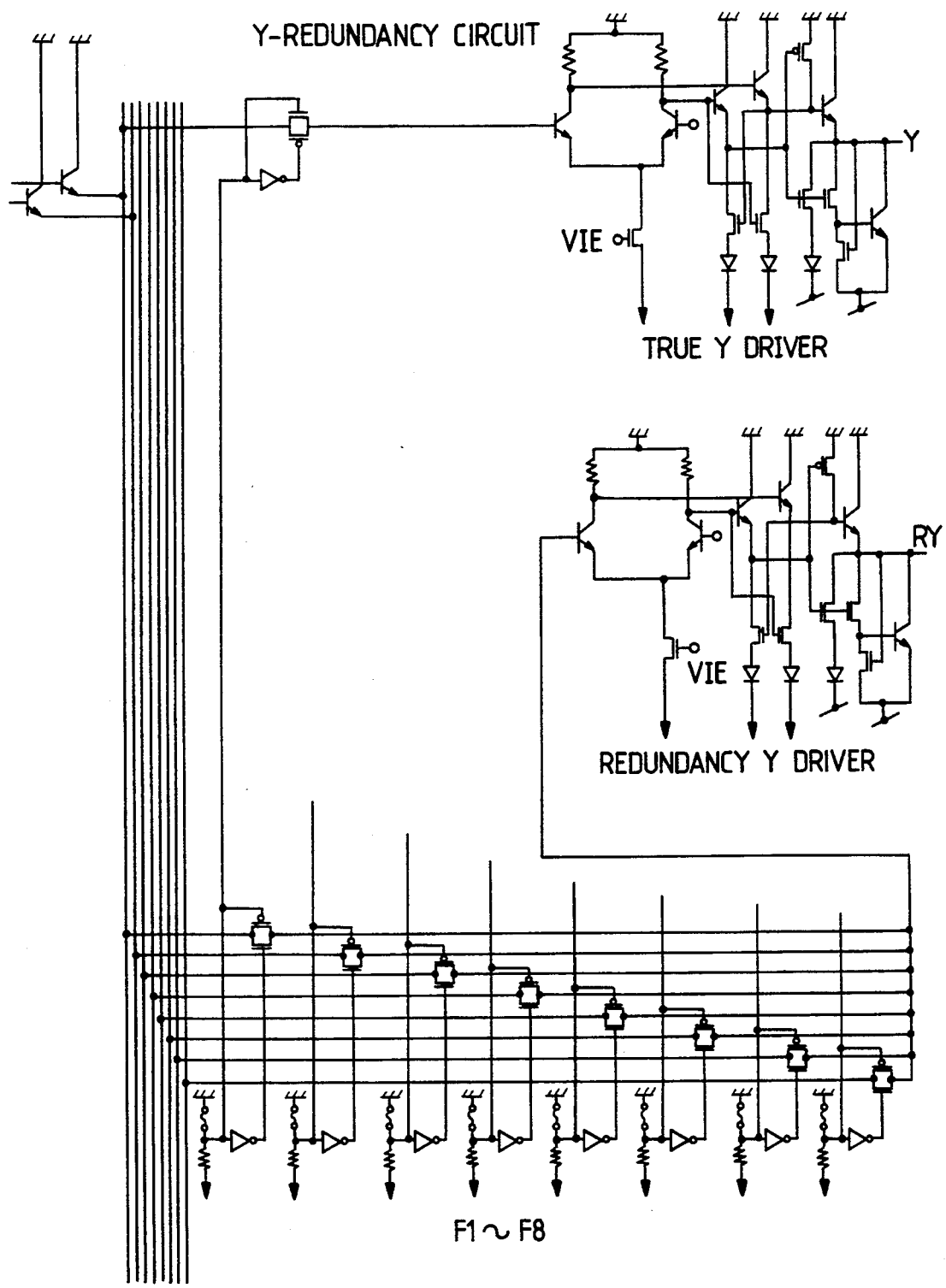
FIG. 64 is a circuit diagram of a Y redundancy circuit used in connection with the invention.

FIG. 64 is a circuit diagram of a Y redundancy circuit used in connection with the invention. In this circuit example, a CMOS transmission gate under switching control of a redundancy signal is provided on the input transistor side, the gate acting to suppress the operation of the true Y driver as needed. For a fault remedy operation, the CMOS transmission gate is turned off by the redundancy signal so that the corresponding decode signal will be prevented from entering the true Y driver of the fault address.

The redundancy Y driver involves having the transmission gate output constructed in wired-OR logic in place of the eight input transistors discussed above. Such wired-OR logic simplifies the circuit construction of the logic gate portion. When a transmission gate is turned off in the above setup, the base potential of the transistor receiving the signal passing through that gate "floats." If the floating base potential is not desired, the switch MOSFET arrangement identical to that in FIG. 62 and NAND gate circuitry may be provided. Alternatively, pull-up or pull-down type high resistance elements may be inserted in the circuit construction.

Figure 65:
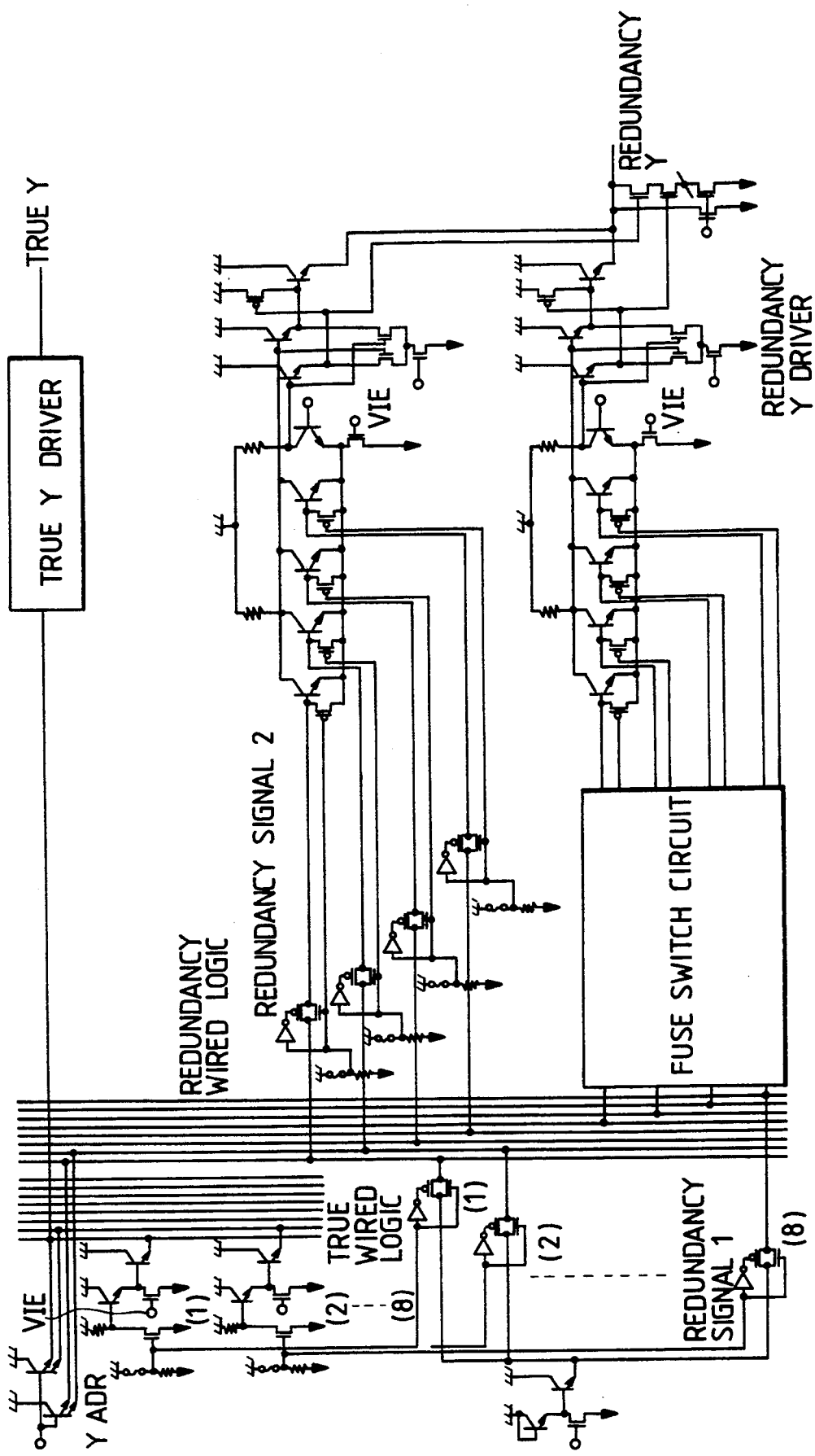
FIG. 65 is a circuit diagram of another Y redundancy circuit used in connection with the invention.

FIG. 65 is a circuit diagram of another Y redundancy circuit used in connection with the invention. In this circuit example, the redundancy Y driver is an ECL type four-input NOR circuit, with wired-OR logic implemented in the driver stage. This setup provides a redundancy Y driver operating at higher speeds than the eight-input logic gate setup shown in FIG. 57.

In the setup of FIG. 65, the decode circuit is divided into portions: true circuit wire logic and redundancy wire logic. A redundancy signal 1 made of signals (1) through (8) fixes the true wires to the high level so as to fix the output signal of the true Y driver to the low level. The Y address six, hal passes through a CMOS transmission gate under switching control of the redundancy signal 1, enters one redundancy wire logic line, passes through another CMOS transmission gate under switching control of a redundancy signal 2, and reaches the redundancy Y driver. In this construction, one faulty bit is remedied by cutting four fuses that specify the redundancy signals 1 and 2.

Figure 66:
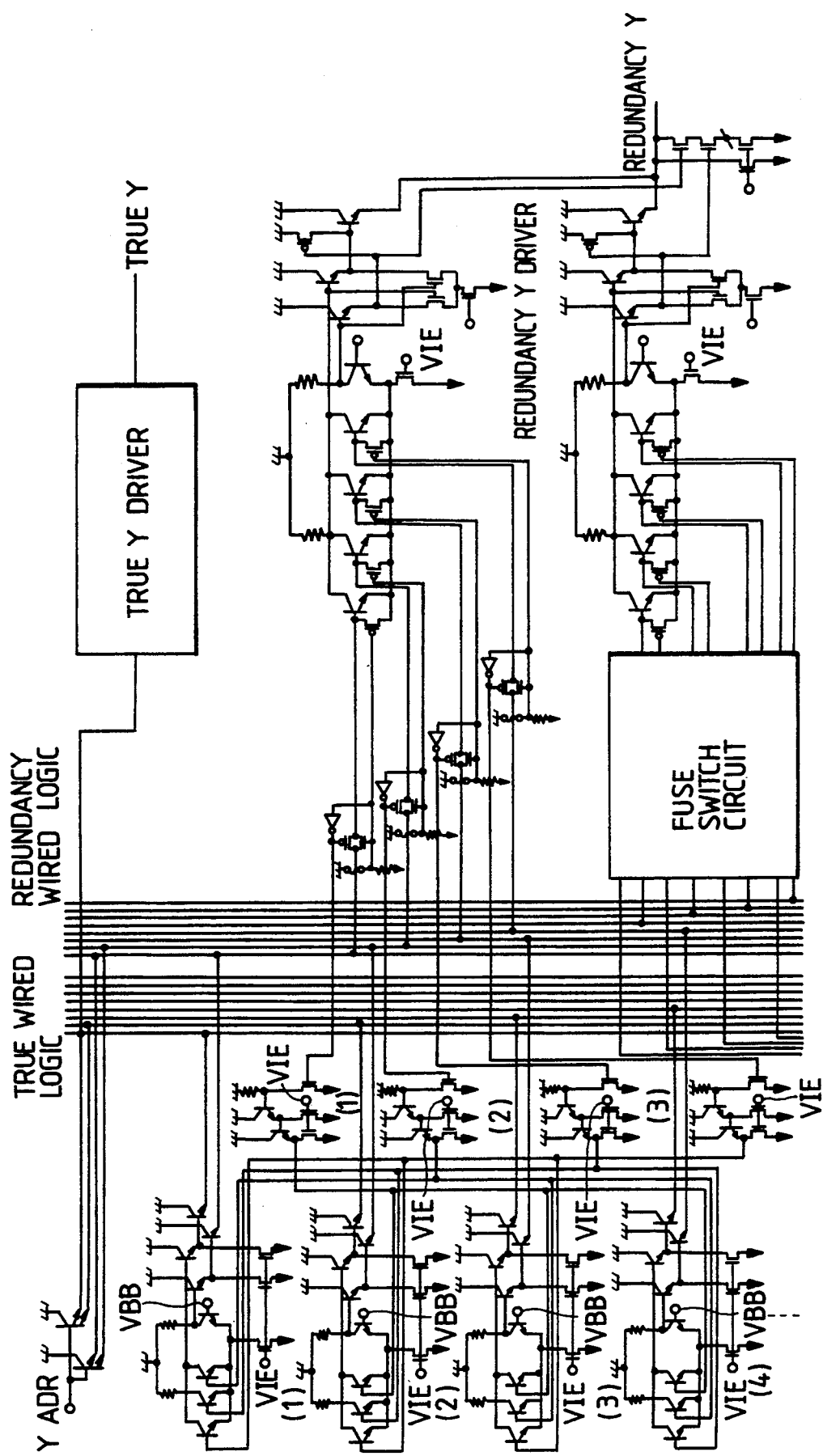
FIG. 66 is a circuit diagram of another Y redundancy circuit used in connection with the invention.

FIG. 66 is a circuit diagram of another Y redundancy circuit used in connection with the invention. This circuit example contains a pull-up level generation circuit that replaces the fuse circuit and CMOS transmission gate for generating the redundancy signal 1 in the example of FIG. 65. The pull-up level generation circuit receives the fuse signals that constitute the redundancy signal 2, checks to see which fuse is cut, and generates the redundancy signal 1 of FIG. 65 accordingly. In this example, one cutting fuse 16 is matched with a single bit fault to be remedied.

Figure 67:
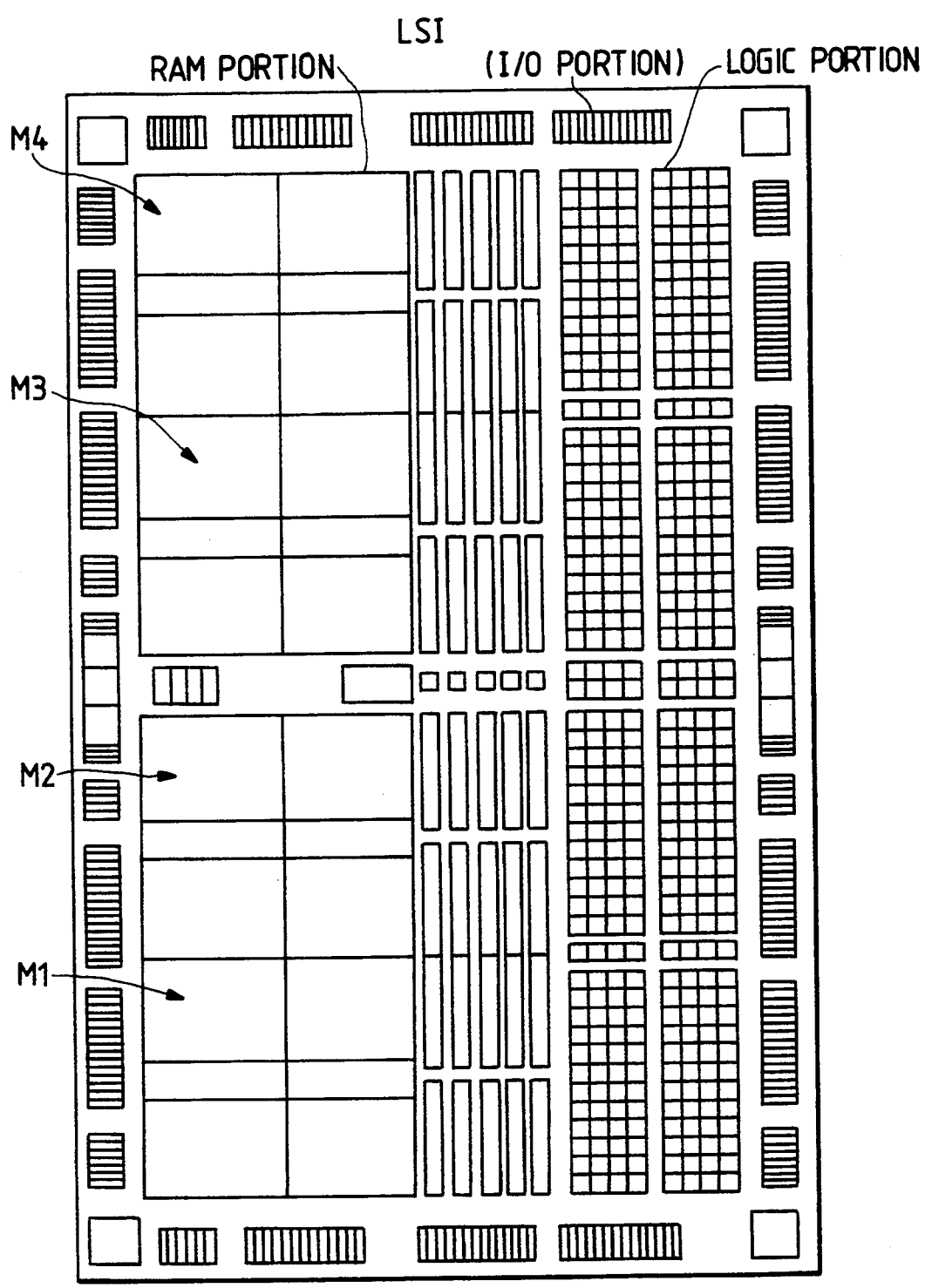
FIG. 67 is a block diagram of another semiconductor integrated circuit device which incorporates the static RAM and which is practiced as a variation of the ninth embodiment of the invention.

FIG. 67 is a block diagram of another semiconductor integrated circuit device which incorporates the static RAM and which is practiced as a variation of the ninth embodiment of the invention. The semiconductor integrated circuit device has three major portions: a RAM portion made of static RAM's of the above-described construction, a logic portion composed of gate arrays, and an input/output portion. The RAM portion comprises a total of four static RAMS M1 through M4, each being the type illustrated in FIG. 57. The whole structure of this variation of the ninth embodiment is bisected in the middle to form a vertical symmetry comprising the upper- and lower-half sections, each half section containing its halved RAM portion, logic portion and input/output portion. In each of the upper- and lower-half sections of the semiconductor integrated circuit device, the halved RAM portion comprises two static RAM's, arranged in upper and lower positions. The static RAM portion of FIG. 67 is bisected in the middle so as to serve two distinct circuitry portions: the memory arrays on the one hand, and direct peripheral circuits and indirect peripheral circuits such as internal power supplies, write drivers and sense amplifiers on the other hand.

The above-described ninth embodiment of the invention provides the following major advantages:

(1) The switch MOSFET under switching control of a redundancy signal is used to select the transmission path carrying the address signal or a decode signal corresponding thereto or the transmission path carrying the reference voltage VBB, whereby the defective circuit is replaced with the corresponding backup circuit. This setup keeps the number of logic steps for the signal transmission path unchanged regardless of the fault remedy operation being performed or not. That in turn maintains high-speed circuit performance with the simplified circuit construction.

(2) The CMOS transmission gate for switching decode signals in response to a redundancy signal is used to switch from a true circuit over to a redundancy circuit. This setup permits switchover to the redundancy circuit when only one fuse corresponding to the decode signal is disconnected.

(3) A CMOS transmission gate arrangement is used as the switch for transmitting small-amplitude signals such as those of the ECL level. By taking advantage of the better signal transmission characteristics available, this arrangement provides high-speed operations of both the true and the redundancy circuits.

(4) An ECL wired-OR circuit arrangement is used to implement the logic circuits for generating decode signals. This arrangement simplifies the circuit construction while ensuring high-speed operations.

(5) An ECL circuit fed with a decode signal through a CMOS transmission gate and corresponding to a faulty circuit, and an ECL circuit matched with a redundancy circuit comprise input transistors. Switch MOSFET's are provided between base and collector and between base and emitter of these input transistors. In this setup, switching control is provided so that the base potential of the input transistors constituting the ECL circuit corresponding to the redundancy signal will not float. This ensures stable fault remedy operations.

(6) The fuses are made of a high melting-point metal layer constituting the topmost layer of the semiconductor device. Such fuses are electrically stable and may be cut easily when necessary.

Although the description above contains many specificities, these should not be construed as limiting the scope of the invention but as merely providing illustrations of the ninth embodiment thereof. Changes and variations may be made without departing from the spirit and scope of the invention. For example, the ECL circuit may be replaced with an NTL (non-threshold logic) circuit whose signal level is substantially as low as that of its ECL counterpart. The invention may also be applied to semiconductor storage devices wherein CMOS signals or TTL signals may be used to generate a signal for selecting word and data lines. In such cases, the output stage need not have level conversion functions.

With respect to the redundancy circuit technology implemented in the ninth embodiment, the fuse elements may be constituted by a polysilicon layer in contrast to the metal layer utilized in the first through the eighth embodiments. The polysilicon layer fuses may be cut through melting using a current instead of a laser beam, the current being generated by an MOSFET arrangement. Alternatively, the fuse elements may be replaced with programmable elements that utilize nonvolatile storage elements, junction diodes or MOSFET's for generating redundancy signals. In other words, the invention may be applied to an extensive range of semiconductor storage devices comprising redundancy circuits.

The inventors have focused primarily on the field of logic SRAM's for describing the present invention because the field happens to be their speciality. However, the invention may also be applied to DRAM's (dynamic RAM's), memory or logic DRAM's and other semiconductor integrated circuit devices.

What is claimed is:

1. A semiconductor integrated circuit device comprising:
    a semiconductor substrate having a main surface;
    a plurality of memory cells formed on said main surface of semiconductor substrate, said plurality of memory cells being arranged in a row direction and a column direction;
    redundancy memory cells formed on said main surface of semiconductor substrate, being adjacent to said plurality of memory cells;
    a peripheral circuit formed on said main surface of semiconductor substrate;
    wirings formed over said peripheral circuit;
    a protective insulation film formed over said wirings;
    a barrier metal layer formed on said protective insulation film, said barrier metal layer being connected to one of said wirings via a first contact hole formed in said protective insulation film, said barrier metal layer comprising laminated metal layers;
    a bump electrode formed on said barrier metal layer; and
    a fuse element formed on said protective insulation film, said fuse element being used for substituting a fault memory cell for said redundancy memory cells,
wherein said fuse element is comprised of the same layer as at least one of said laminated metal layers of said barrier metal layer.

2. A semiconductor integrated circuit device according to claim 1, wherein said fuse element is connected to another ones of said wirings at both end portions of said fuse element via second and third contact holes formed in said protective insulation film.

3. A semiconductor integrated circuit device according to claim 2, further including multiple layered wirings formed over said main surface of said substrate, wherein said multiple layered wirings comprises said wirings formed over said peripheral circuit, and wherein said protective insulation film covers said multiple layered wirings.

4. A semiconductor integrated circuit device according to claim 3, wherein said one of wirings and said another ones of wirings are positioned at an upper most level in said multiple layered wirings, with respect to said main surface of said semiconductor substrate.

5. A semiconductor integrated circuit device according to claim 4, wherein said peripheral circuit includes a plurality of semiconductor elements which are electrically connected each other by said multiple layered wirings, and wherein said bump electrode is used as an external terminal for electrically connecting said peripheral circuit to an external device.

6. A semiconductor integrated circuit device according to claim 4, wherein an energy beam shielding layer for shielding an energy beam for cutting said fuse element is formed under a central portion of said fuse element.

7. A semiconductor integrated circuit device according to claim 6, wherein said energy beam shielding layer is either of said another ones of wirings, and wherein a predetermined potential level is supplied with said energy beam shielding layer.

8. A semiconductor integrated circuit device according to claim 1, wherein at least one of said laminated metal layers of said barrier metal layer is a chromium film which is positioned at the most lower level in said laminated metal layers, with respect to said main surface of said semiconductor substrate, and wherein said fuse element is comprised of the same layer as said chromium film of said laminated metal layers of said barrier metal layer.

9. A semiconductor integrated circuit device according to claim 8, wherein said laminated metal layers of said barrier metal layer further include a copper film stacked on said chromium film, and a gold film stacked on said copper film, wherein said fuse element is comprised of the same layers as said copper film and said gold film, and wherein said copper film and said gold film of said fuse element are selectively firmed at the both end portions of said fuse element.

10. A semiconductor integrated circuit device according to claim 8, wherein said bump electrode is made of a Pb-Sn alloy, and said one of wirings is made of an Al-alloy.

11. A semiconductor integrated circuit device according to claim 1, wherein said bump electrode is a tape automated bonding bump.

12. A semiconductor integrated circuit device according to claim 1, wherein said bump electrode is a controlled collapse bump.

13. A semiconductor integrated circuit device according to claim 12, wherein said fuse element is constituted by a transition metal.

14. A semiconductor integrated circuit device according to claim 12, further comprising a guard ring and a fourth contact hole formed in said protective insulation film, wherein each of said guard ring and said fourth contact hole has a shape surrounding said fuse element in a plane view, and wherein said guard ring is electrically connected to said wirings under said protective insulation film via said fourth contact hole.

* * * * *